(12) United States Patent
Miyake

(10) Patent No.: US 6,756,816 B2
(45) Date of Patent: Jun. 29, 2004

(54) SEMICONDUCTOR DEVICE

(75) Inventor: Hiroyuki Miyake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/305,292

(22) Filed: Nov. 27, 2002

(65) Prior Publication Data

US 2003/0111677 A1 Jun. 19, 2003

(30) Foreign Application Priority Data

Nov. 30, 2001 (JP) ........................................ 2001-366881

(51) Int. Cl.⁷ .......................................... H03K 19/0175
(52) U.S. Cl. .......................................... 326/83; 321/86
(58) Field of Search .............................. 326/82, 83, 86, 326/88, 89, 90, 92, 37, 38

(56) References Cited

U.S. PATENT DOCUMENTS

| | | |
|---|---|---|
| 3,506,851 A | 4/1970 | Polkinghorn et al. |
| 3,774,055 A | 11/1973 | Bapat |
| 3,898,479 A | 8/1975 | Proebsting |
| 4,090,096 A | 5/1978 | Nagami |
| 4,390,803 A | 6/1983 | Koike |
| 4,412,139 A | 10/1983 | Horninger |
| 4,804,870 A | 2/1989 | Mahmud |
| 4,959,697 A | 9/1990 | Shier et al. |
| 5,467,038 A | 11/1995 | Motley et al. |
| 5,548,143 A | 8/1996 | Lee |
| 5,643,826 A | 7/1997 | Ohtani et al. |
| 5,694,061 A | 12/1997 | Morosawa et al. |
| 5,870,071 A | 2/1999 | Kawahata |
| 5,889,291 A | 3/1999 | Koyama et al. |
| 5,949,271 A | 9/1999 | Fujikura |
| 6,049,228 A | 4/2000 | Moon |
| 6,501,098 B2 | 12/2002 | Yamazaki |
| 6,522,323 B1 | 2/2003 | Sasaki et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |

FOREIGN PATENT DOCUMENTS

| | | |
|---|---|---|
| EP | 1063630 A2 | 12/2000 |
| JP | 55-156427 | 12/1980 |
| JP | 63-204815 | 8/1988 |
| JP | 9-246936 | 9/1997 |
| JP | 2001-005426 | 1/2001 |
| JP | 2001-133431 | 5/2001 |

OTHER PUBLICATIONS

U.S. patent application Ser. No. 10/206,802, Azami, filed Jul. 29, 2002, pending.

*Primary Examiner*—Don Le
(74) *Attorney, Agent, or Firm*—Fish & Richardson P.C.

(57) ABSTRACT

When a digital video signal inputted to a latch circuit is Hi electric potential, undesirably a current flows continuously for one horizontal period at maximum, and this causes a great increase in power consumption of a semiconductor device. Therefore an object of the present invention is to provide a display device in which power consumption can be reduced by minimizing occurrence of the current path during the circuit operation, as well as a driving method. The present invention provides a semiconductor device in which two outputs, a non-inverted output and an inverted output, are obtained when a digital video signal is inputted and therefore occurrence of the current path can be minimized in a downstream buffer driven by these signals. Furthermore, a semiconductor device with reduced power consumption is provided by using the structure described above.

33 Claims, 33 Drawing Sheets driver circuit | pixel portion driver circuit | pixel portion driver circuit | pixel portion

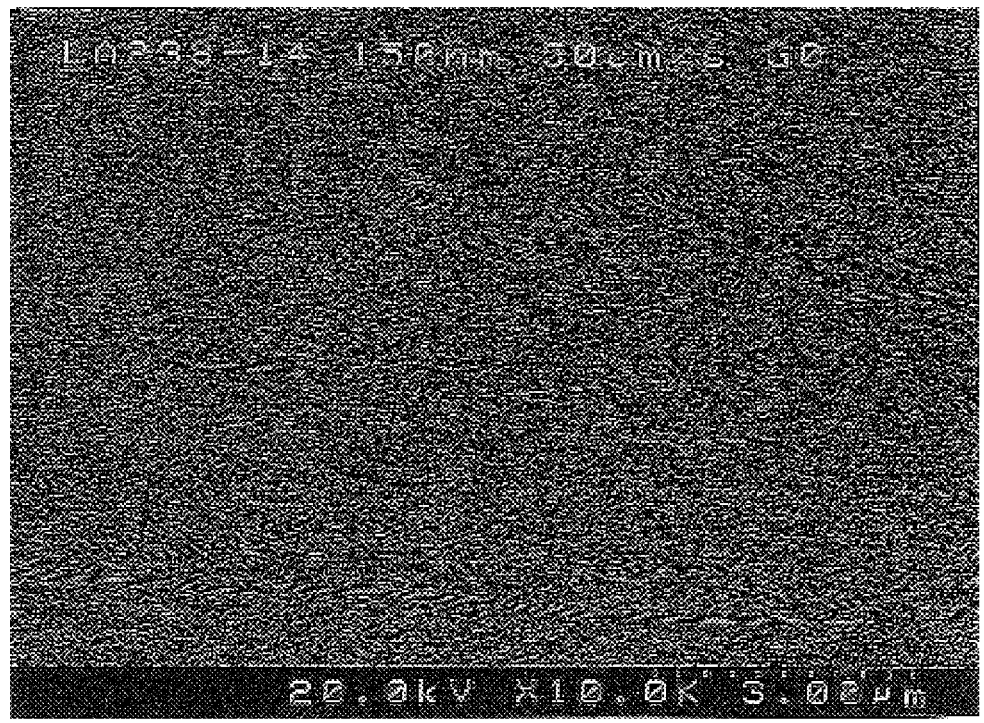
relatively scanning laser light direction
Fig. 16 relatively scanning laser light direction

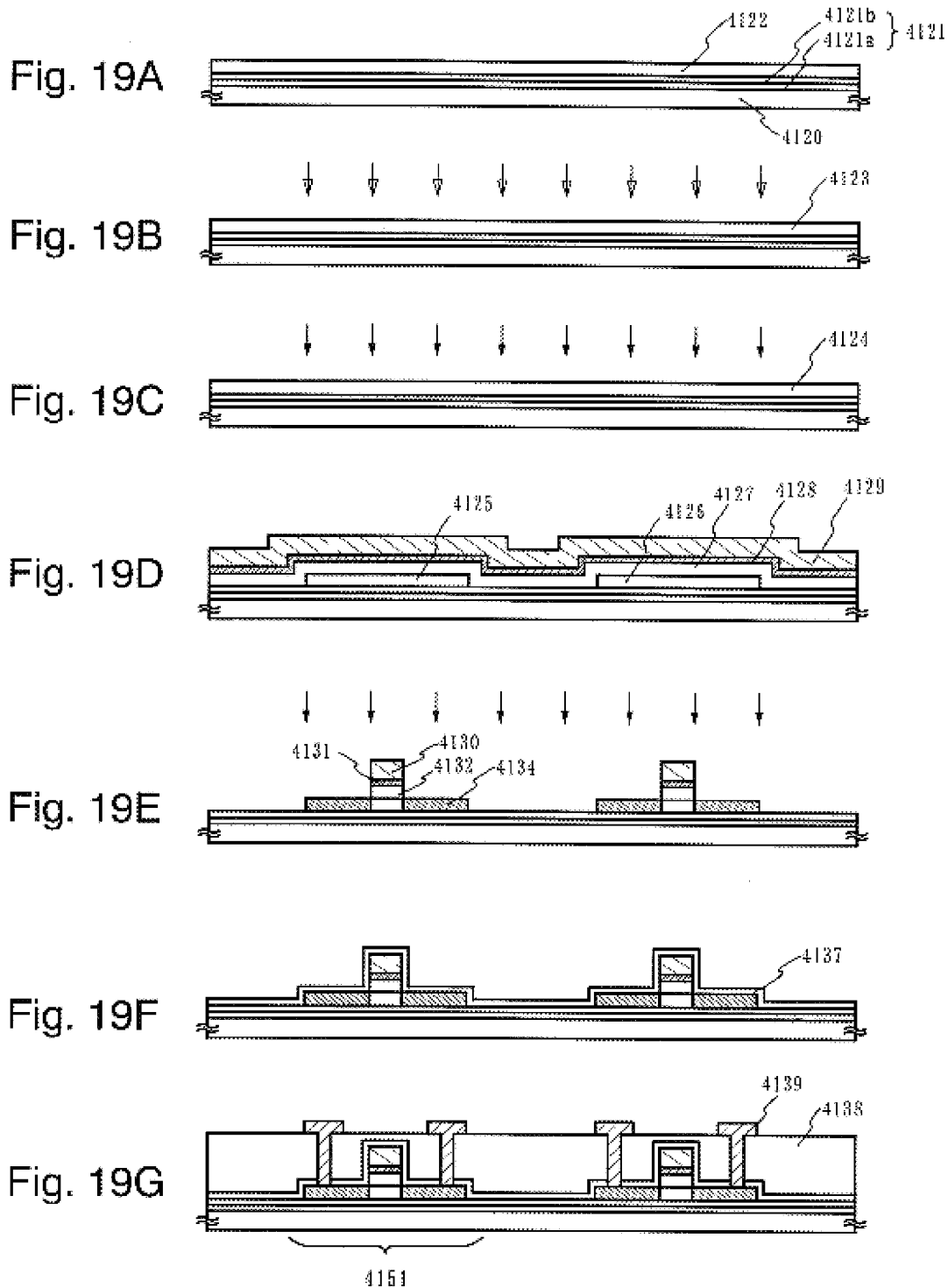

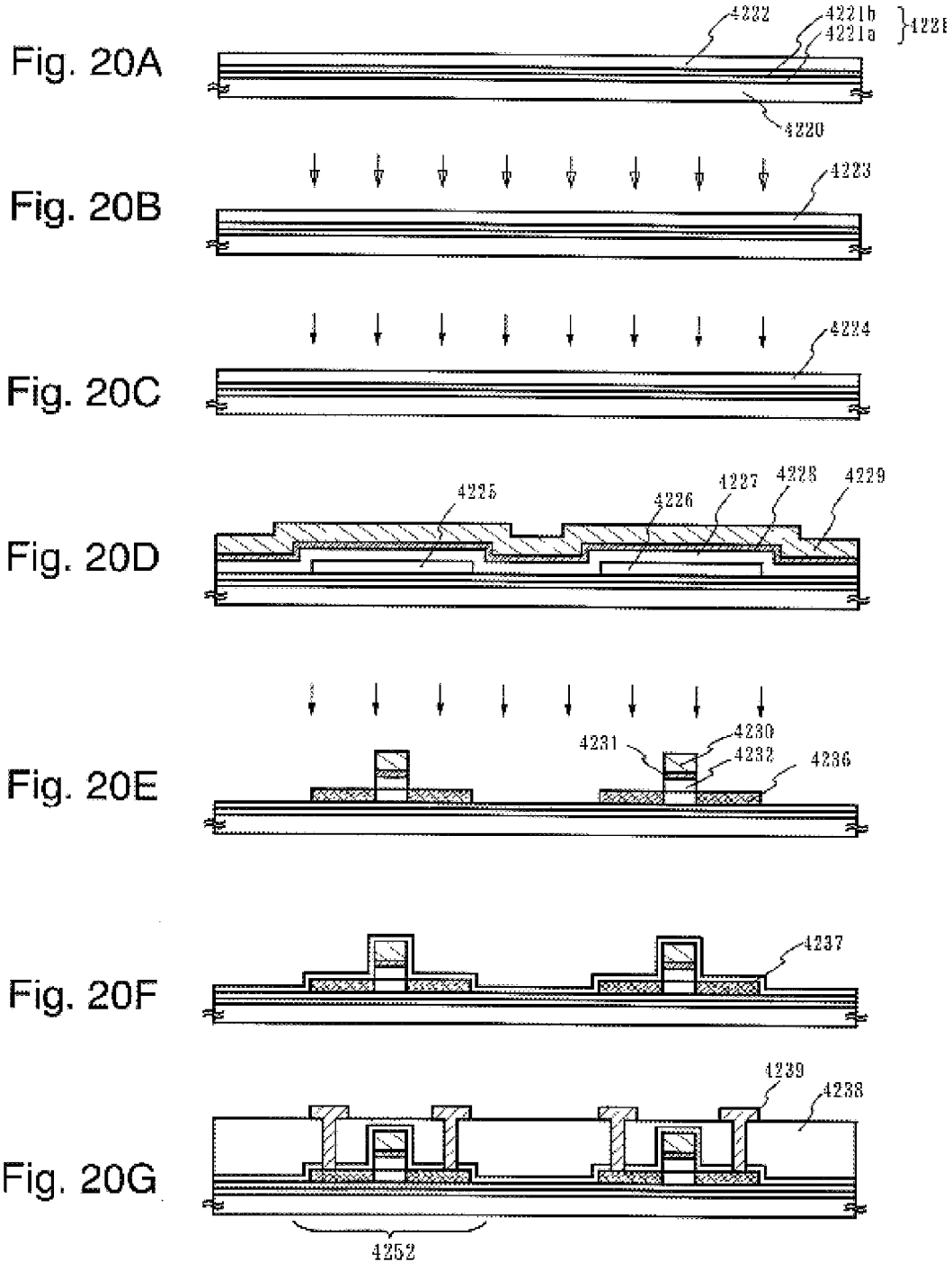

SEMICONDUCTOR DEVICE

BACKGROUND OF THE INVENTION

1. Field of the Invention

The present invention relates to a semiconductor device technology. The term semiconductor device includes a liquid crystal display device using a liquid crystal element for a pixel, and a display device using an electroluminescence (EL) element or other light emitting element. It also includes circuits or the like for inputting video signals to pixels arranged in the above display devices to display images. It also includes a shift register circuit, a latch circuit, a buffer circuit, a pulse output circuit such as a level shifter circuit, and an amplifying circuit such as an amplifier.

2. Description of the Related Art

Semiconductor devices in which a semiconductor thin film is formed on an insulator such as a glass substrate, especially liquid crystal display devices using thin film transistors (hereinafter referred to as TFTs) and other active matrix display devices, have been utilized in many products and propagated in recent years. Active matrix display devices display images by controlling the luminance of each of ten thousands to millions of pixels that are arranged to form a matrix pattern using a TFT that is placed in each pixel.

A technique of forming a pixel portion and peripheral circuits integrally on the same substrate using polysilicon TFTs is being advanced. The technique is of a great help in reducing devices in size and lowering the power consumption, and accordingly is used in display units and the like of portable information terminals where application fields of the technique are expanding at remarkable rate.

An example of forming a pixel portion and peripheral circuits on the same substrate using polysilicon TFTs is described with reference to FIG. 10. FIG. 10 shows a source signal line driving circuit as an example of a semiconductor device used in a typical display device, and a description is given below on its structure and operation.

In FIG. 10, the source signal line driving circuit has a shift register 1000 composed of plural stages of pulse output circuits 1001 for sequentially outputting sampling pulses in response to clock signals (S-CK), inverted clock signals (S-CKB), and start pulses (SP). The driving circuit also has a first latch circuit 1002 for holding 3-bit digital video signals (DATA1 to 3) in response to input of the sampling pulses, and a second latch circuit 1003 for holding digital video signals in response to input of latch pulses. Furthermore, the driving circuit has a D/A converter 1004 for converting a digital video signal into an analog video signal.

Though not shown in the drawing, the driving circuit may have a buffer. The bit number of digital video signals is not limited to 3.

Next, a brief description is given below on the operation of the source signal line driving circuit. The shift register 1000 sequentially outputs sampling pulses in response to input of clock signals (S-CK), inverted clock signals (S-CKB), and start pulses (SP). The first latch circuit 1002 holds digital video signals (DATA1 to 3) in response to input of the sampling pulses. Holding of a digital video signal is timed to coincide with input of a sampling pulse. After this operation is finished for one horizontal period, latch pulses are inputted during a horizontal retrace period and the digital video signals for one horizontal period which have been held in the first latch circuit 1002 are transferred to the second latch circuit 1003 at once. Thereafter, the digital video signals are inputted to the D/A converter circuit 1004 and converted into voltage signals for the respective gray scales, and the voltage signals are written in source signal lines (S0001 to the last S).

In the semiconductor device described above, a CMOS circuit obtained by combining an n-channel TFT and a p-channel TFT is often used. However, forming a CMOS circuit that is a combination of an n-channel TFT and a p-channel TFT on one insulating surface means forming TFTs that have opposing conductivity types on the same insulating surface and therefore it cannot help but complicate the manufacturing process. As a result, the cost of the semiconductor device is raised and the yield thereof is lowered.

As a solution to this, a semiconductor device in which all TFTs have the same polarity has been devised. When all TFTs have the same polarity, some of manufacture steps such as an impurity element doping step can be omitted from the manufacturing process of the TFTs to avoid an increase in cost and lowering of the yield.

An example of a semiconductor device in which every TFT has the same polarity is described with reference to FIGS. 5A and 5B. FIG. 5A shows a shift register composed of TFTs that have the same polarity. The shift register has plural stages of pulse output circuits 500 for outputting sampling pulses in response to clock signals and start pulses. FIG. 5B is a circuit diagram showing one of the pulse output circuits 500 which is composed of n-channel TFTs.

When a logic circuit is composed of TFTs having the same polarity, for example, n-channel TFTs in FIG. 5B, a problem arises in that the amplitude of an output signal (SR OUT) is attenuated compared to the amplitude of input signals (in_L, in_R) due to the threshold of an n-channel TFT connected to a high electric potential side power supply. The pulse output circuit (one of the pulse output circuits 500) shown in FIG. 5B solves this problem by boot strap.

This specification deals with digital circuits and therefore input/output electric potentials are expressed as binary values, Hi and Lo. Since meanings of Hi and Lo are reversed in an n-channel TFT and a p-channel TFT, the terms active electric potential and inactive electric potential may be used. The term active electric potential refers to Hi electric potential in a circuit whose transistors are all n-channel transistors or Lo electric potential in a circuit whose transistors are all p-channel transistors. The term inactive electric potential refers to Lo electric potential in a circuit whose transistors are all n-channel transistors or Hi electric potential in a circuit whose transistors are all p-channel transistors.

It is not always necessary for Hi/Lo electric potentials or active electric potential/inactive electric potential to match the power supply electric potential (VDD/VSS) and it only has to match when viewed as a binary value. For instance, an electric potential lower than VDD by a level corresponding to the threshold of an n-channel transistor is also treated as Hi electric potential. An electric potential that can be restored to the level of VDD/VSS by an amplitude compensating circuit or the like is regarded as the Hi/Lo electric potentials or active electric potential/inactive electric potential.

Next, a brief description is given on the operation of the circuit shown in FIG. 5B. The TFTs that have the same polarity and constitute the circuit here are all n-channel TFTs and the threshold voltage thereof is uniformly VthN.

However, this is not to limit the TFTs constituting the circuit to n-channel TFTs. Instead, the TFTs that constitute the circuit may be all p-channel TFTs.

Some parts of the description on the circuit operation mention the operation of the TFTs. Turning a TFT ON means that the absolute value of the gate-source voltage of the TFT becomes higher than the absolute value of the threshold voltage of the TFT and a source region and drain region of the TFT are made to be conductive through its channel formation region. Turning a TFT OFF means that the absolute value of the gate-source voltage of the TFT becomes lower than the absolute value of the threshold voltage of the TFT and a source region and drain region of the TFT are made to be non-conductive.

In describing connection of TFTs, "a gate electrode, an input electrode, an output electrode" and "a gate electrode, a source region, a drain region" are used in different contexts. This is because the gate-source voltage often appears in explaining the operation of a TFT but it is difficult to discriminate a source region and drain region of a TFT from each other. Therefore the terms input electrode and output electrode are used in explaining input and output of signals and, when the relation between electric potentials of electrodes of a TFT is explained, the input electrode or the output electrode is called a source region whereas the other is called a drain region.

The signal amplitude in the description is VDD−VSS, and the high electric potential side power supply is VDD whereas the low electric potential side power supply is VSS. VthN<(VDD−VthN) is satisfied. VSS is treated as 0 V in order to simplify the relation between electric potentials. However, this may not apply when the circuit is driven in practice.

In FIG. 5B, TFTs 501 and 504 are in the m-th stage circuit of n stages of pulse output circuits (1<m≦n). Output pulses of the (m−1)-th stage circuit are inputted to gate electrodes of the TFTs 501 and 504 (when m=1, namely, in the first stage, SP are inputted) and the gate electrodes are set to Hi electric potential to turn the TFTs 501 and 504 ON. This raises the electric potential of a gate electrode of a TFT 505 toward VDD and, as the electric potential reaches (VDD−VthN), the TFT 501 is turned OFF and goes into a floating state (VthN<(VDD−VthN)). Accordingly, the TFT 505 is turned ON.

On the other hand, no pulses are inputted to gate electrodes of TFTs 502 and 503 at this point and the gate electrodes remain at Lo electric potential, thereby keeping the TFTs 502 and 503 turned OFF. Therefore the electric potential of a gate electrode of a TFT 506 is Lo electric potential and the TFT 506 is OFF. As CLK inputted from an input electrode of the TFT 505 becomes Hi electric potential, the electric potential of the output terminal (SR Out) is raised toward VDD.

Since capacitor means 507 is provided between the gate electrode of the TFT 505 and its output electrode and the gate electrode of the TFT 505 is now in a floating state, the electric potential of the gate electrode of the TFT 505 is further raised from (VDD−VthN) by boot strap as the electric potential of the output terminal (SR Out) is raised. This gives the gate electrode of the TFT 505 an electric potential higher than (VDD+VthN). Therefore, the electric potential of the output terminal (SR Out) is raised all the way up to VDD without being lowered by the threshold of the TFT 505.

Similarly, pulses are outputted from the (m+1)-th stage in response to S_CKB. The output pulses of the (m+1)-th stage are fed back to the m-th stage and inputted to the gate electrodes of the TFTs 502 and 503. The gate electrodes of the TFTs 502 and 503 are set to Hi electric potential to turn the TFTs 502 and 503 ON. This lowers the electric potential of the gate electrode of the TFT 505 toward VSS to turn the TFT 505 OFF. At the same time, the electric potential of the gate electrode of the TFT 506 is set to Hi electric potential to turn the TFT 506 ON, and the electric potential of the output terminal (SR Out) in the m-th stage is set to Lo electric potential as a result.

Next, an example of building a latch circuit from TFTs that have the same polarity is shown in FIG. 6A. The circuit indicated by a dotted line frame 601 is a first latch circuit, and the circuit indicated by a dotted line frame 602 is a second latch circuit. The circuit indicated by a dotted line frame 603 is a buffer circuit.

The first latch circuit 601 has a TFT 604 and capacitor means 605. The 1-bit digital video signals (DATA) are inputted to an input electrode of the TFT 604, and sampling pulses (Samp. Pulse) are inputted to a gate electrode of the TFT 604. When the sampling pulses are inputted, the TFT 604 is turned ON and the digital video signals are held in the capacitor means 605.

The second latch circuit 602 has a TFT 606 and capacitor means 607. The digital video signals that have been held in the first latch circuit are inputted to an input electrode of the TFT 606, and latch pulses are inputted to a gate electrode of the TFT 606. When latch pulses are inputted, the TFT 606 is turned ON and the digital video signals are held in the capacitor means 607.

The buffer 603 has TFTs 608 to 611 and capacitor means 612. The digital video signals that have been held in the second latch circuit are inputted to gate electrodes of the TFTs 609 and 611. A gate electrode of the TFT 608 is connected to a power supply VDD. The current performance of the TFT 609 is set much greater than the current performance of the TFT 608.

When Hi electric potential is inputted to the gate electrode of the TFTs 609 and 611, the electric potential of the gate electrode of the TFT 610 is set to Lo electric potential to turn the TFT 610 OFF On the other hand, the TFT 611 is turned ON and an output terminal (Out) is given Lo electric potential.

When Lo electric potential is inputted to the gate electrodes of the TFTs 609 and 611, the TFTs 609 and 611 are both turned OFF. This raises the electric potential of the gate electrode of the TFT 610 through the TFT 608, and when the electric potential reaches (VDD−VthN), the gate electrode goes into a floating state. Accordingly, the TFT 610 is turned ON and the electric potential of the output terminal (Out) is raised. This is followed by capacitive coupling between the gate electrode and output electrode of the TFT 610 by the capacitor means 612 to further raise the electric potential of the gate electrode of the TFT 610 to a level higher than (VDD+VthN). As a result, the output terminal (Out) is given Hi electric potential and the electric potential thereof becomes equal to VDD.

A buffer may be placed between the first lath circuit 601 and the second latch circuit 602.

Now, the buffer 603 by output of the second latch circuit 602 will be focused. During a period in which Hi electric potential is inputted to the TFT 609 to turn the TFT 609 ON, a current path is formed among VDD−TFT 608−TFT 609−VSS. This current path undesirably allows a current to flow continuously while Hi current is outputted from the second latch circuit. This means that a current continues to flow for one horizontal period at maximum when digital video signal inputted to the second latch circuit has Hi electric potential. This results in great increase in power consumption of the semiconductor device.

SUMMARY OF THE INVENTION

The present invention has been made in view of the above, and an object of the present invention is to provide a semiconductor device which is composed of TFTs having the same polarity and which is reduced in power consumption.

The latch circuit of FIG. 6A which is composed of switching TFTs and capacitor means is of 1-input-1-output type. Accordingly, the buffer 603 is of 1-input type. When an input signal inputted to the buffer 603 has Hi electric potential, the current path can be avoided by using an inverted input signal (Inb) of an input signal (In) so that the TFTs 608 and 609 are exclusively turned ON and OFF as shown in FIG. 6B.

Therefore, the present invention provides a semiconductor device in which a latch circuit is of 2-output type and has an output and an inverted output.

FIG. 33 shows a latch circuit as an example of a semiconductor device of the present invention. The latch circuit has a first circuit 1301, a second circuit 1302, and capacitor means 1303 and 1304. The latch circuit shown in FIG. 33 in accordance with the present invention is characterized in that two outputs, an output (Data Out) and an inverted output (Data Out_b), are obtained when a digital video signal (Digital Data) is inputted.

The first circuit 1301 receives a sampling pulse (Samp. Pulse) outputted from a shift register and a digital video signal (Digital Data). A high electric potential side power supply VDD and a low electric potential side power supply VSS are connected to the first circuit 1301. The first circuit 1301 outputs an inverted output (Data Out_b). The high electric potential side power supply VDD may not be provided in the first circuit 1301.

An inverted output (Data Out_b) is connected to the capacitor means 1303. The capacitor means 1303 may not be provided when there is no particular need to hold output signals or when the downstream circuit structure makes it unnecessary.

The second circuit 1302 receives a sampling pulse (Samp. Pulse) and a digital video signal (Digital Data). The second circuit 1302 outputs an output (Data Out).

An output (Data Out) is connected to the capacitor means 1304. The capacitor means 1304 may not be provided depending on the downstream circuit structure.

The first circuit 1301 and the second circuit 1302 fulfill the following five conditions.

(1) TFTs that constitute the first circuit and second circuit all have the same polarity.
(2) A through current flows in the first circuit only when a sampling pulse (Samp. Pulse) and a digital video signal (Digital Data) are both Hi.
(3) When a sampling pulse (Samp. Pulse) is Hi, an inverted signal of a digital video signal (Digital Data) is outputted to the inverted output (Data Out_b) in the first circuit.
(4) When a sampling pulse (Samp. Pulse) is Hi, a digital video signal (Digital Data) is outputted to the output (Data Out) in the second circuit.
(5) In the first circuit and the second circuit, the output (Data Out) and the inverted output (Data Out_b) are in a floating state when a sampling pulse (Samp. Pulse) is Lo.

The through current in Condition (2) is a through current between the high electric potential side power supply VDD and the low electric potential side power supply VSS, or a through current between a sampling pulse (Samp. Pulse) and the low electric potential side power supply VSS.

In Condition (3) or (4), the inverted output (Data Out_b) or the output (Data Out) being Hi means that the inverted output (Data Out_b) or the output (Data Out) has an electric potential that can be restored to the high electric potential side power supply VDD by a buffer circuit having a threshold compensating function.

Further, in Condition (3) or (4), the inverted output (Data Out_b) or the output (Data Out) being Lo means that the inverted output (Data Out_b) or the output (Data Out) has an electric potential that can be restored to the low electric potential side power supply VSS by a buffer circuit.

In Condition (5), the output (Data Out) and the inverted output (Data Out_b) being in a floating state does not always means that they are in the floating state in the strict sense. It is sufficient when there is impedance enough to hold electric potentials of the output (Data Out) and the inverted output (Data Out_b) for a given period of time (typically, one horizontal period) including the downstream circuits.

The present invention provides a semiconductor device including circuits that meet the above properties. The present invention also provides a semiconductor device in which two outputs, a non-inverted output and an inverted output, are obtained when a digital video signal is inputted and therefore occurrence of the current path can be minimized in a downstream buffer driven by these signals. Furthermore, a semiconductor device with reduced power consumption is provided by using the structure described above.

BRIEF DESCRIPTION OF THE DRAWINGS

In the accompanying drawings:

FIG. 16 is a diagram showing an SEM image obtained as a result of Embodiment 8;

FIGS. 19A to 19G are diagrams showing an example of a manufacturing process for TFTs having the same polarity;

FIGS. 20A to 20G are diagrams showing an example of a manufacturing process for TFTs having the same polarity;

DETAILED DESCRIPTION OF THE PREFERRED EMBODIMENTS

Embodiment Mode

Figure 1:
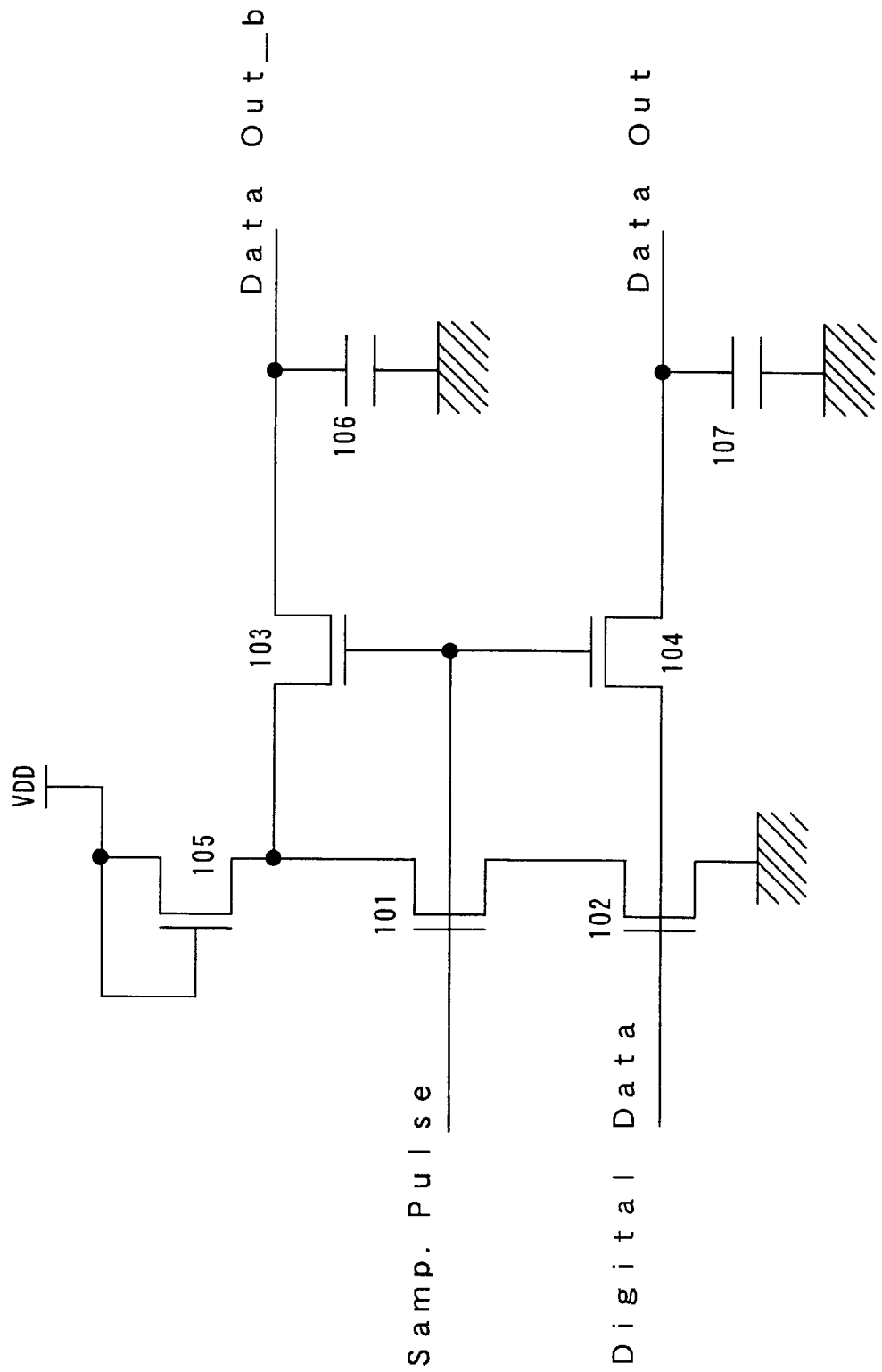
FIG. 1 is a diagram showing an embodiment mode of the present invention.

A latch circuit is shown in FIG. 1 as an example of a semiconductor device of the present invention, and its structure and operation are described.

The latch circuit shown in FIG. 1 has TFTs 101 to 105 and capacitor means 106 and 107. A sampling pulse (Samp. Pulse) outputted from a shift register is inputted to gate electrodes of the TFTs 101, 103, and 104. A digital video signal (Digital Data) is inputted to a gate electrode of the TFT 102 and to an input electrode of the TFT 104. An input electrode and gate electrode of the TFT 105 are connected to a high electric potential side power supply VDD. An output electrode of the TFT 105 and an output electrode of the TFT 101 are connected to an input electrode of the TFT 103. An input electrode of the TFT 101 is connected to an output electrode of the TFT 102. An input electrode of the TFT 102 is connected to a low electric potential side power supply VSS.

A characteristic of this structure is that two outputs, an output (Data Out) and an inverted output (Data Out_b), are obtained when a digital video signal is inputted.

The operation of the latch circuit shown in FIG. 1 is described next. The amplitude of a sampling pulse and the amplitude of a digital video signal are each between VDD and VSS upon input.

A sampling pulse outputted from the shift register is inputted to the gate electrodes of the TFTs 101, 103, and 104 to turn the TFTs 101, 103, and 104 ON. When a digital video signal inputted has Hi electric potential, the gate electrode of the TFT 102 receives Hi electric potential to turn it ON.

At this point, the TFTs 102 and 103 are both turned ON to cause a through current to flow. The current performance of the TFTs 102 and 103 is set much higher than the current performance of the TFT 105, thereby giving Lo electric potential to the output electrodes of the TFTs 101 and 105, namely, an inverted output terminal (Data Out_b). An output terminal (Data Out) receives the digital video signal having Hi electric potential as it is through the TFT 104.

On the other hand, when a digital video signal inputted has Lo electric potential, Lo electric potential is inputted to the gate electrode of the TFT 102 to turn it OFF. Accordingly, Hi electric potential is given to the inverted output terminal (Data Out_b). The output terminal (Data Out) receives the digital video signal having Lo electric potential as it is through the TFT 104.

The above operation is conducted in succession for one horizontal period. Signals outputted to the output terminal (Data Out) and signals outputted to the inverted output terminal (Data Out_b) are held by the capacitor means 106 and 107, respectively, until a retrace period. The capacitor means 106 and 107 may be omitted depending on the downstream circuit structure or the length of a horizontal period.

When the sampling pulse (Samp. Pulse) becomes Lo electric potential and the sampling period is ended, the TFTs 101, 103, and 104 are turned OFF. In other words, the inverted output terminal (Data Out_b) and the output terminal (Data Out) move into a floating state.

In the latch circuit shown in FIG. 1 in accordance with the present invention, a current path is formed between VDD–TFT 101–TFT 102–VSS only when a sampling pulse is inputted and at the same time a digital video signal has Hi electric potential.

Influenced by the threshold of the TFT 101, the amplitude of an output signal on the output terminal side (Data Out) is between (VDD−VthN) and VSS. Similarly, the amplitude of an output signal on the inverted output terminal side (Data Out_b) is influenced by the threshold of the TFT 102 and is between (VDD−VthN) and VSS. However, this is not a problem since the amplitude is compensated by a buffer circuit provided downstream of the latch circuit using boot strap.

In the circuit shown in FIG. 1, the TFT 101 and the TFT 102 may switch their positions. The circuit shown in FIG. 1 meets every property of a latch circuit of the present invention which is described in Summary of the Invention.

The TFTs 101 and 102 in FIG. 1 are n-channel TFTs but the present invention is not limited thereto. The TFTs 101 and 102 can be p-channel TFTs by inverting the power supply voltage and input and output signals.

Embodiment 1

Figure 11:
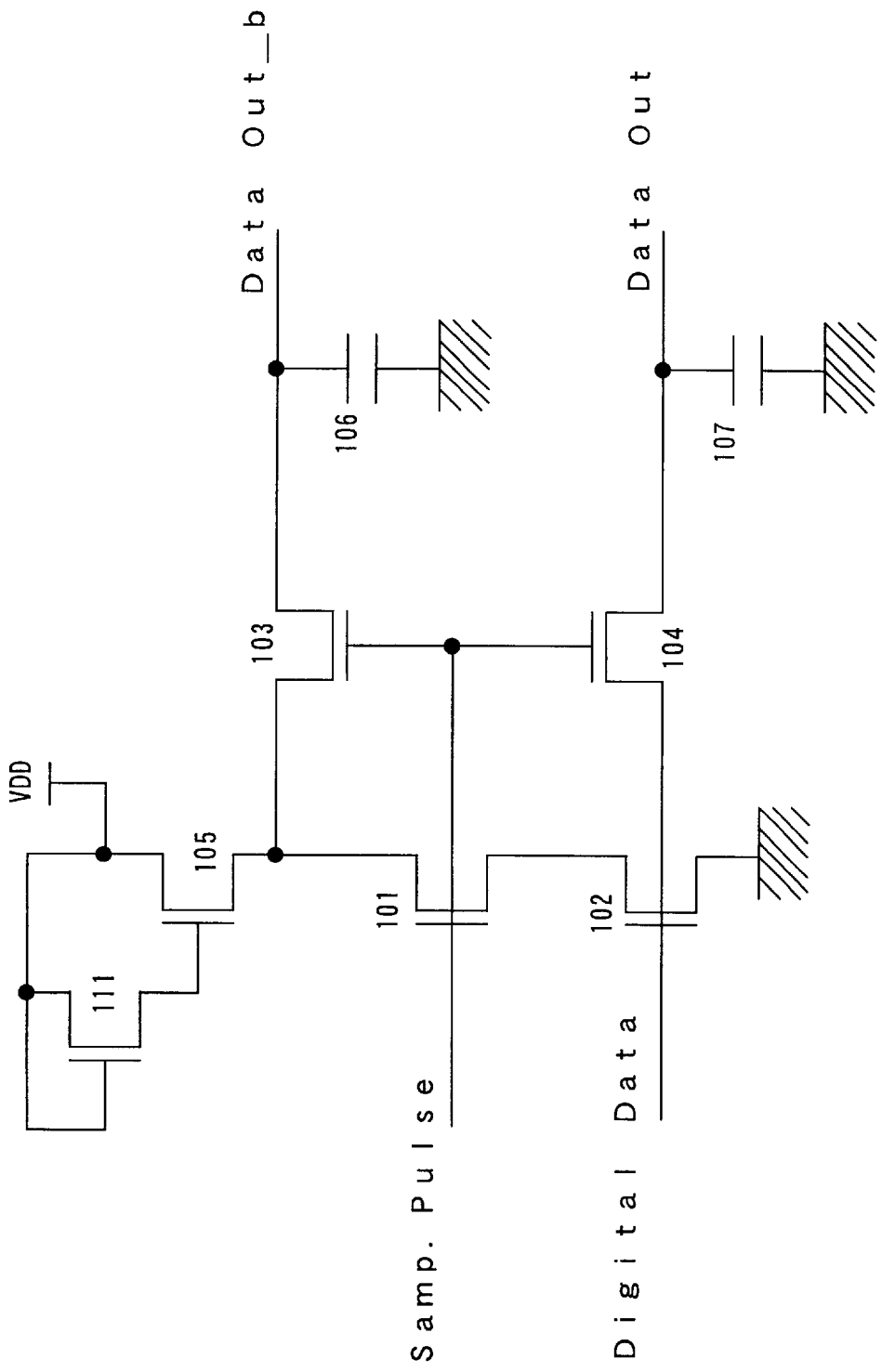
FIG. 11 is a diagram showing an embodiment of the present invention which is a small modification to the embodiment mode.

This embodiment describes with reference to FIG. 11 a latch circuit structured differently from Embodiment Mode.

FIG. 11 shows a small modification to connection of the latch circuit shown in FIG. 1 in accordance with the present invention. In FIG. 11, components corresponding to those in FIG. 1 are denoted by the same symbols.

While the gate electrode of the TFT 105 is connected to its input electrode in FIG. 1, the latch circuit shown in FIG. 11 has a new TFT 111 provided between the gate electrode and input electrode of the TFT 105. A gate electrode and input electrode of the TFT 111 are connected to the power supply VDD, and an output electrode of the TFT 111 is connected to the gate electrode of the TFT 105.

In the above structure, the gate electrode of the TFT 105 is raised higher than the VDD by boot strap that uses the gate capacitance of the TFT 105. This means that the latch circuit shown in FIG. 11 is higher in current performance of the TFT 105 and faster in rising of inverted output terminal (Data Out_b) than the latch circuit shown in FIG. 1.

The capacitor means 106 and 107 may be omitted depending on the downstream circuit structure or the length of a horizontal period. The TFT 101 and the TFT 102 may switch their positions. The circuit shown in FIG. 11 meets every property of a latch circuit of the present invention which is described in Summary of the Invention.

The TFTs in this embodiment are n-channel TFTs but the present invention is applicable also when they are p-channel TFTs.

Embodiment 2

Figure 12:
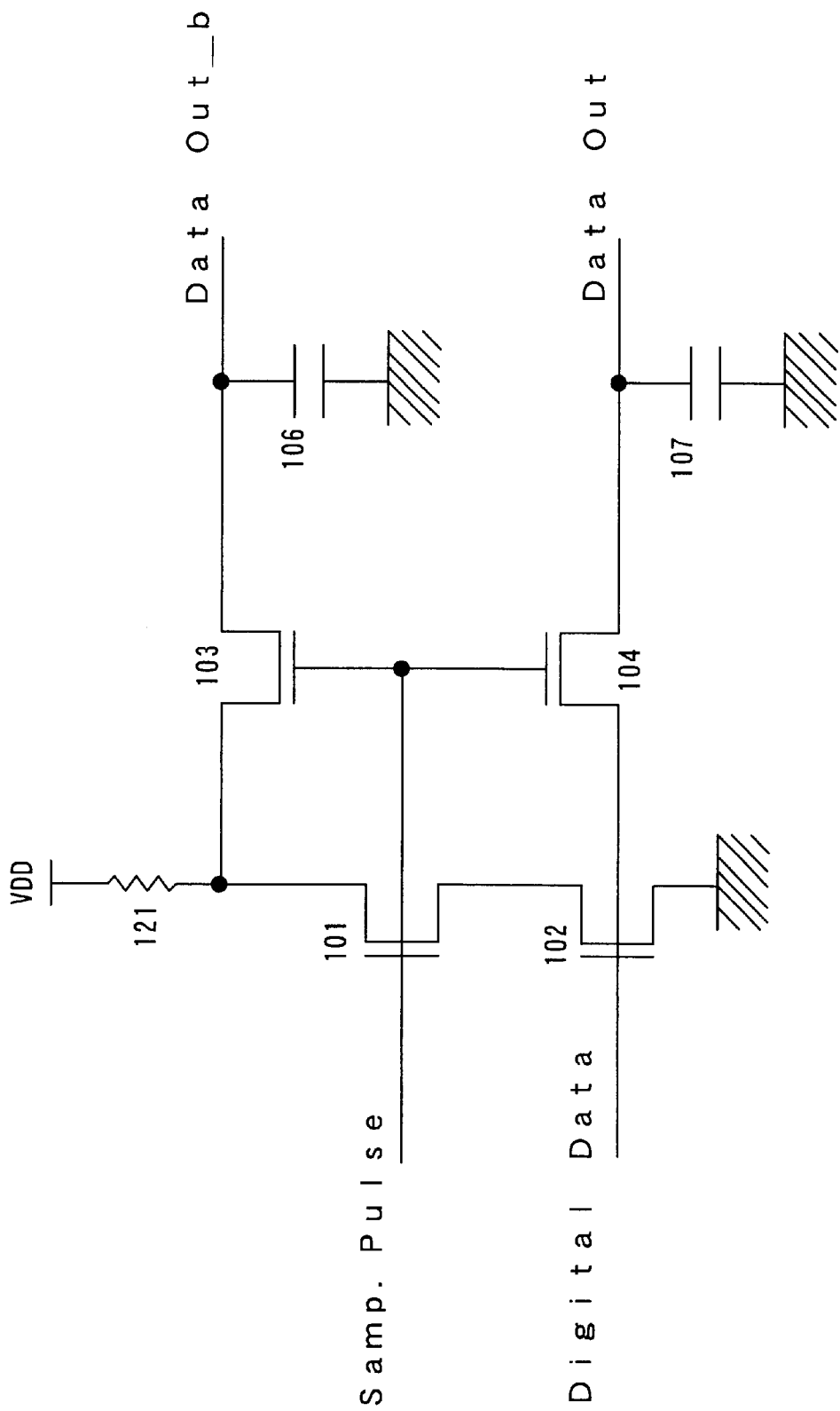
FIG. 12 is a diagram showing an embodiment of the present invention which is a small modification to the embodiment mode.

This embodiment describes with reference to FIG. 12 a latch circuit structured differently from Embodiment mode and Embodiment 1.

FIG. 12 shows a small modification to connection of the latch circuit shown in FIG. 1 in accordance with the present invention. In FIG. 12, components corresponding to those in FIG. 1 are denoted by the same symbols.

While the TFT 105 is connected between the output electrode of the TFT 101 and the power supply VDD by diode connection in FIG. 1, the latch circuit shown in FIG. 12 has resistor means 121 connected between the output electrode of the TFT 101 and the power supply VDD.

The capacitor means 106 and 107 may be omitted depending on the downstream circuit structure or the length of a horizontal period. The TFT 101 and the TFT 102 may switch their positions. The circuit shown in FIG. 12 meets every property of a latch circuit of the present invention which is described in Summary of the Invention.

The TFTs in this embodiment are n-channel TFTs but the present invention is applicable also when they are p-channel TFTs.

Embodiment 3

Figure 13:
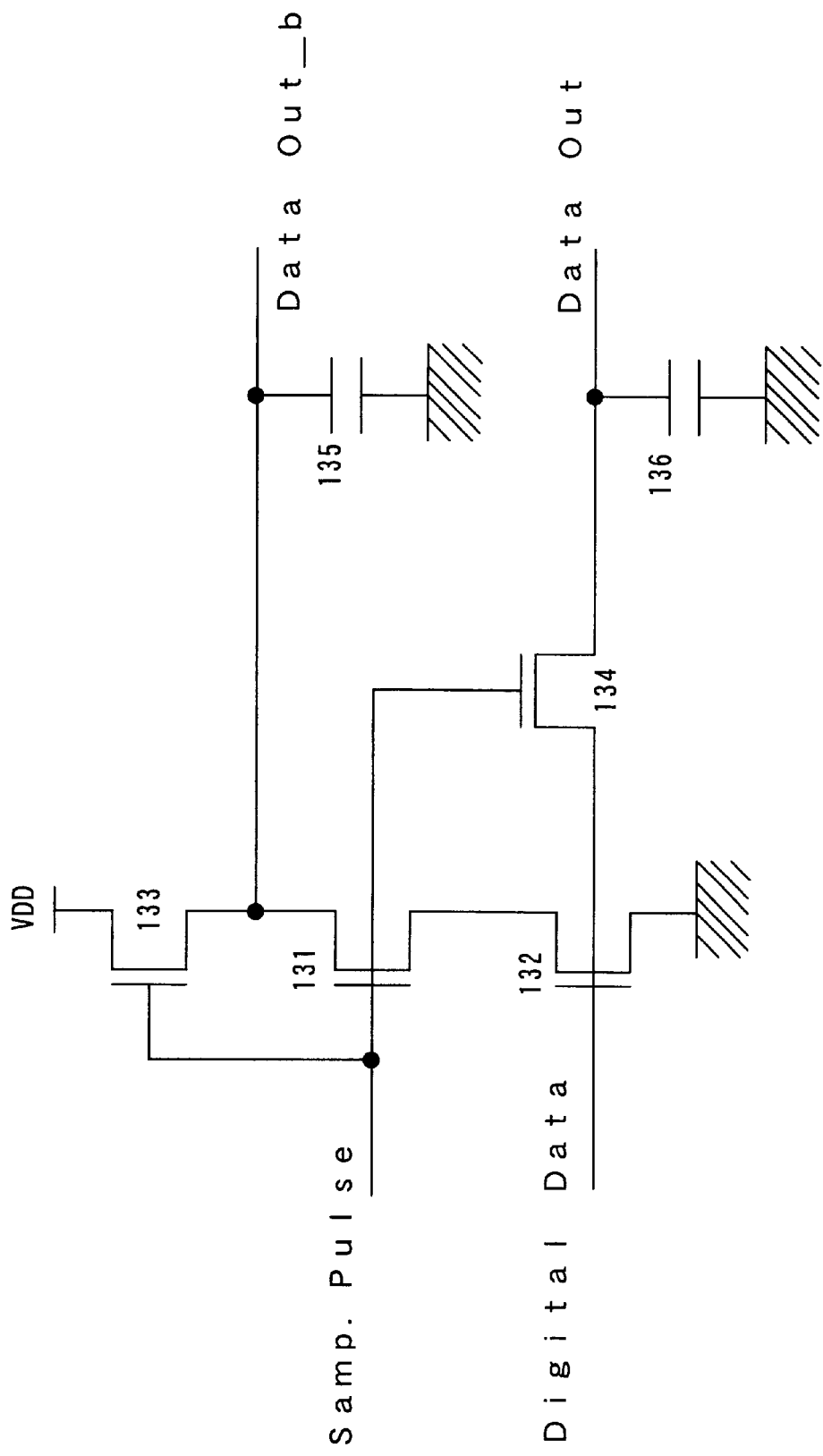
FIG. 13 is a diagram showing an embodiment of the present invention which is different from the embodiment mode.

This embodiment describes with reference to FIG. 13 a latch circuit structured differently from Embodiment mode and Embodiments 1 and 2.

The latch circuit shown in FIG. 13 in accordance with the present invention has TFTs 131 to 134 and capacitor means 135 and 136. A sampling pulse (Samp. Pulse) outputted from a shift register is inputted to gate electrodes of the TFTs 131, 133, and 134. A digital video signal (Digital Data) is inputted to a gate electrode of the TFT 132 and to an input electrode of the TFT 134.

An input electrode of the TFT 133 are connected to a high electric potential side power supply VDD. An output electrode of the TFT 133 and an output electrode of the TFT 131 are connected to an inverted output terminal (Data Out_b). An input electrode of the TFT 131 is connected to an output electrode of the TFT 132. An input electrode of the TFT 132 is connected to a low electric potential side power supply VSS.

The operation of the latch circuit shown in FIG. 13 is described next. The amplitude of a sampling pulse and the amplitude of a digital video signal are each between VDD and VSS upon input.

A sampling pulse outputted from the shift register is inputted to the gate electrodes of the TFTs 131, 133, and 134 to turn the TFTs 131, 133, and 134 ON. When a digital video signal inputted has Hi electric potential, the gate electrode of the TFT 132 receives Hi electric potential to turn it ON.

At this point, the TFTs 131, 132 and 133 are all turned ON to cause a through current to flow. The current performance of the TFTs 131 and 132 is set much higher than the current performance of the TFT 133, thereby giving Lo electric potential to the output electrodes of the TFTs 131 and 133, namely, an inverted output terminal (Data Out_b). An output terminal (Data Out) receives the digital video signal having Hi electric potential as it is through the TFT 134.

On the other hand, when a digital video signal inputted has Lo electric potential, Lo electric potential is inputted to the gate electrode of the TFT 132 to turn it OFF. Accordingly, Hi electric potential is given to the inverted output terminal (Data Out_b). The output terminal (Data Out) receives the digital video signal having Lo electric potential as it is through the TFT 134.

The above operation is conducted in succession for one horizontal period. Signals outputted to the output terminal (Data Out) and signals outputted to the inverted output terminal (Data Out_b) are held by the capacitor means 135 and 136, respectively, until a retrace period. The capacitor means 135 and 136 may be omitted depending on the downstream circuit structure or the length of a horizontal period.

When the sampling pulse (Samp. Pulse) becomes Lo electric potential and the sampling period is ended, the TFTs 131, 133, and 134 are turned OFF. In other words, the inverted output terminal (Data Out_b) and the output terminal (Data Out) move into a floating state.

In the latch circuit shown in FIG. 13 in accordance with the present invention, a current path is formed between VDD–TFT 133–TFT 131–TFT 132–VSS only when a sampling pulse is inputted and at the same time a digital video signal has Hi electric potential.

Influenced by the threshold of the TFT 134, the amplitude of an output signal on the output terminal side (Data Out) is between (VDD–VthN) and VSS. Similarly, the amplitude of an output signal on the inverted output terminal side (Data Out_b) is influenced by the threshold of the TFT 133 and is between (VDD–VthN) and VSS. However, this is not a problem since the amplitude is then compensated by a buffer circuit provided downstream of the latch circuit using boot strap.

In the circuit shown in FIG. 13, the TFT 131 and the TFT 132 may switch their positions. The circuit shown in FIG. 13 meets every property of a latch circuit of the present invention which is described in Summary of the Invention.

The TFTs 131 and 132 in FIG. 13 are n-channel TFTs but the present invention is not limited thereto. The TFTs 131 and 132 can be p-channel TFTs by inverting the power supply voltage and input and output signals.

Embodiment 4

Figure 30:
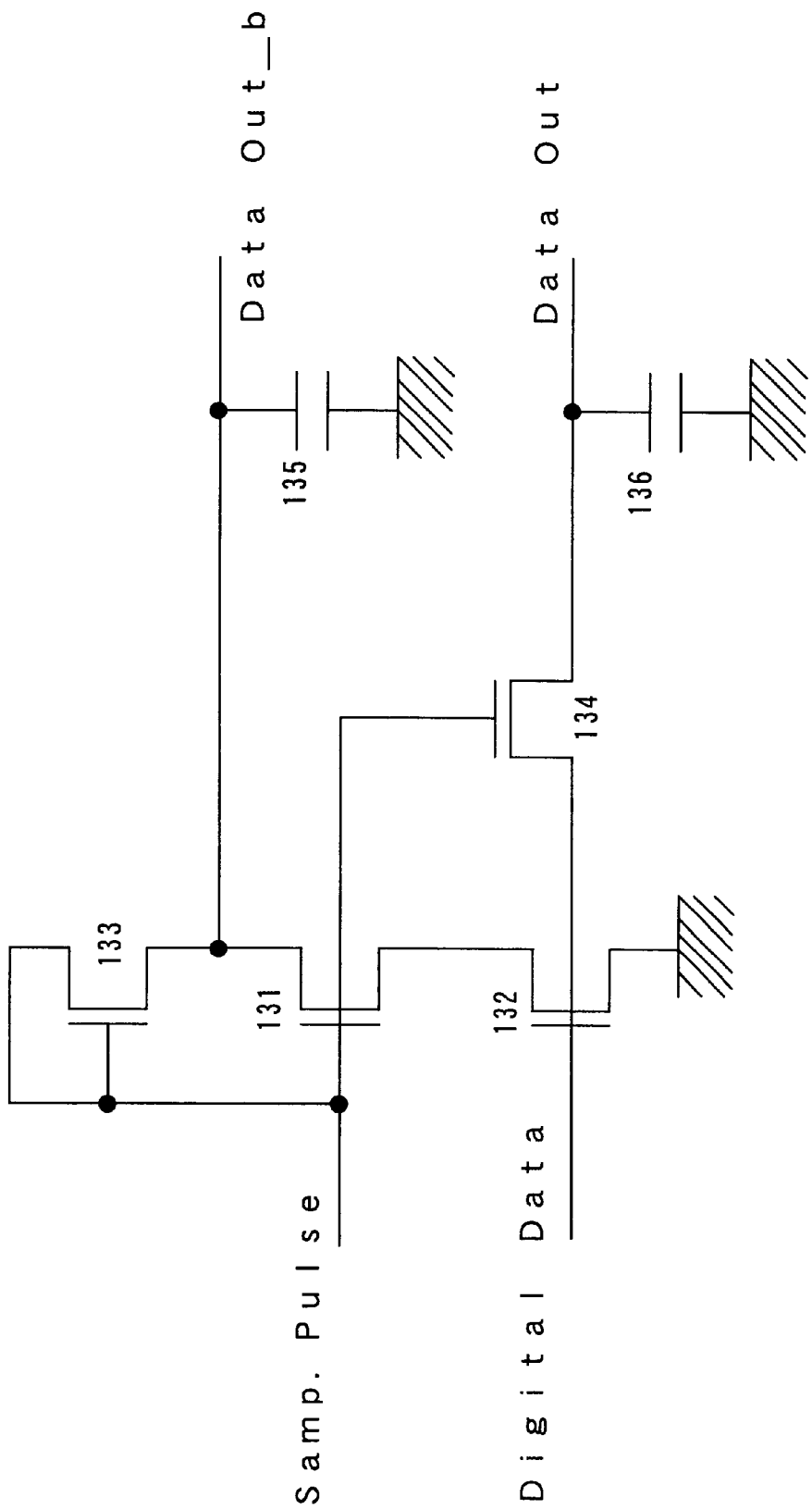
FIG. 30 is a diagram showing an embodiment of the present invention which is different from the embodiment mode.

This embodiment describes with reference to FIG. 30 a latch circuit structured differently from Embodiment mode and Embodiments 1 through 3.

The latch circuit shown in FIG. 30 is a small modification to connection of the latch circuit shown in FIG. 13 in accordance with the present invention. While the input electrode of the TFT 133 is connected to the power supply VDD in FIG. 13, the input electrode of the TFT 133 in the latch circuit shown in FIG. 30 is connected to a sampling pulse.

The operation of the latch circuit shown in FIG. 30 is the same as that of the latch circuit shown in FIG. 13 in accordance with Embodiment 3. Therefore the explanation is omitted from this embodiment.

The capacitor means 135 and 136 may be omitted depending on the downstream circuit structure or the length of a horizontal period. The TFT 131 and the TFT 132 may switch their positions. The circuit shown in FIG. 30 meets every property of a latch circuit of the present invention which is described in Summary of the Invention.

The TFTs in this embodiment are n-channel TFTs but the present invention is applicable also when they are p-channel TFTs.

Embodiment 5

Figure 31:
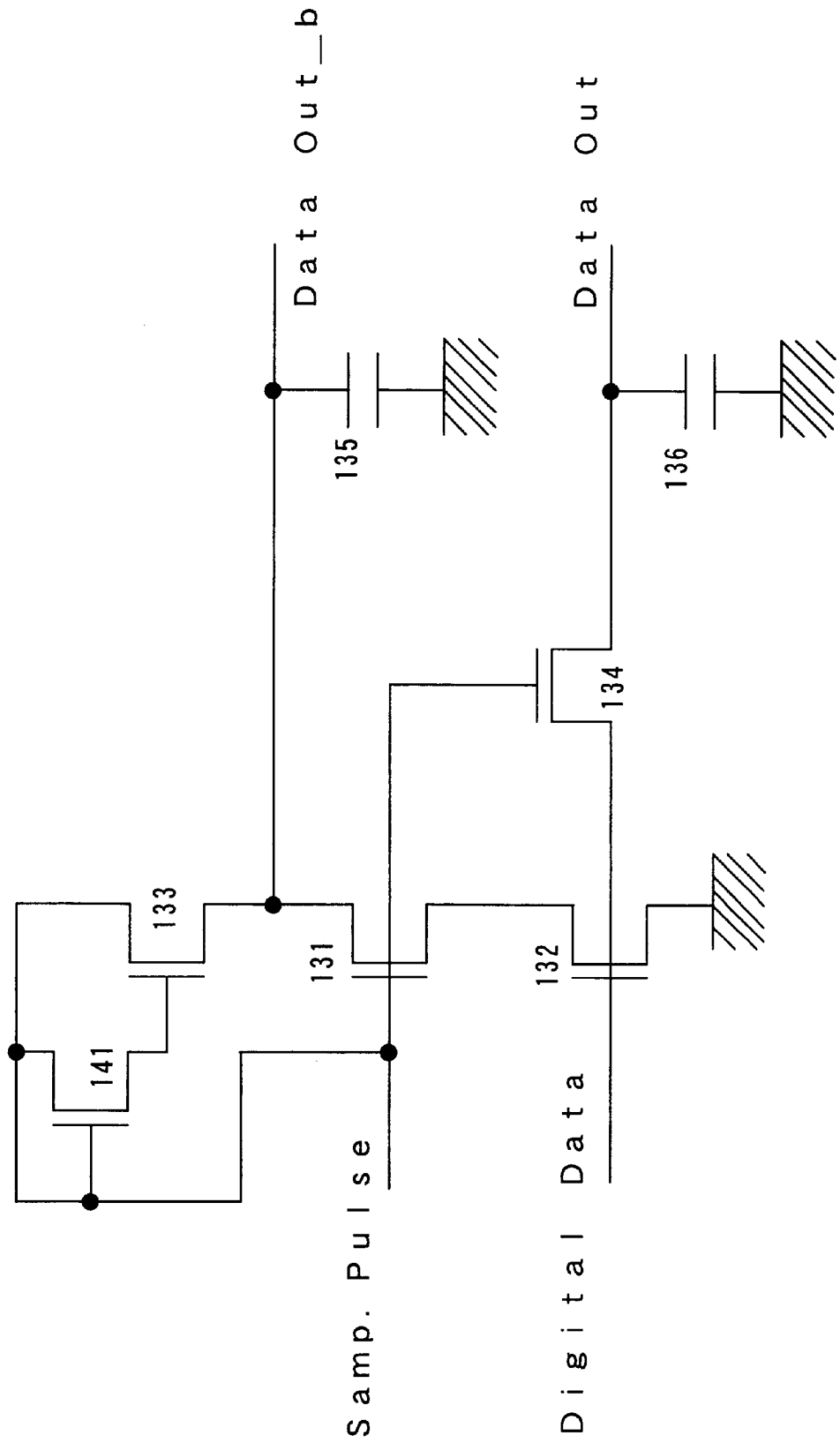
FIG. 31 is a diagram showing an embodiment of the present invention which is different from the embodiment mode.

This embodiment describes with reference to FIG. 31 a latch circuit structured differently from Embodiment mode and Embodiments 1 through 4.

The latch circuit shown in FIG. 31 is a small modification to connection of the latch circuit shown in FIG. 13 in accordance with the present invention. While the input electrode of the TFT 133 is connected to the power supply VDD in FIG. 13, the input electrode of the TFT 133 in the latch circuit shown in FIG. 31 is connected to a sampling pulse. Furthermore, the latch circuit of this embodiment is provided with a TFT 141. The sampling pulse is connected to a gate electrode and input electrode of the TFT 141, and an output electrode of the TFT 141 is connected to the gate electrode of the TFT 133.

The operation of the latch circuit shown in FIG. 31 is the same as that of the latch circuit shown in FIG. 13 in accordance with Embodiment 3. Therefore the explanation is omitted from this embodiment.

The capacitor means 135 and 136 may be omitted depending on the downstream circuit structure or the length of a horizontal period. The TFT 131 and the TFT 132 may switch their positions.

Further, the circuit shown in FIG. 31 meets every property of a latch circuit of the present invention which is described in Summary of the Invention.

The TFTs in this embodiment are n-channel TFTs but the present invention is applicable also when they are p-channel TFTs.

Embodiment 6

Figure 14:
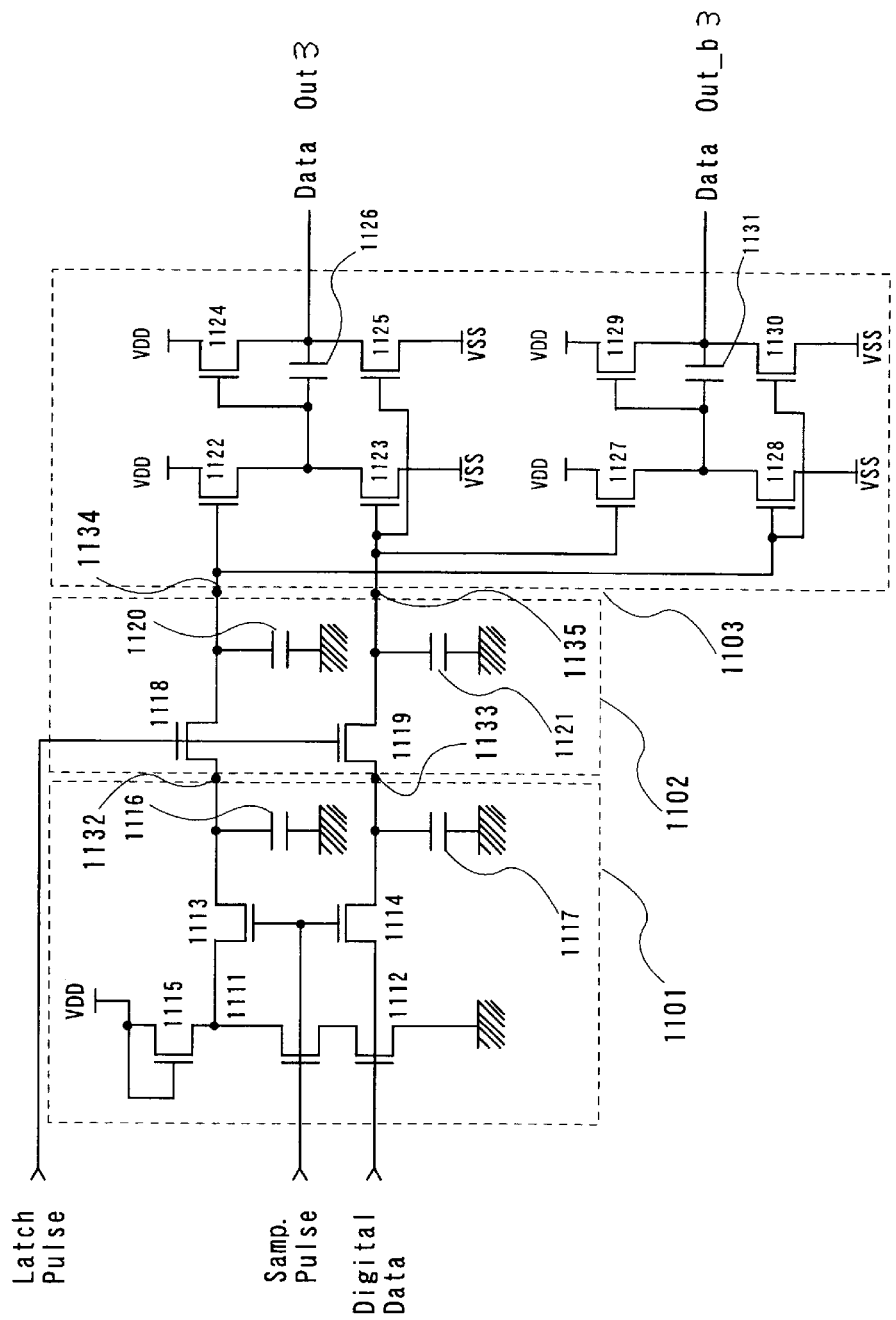
FIG. 14 is a diagram showing a structural example of a latch circuit and buffer circuit to which the present invention is applied.

This embodiment gives a description with reference to FIG. 14 on the structure and operation of a latch circuit that is structured differently from Embodiment Mode and Embodiments 1 through 5.

FIG. 14 shows an example in which a circuit structured as described in Embodiment Mode is used as a first latch circuit, and a second latch circuit and a buffer are provided. A first latch circuit 1101 has TFTs 1111 to 1115 and capacitor means 1116 and 1117. A second latch circuit 1102 has TFTs 1118 and 1119 and capacitor means 1120 and 1121. A buffer circuit 1103 has an inverter that is composed of TFTs 1122 to 1125 and capacitor means 1126 and an inverter that is composed of TFTs 1127 to 1130 and capacitor means 1131.

When the second latch circuit 1102 receives a latch pulse (Latch Pulse) during a retrace period after one horizontal period of sampling is finished, the TFTs 1118 and 1119 of the second latch circuit 1102 are turned ON and signals that have been held in the capacitor means 1116 and 1117 of the first latch circuit 1101 are written in the capacitor means 1120 and 1121 of the second latch circuit 1102.

When the sampling pulse (Samp. Pulse) becomes Lo electric potential and the sampling period is ended, the TFTs 1111, 1113, and 1114 are turned OFF. Accordingly, the input electrodes of the TFTs 1118 and 1119 move into a floating state. Subsequently, a latch pulse (Latch Pulse) is inputted to turn the TFTs 1118 and 1119 ON and signals are written in the capacitor means 1120 and 1121. At this point, no current power supply is connected to the input electrodes of the TFTs 1118 and 1119 and therefore the operation described above is carried out only by movement of electric charges in the capacitor means 1116, 1117, 1120, and 1121. Accordingly, in order to write in the capacitor means 1120 and 1121 sufficiently, the capacitor means 1116 and 1117 are desirably designed to have large capacitance.

The second latch circuit 1102 then outputs an output signal, which is inputted to the buffer circuit 1103. The buffer circuit 1103 is comprised of two inverters arranged into a pair. Therefore the operation of one of the inverters, one that is composed of the TFTs 1122 to 1125 and the capacitor means 1126, alone will be described here.

When one of outputs of the second latch circuit 1102, an output (Data Out2) 1134, is Hi electric potential, a gate electrode of the TFT 1122 receives Hi electric potential to turn it ON. On the other hand, Lo electric potential that is the other output of the second latch circuit 1102, an output (Data Out2_b) 1135, is inputted to gate electrodes of the TFTs 1123 and 1125 to turn them OFF. Accordingly, the electric potential of a gate electrode of the TFT 1124 is raised.

At this point, the electric potential of the gate electrode of the TFT 1122 is (VDD−VthN) and, therefore, as the electric potential of the gate electrode of the TFT 1124 reaches (VDD−2×VthN), the gate-source voltage of the TFT 1122 becomes lower than the threshold thereof to turn the TFT OFF. Accordingly, the gate electrode of the TFT 1124 at that point moves into a floating state temporarily.

Here, if VthN<(VDD−VthN), the TFT 1124 is turned ON and Hi electric potential is given to an output terminal (Data Out3) of the buffer 1103 to raise the electric potential thereof. Since the capacitor means 1126 is provided between the gate electrode of the TFT 1124 and its output electrode and the gate electrode of the TFT 1124 is now in a floating state, the electric potential of the gate electrode of the TFT 1124 is further raised by capacitive coupling as the electric potential of the output terminal (Data Out3) is raised.

As a result, the electric potential of the gate electrode of the TFT 1124 reaches higher than (VDD+VthN). This gives the output terminal Hi electric potential and the electric potential becomes equal to VDD without being influenced by the threshold of the TFT 1124.

On the other hand, when one of the outputs of the second latch circuit 1102, the output (Data Out2) 1134, is Lo electric potential, the gate electrode of the TFT 1122 receives Lo electric potential to turn it OFF. The gate electrodes of the TFTs 1123 and 1125 receive Hi electric potential that is the other output of the second latch circuit 1102, the output (Data Out2_b) 1135, to turn the TFTs 1123 and 1125 ON. Accordingly, the gate electrode of the TFT 1124 becomes Lo electric potential to turn it OFF, and Lo electric potential is given to the output terminal (Data Out3).

The inverter composed of the TFTs 1127 to 1130 and the capacitor means 1131 operates similarly, and one output terminal (Data Out3) is given Hi electric potential while the other output terminal (Data Out3_b) is given Lo electric potential.

In the latch circuit shown in this embodiment, the amplitude is attenuated by a level corresponding to the threshold of the TFTs from the first latch circuit to the second latch circuit. Therefore the power supply voltage has to be high to some degree. Accordingly, an output of the first latch circuit may be put through a buffer once for amplitude compensation.

In this embodiment, the capacitor means 1120 and 1121 may be omitted. Information held by the capacitor means 1120 and 1121 is sent as it is to the output terminals of the buffer circuit 1103 (Data Out3 and Data Out3_b) when the TFTs 1118 and 1119 are turned ON by a latch pulse (Latch Pulse). The output electric potential of the buffer circuit 1103 is held by the capacitor means 1126 and 1131 used in boot strap, and therefore data may be latched by using the output electric potential.

The TFTs in this embodiment are n-channel TFTs but the present invention is applicable also when the TFTs are p-channel TFTs.

This embodiment can be implemented by being freely combined with Embodiment Mode and Embodiments 1 through 5.

Embodiment 7

In Embodiment 6 described above, an output from the first latch circuit is immediately inputted to the second latch circuit and amplitude attenuation is compensated by the buffer circuit downstream of the second latch circuit. In this case, however, if the operation voltage is low and the TFTs have large threshold, there is a fear that the initial amplitude is attenuated greatly by the threshold to make normal holding operation impossible for the latch circuit.

Accordingly, this embodiment describes a semiconductor device in which an amplitude compensating buffer circuit is added downstream of the first latch circuit.

Figure 32:
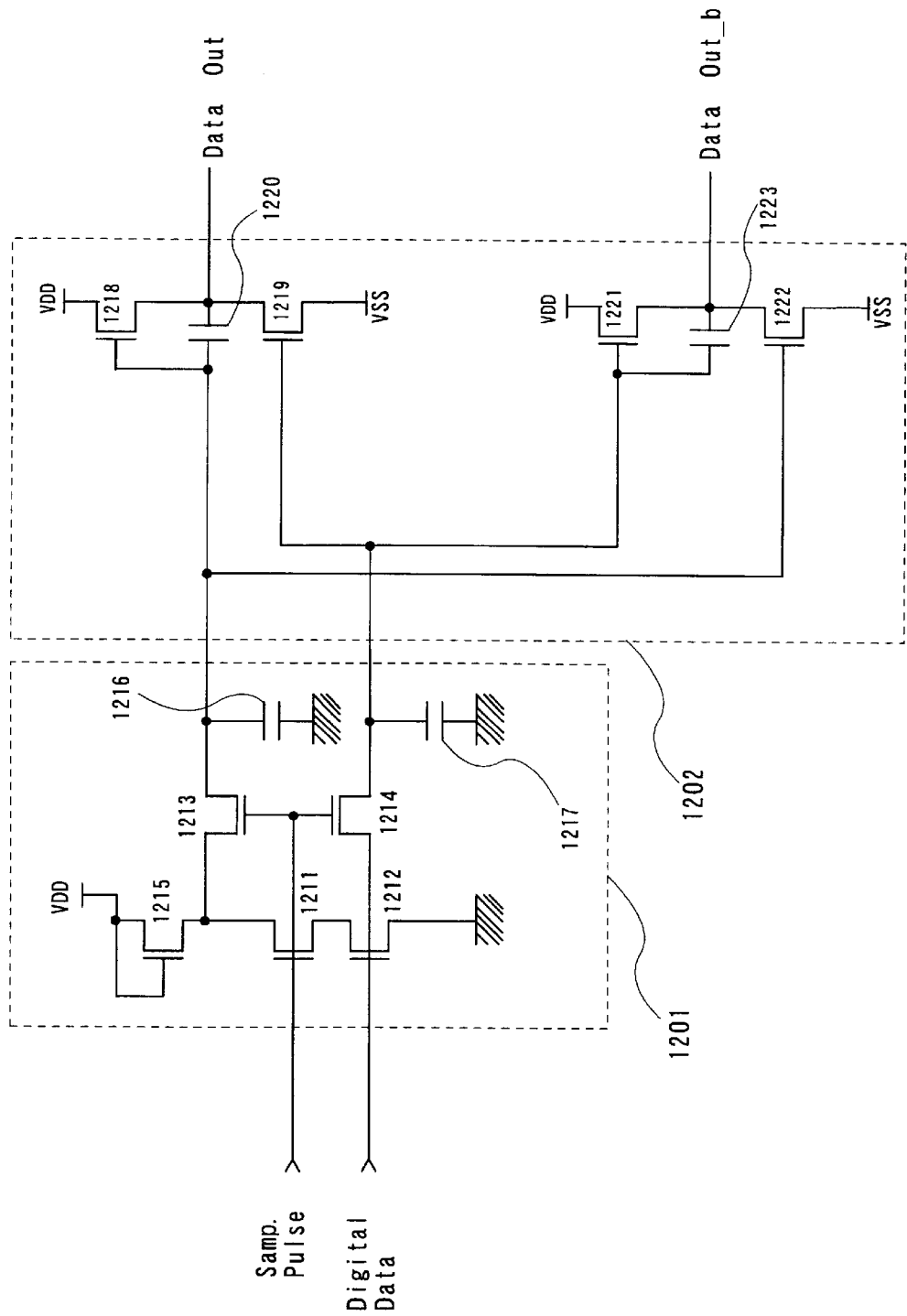
FIG. 32 is a circuit diagram of an embodiment in which an amplitude compensating buffer circuit is added downstream of a first latch circuit.
Figure 33:
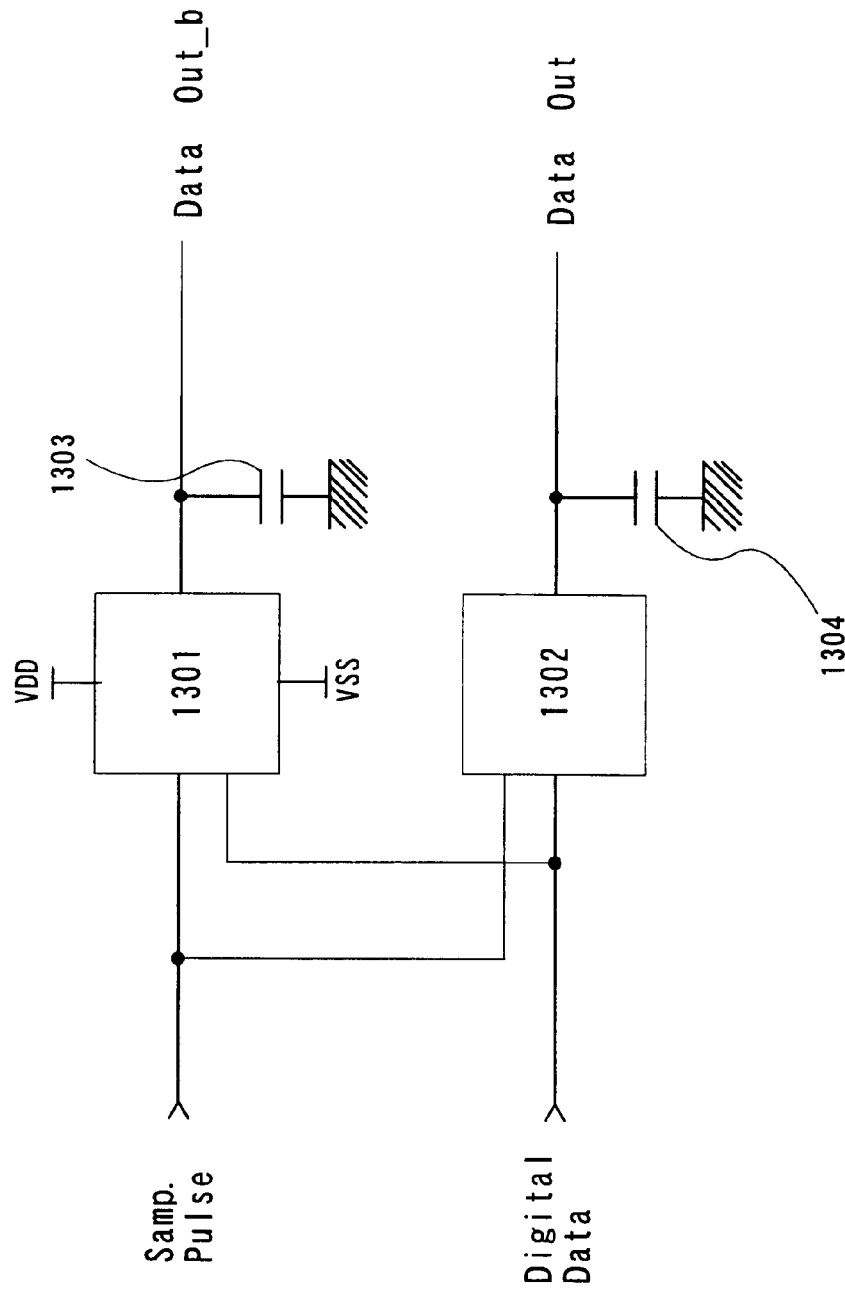
FIG. 33 is a diagram showing the structure of a latch circuit of the present invention.

FIG. 32 shows the structure of the semiconductor device of this embodiment. An area surrounded by a dotted line frame 1201 is the first latch circuit described in Embodiment Mode, and the circuit has TFTs 1211 to 1215 and capacitor means 1216 and 1217.

An area surrounded by a dotted line frame 1202 is an amplitude compensating buffer circuit for compensating the amplitude of an output from the first latch circuit. The amplitude compensating buffer circuit has TFTs 1218, 1219, 1221, and 1222, and capacitor means 1220 and 1223.

The operation of the semiconductor device shown in FIG. 32 is described next. The circuit composed of the TFTs 1218 and 1219 and the capacitor means 1220 and the circuit composed of the TFTs 1221 and 1222 and the capacitor means 1223 operate as described in the above embodiment except that the polarity of signals inputted is reverse to that of the above embodiment. Therefore this embodiment describes the operation of the circuit composed of the TFTs 1218 and 1219 and the capacitor means 1220 alone.

A sampling pulse (Samp. Pulse) and a digital video signal (Digital Data) are inputted to the first latch circuit 1201 and a first output signal (Data Out) and a second output signal (Data Out_b) are outputted.

A signal outputted from an output electrode of the TFT 1214 is referred to as first output signal and a signal outputted from an output electrode of the TFT 1213 is referred to as second output signal. The second output signal has a polarity inverted from the polarity of the first output signal.

When a digital video signal (Digital Data) inputted to the first latch circuit is Hi electric potential, the first output signal is Hi electric potential and the second output signal is Lo electric potential. When a digital video signal (Digital Data) inputted to the first latch circuit is Lo electric potential, the first output signal is Lo electric potential and the second output signal is Hi electric potential.

The amplitude of the first and second output signals is influenced by the threshold of the TFTs 1213 and 1214 in the first latch circuit and therefore is between (VDD−VthN) and VSS. In short, the amplitude thereof is attenuated by VthN.

When the first output signal is Lo electric potential and the second output signal is Hi electric potential, Hi electric potential is inputted to a gate electrode of the TFT 1218 and Lo electric potential is inputted to a gate electrode of the TFT 1219.

On the other hand, when a sampling period is ended in the first latch circuit, the sampling pulse becomes Lo electric potential to turn the TFTs 1214 and 1213 OFF. This moves the gate electrodes of the TFTs 1218 and 1219 into a floating state while the capacitor means 1216 and 1217 hold the electric potentials of the gate electrodes of that instant.

The electric potential of the gate electrode of the TFT 1218 at this point is Hi electric potential, namely, (VDD−VthN) and the electric potential of the gate electrode of the TFT 1219 then is VSS. Therefore the TFT 1218 is turned ON and the electric potential of an output electrode of the TFT 1218 is raised. At this point, the TFT 1219 is turned OFF.

Then the capacitor means 1220 forms capacitive coupling between the gate electrode and output electrode of the TFT 1218 to cause boot strap. As a result, the electric potential of the gate electrode of the TFT 1218 is further raised from (VDD−VthN) to take an electric potential higher than (VDD+VthN). Therefore, the electric potential of the output electrode of the TFT 1218, namely, the electric potential of the buffer output (Data Out), becomes equal to VDD.

On the other hand, when Lo electric potential is inputted to the gate electrode of the TFT 1218 and Hi electric potential is inputted to the gate electrode of the TFT 1219, the buffer output is Lo electric potential.

The above operation is also carried out in the circuit that is composed of the TFTs 1221 and 1222 and the capacitor means 1223. When the buffer output is Hi electric potential, the inverted buffer output (Data Out_b) is Lo electric potential. When the buffer output is Lo electric potential, the inverted buffer output is Hi electric potential.

Accordingly, the amplitude of an output of the first latch circuit is compensated and the normal VDD−VSS amplitude can be obtained and inputted to the second latch circuit.

When boot strap is at work between the gate electrode and output electrode of the TFT 1218, at the same time the gate electrode of the TFT 1219 is in a floating state. Therefore the electric potential of the gate electrode of the TFT 1219 may be raised by the gate-drain capacitance of the TFT 1219 itself even when no special capacitor means is provided. If the TFT 1219 is turned ON as a result, it causes malfunction. Accordingly, it is desirable to take countermeasure such as setting the capacitance between the gate-drain of the TFT 1219 small, in other words, setting the TFT 1219 smaller than the TFT 1218 in size.

In FIG. 32, the capacitor means 1216 and 1217 preferably have small capacitance. This is because the gate electrodes of the TFTs 1218 and 1221 are not raised much by boot strap if the capacitor means have large capacitance. The capacitor means 1216 and 1217 may not be provided particularly. The electric potential of the buffer output (Data Out) and the electric potential of the inverted buffer output (Data Out_b) are held in the capacitor means 1220 and 1223, respectively, in the case where the capacitor means 1216 and 1217 are not provided. Therefore it does not cause a problem.

The TFTs in this embodiment are n-channel TFTs but the present invention is applicable also when the TFTs are p-channel TFTs.

This embodiment can be implemented by being freely combined with Embodiment Mode and Embodiments 1 through 6.

Embodiment 8

This embodiment gives a description on a method of manufacturing TFTs for driving circuit provided in a pixel portion and in the periphery of the pixel potion formed on the same substrate. A method of manufacturing a liquid crystal display device is described as an example, however, the present invention is not limited to a liquid crystal display device as above mentioned.

Figure 7A:
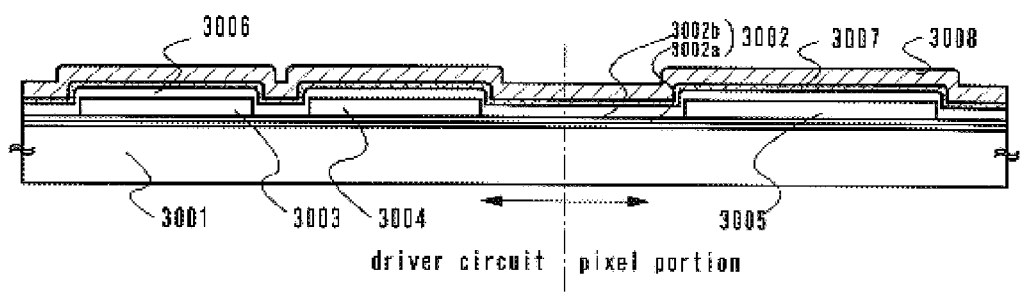
FIGS. 7A to 7D are diagrams showing an example of a display device manufacturing process.

First, as shown in FIG. 7A, a base film 3002 is formed from an insulating film such as a silicon oxide film, a silicon nitride film, and a silicon oxynitride film on a glass substrate 3001. The substrate 3001 is formed of barium borosilicate glass typical example of which is Corning #7059 glass or Corning #1737 glass (product of Corning Incorporated), or of aluminoborosilicate glass. The base film 3002 is, for example, (not shown) a laminate of a silicon oxynitride film 3002a that is formed from $SiH_4$, $NH_3$, and $N_2O$ by plasma CVD to a thickness of 10 to 200 nm (preferably 50 to 100 nm) and a silicon oxynitride hydride film 3002b formed from $SiH_4$ and $N_2O$ by plasma CVD to a thickness of 50 to 200 nm (preferably 100 to 150 nm). In this embodiment, though the base film is formed to have a two layer structure, the base film may also be formed to have a single layer film or two or more layers film structure of the insulating film.

A semiconductor film having an amorphous structure is crystallized by laser crystallization or a known thermal crystallization method to form a crystalline semiconductor film. The crystalline semiconductor film makes island-like semiconductor layers 3003 to 3005. The island-like semiconductor layers 3003 to 3005 each have a thickness of 25 to 80 nm (preferably 30 to 60 nm). Not limited to the material of the crystalline semiconductor film though, it is preferable to use silicon or a silicon germanium (SiGe) alloy.

When the crystalline semiconductor film is formed by laser crystallization, a pulse oscillation-type or continuous wave excimer laser, YAG laser, or $YVO_4$ laser is used. Laser light emitted from a laser as those given in the above is desirably collected into a linear beam by an optical system before irradiating the semiconductor film. Conditions of crystallization are set suitably by an operator. However, if an excimer laser is used, the pulse oscillation frequency is set to 30 Hz and the laser energy density is set to 100 to 400 mJ/cm$^2$ (typically 200 to 300 mJ/cm$^2$). If a YAG laser is used, second harmonic thereof is employed and the pulse oscillation frequency is set to 1 to 10 kHz while setting the laser energy density to 300 to 600 mJ/cm$^2$ (typically 350 to 500 mJ/cm$^2$). The laser light is collected into a linear beam having a width of 100 to 1000 µm, for example, 400 µm, to irradiate the entire substrate. The substrate is irradiated with the linear laser light with the beams overlapping each other at an overlap ratio of 80 to 98%.

Next, a gate insulating film 3006 is formed so as to cover the island-like semiconductor layers 3003 to 3005. The gate insulating film 3006 is formed from an insulating film containing silicon by plasma CVD or sputtering to a thickness of 40 to 150 nm. In this embodiment, a silicon oxynitride film having a thickness of 120 nm is used. Needless to say, the gate insulating film is not limited to a silicon oxynitride film but may be a single layer or a laminate of other insulating films containing silicon. For example, if a silicon oxide film is used for the gate insulating film, the film is formed by plasma CVD in which TEOS (tetraethyl orthosilicate) is mixed with $O_2$ and the reaction pressure is set to 40 Pa, the substrate temperature to 300 to 400° C., the frequency is set high to 13.56 MHz, and the power density is set to 0.5 to 0.8 W/cm$^2$ for electric discharge. The silicon oxide film thus formed can provide the gate insulating film with excellent characteristics when it is subjected to subsequent thermal annealing at 400 to 500° C.

On the gate insulating film 3006, a first conductive film 3007 and a second conductive film 3008 for forming gate electrodes are formed. In this embodiment, the first conductive film 3007 is a Ta film with a thickness of 50 to 100 nm and the second conductive film 3008 is a W film with a thickness of 100 to 300 nm.

The Ta film is formed by sputtering in which Ta as a target is sputtered with Ar. In this case, an appropriate amount of Xe or Kr is added to Ar to ease the internal stress of the Ta film and thus prevent the Ta film from peeling off. The resistivity of a Ta film in α phase is about 20 µΩcm and is usable for a gate electrode. On the other hand, the resistivity of a Ta film in β phase is about 180 µΩcm and is not suitable for a gate electrode. A Ta film in α phase can readily be obtained when a base with a thickness of about 10 to 50 nm is formed from tantalum nitride (TaN) that has a crystal structure approximate to that of the α phase Ta film.

The W film is formed by sputtering with W as a target. Alternatively, the W film may be formed by thermal CVD using tungsten hexafluoride (WF$_6$). In either case, the W film has to have a low resistivity in order to use the W film as a gate electrode. A desirable resistivity of the W film is 20 µΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film being formed. As a result, the W film can have a resistivity of 9 to 20 µΩcm.

Although the first conductive film 3007 is a Ta film and the second conductive film 3008 is a W film in this embodiment, there is no particular limitation. The conductive films may be formed of any element selected from the group consisting of Ta, W, Mo, Al, and Cu, or of an alloy material or compound material mainly containing the elements listed above. A semiconductor film, typically a polycrystalline silicon film doped with an impurity element such as phosphorus, may be used instead. Other desirable combinations of materials for the first and second conductive films than the one shown in this embodiment include: tantalum nitride (TaN) for the first conductive film 3007 and W for the second conductive film 3008; tantalum nitride (TaN) for the first conductive film 3007 and Al for the second conductive film 3008; and tantalum nitride (TaN) for the first conductive film 3007 and Cu for the second conductive film 3008.

Next, a resist masks 3009 to 3012 are formed to carry out first etching treatment for forming electrodes and wiring lines. In this embodiment, ICP (inductively coupled plasma) etching is employed in which $CF_4$ and $Cl_2$ are mixed as etching gas and an RF (13.56 MHz) power of 500 W is given to a coiled electrode at a pressure of 1 Pa to generate plasma. The substrate side (sample stage) also receives an RF (13.56 MHz) power of 100 W so that a substantially negative self-bias voltage is applied. When the mixture of $CF_4$ and $Cl_2$ is used, the W film and the Ta film are etched to the same degree.

Figure 7B:
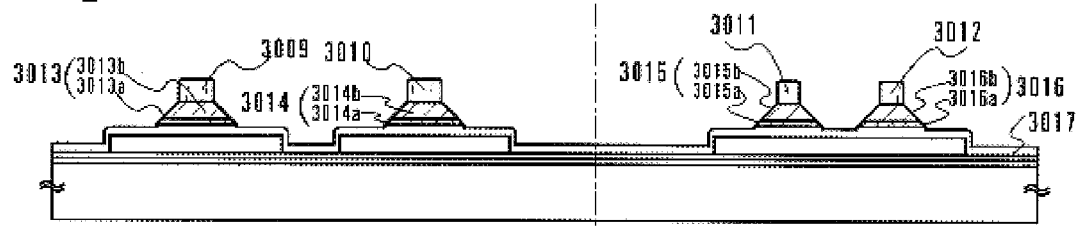

Under the above etching conditions, if the resist mask is properly shaped, the first conductive film and the second conductive film are tapered around the edges by the effect of the bias voltage applied to the substrate side. The angle of the tapered portions is 15° to 45°. In order to etch the conductive films without leaving any residue on the gate insulating film, the etching time is prolonged by about 10 to 20%. The selective ratio of the W film to the silicon oxynitride film is 2 to 4 (typically 3), and therefore a region where the silicon oxynitride film is exposed is etched by about 20 to 50 nm by the over-etching treatment. In this way, first shape conductive layers 3013 to 3016 comprising first conductive layers 3013a to 3016a and second conductive layers 3013b to 3016b are formed from the first conductive film and the second conductive film through the first etching treatment. At this point, regions of the gate insulating film 5006 that are not covered with the first shape conductive layers 3013 to 3016 are etched and thinned by about 20 to 50 nm. (FIG. 7B)

Figure 7C:
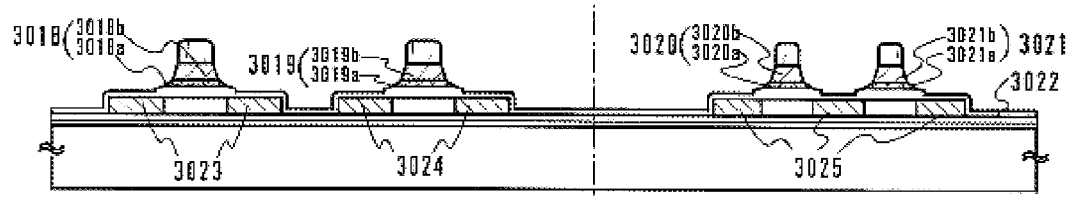

Next, as shown in FIG. 7C, a second etching process is performed without removing the resist masks 3009 to 3012. The W film is selectively etched by performing the second etching method in which $CF_4$, $Cl_2$, and $O_2$ are mixed as the etching gases. By the second etching process, the second shape conductive layers 3018 to 3021 are formed (first conductive layers 3018a to 3021a and second conductive layers 3018b to 3021b). Reference numeral 3022 is a region, which is not covered with the second shape conductive layers 3018 to 3021, resulted to be a thin film by performing an etching into a film thickness of about 20 to 50 nm.

The reaction of the W film and the Ta film to etching by the mixture gas of $CF_4$ and $Cl_2$ can be deduced from the vapor pressure of radical or ion species generated and of reaction products. Comparing the vapor pressure among fluorides and chlorides of W and Ta, $WF_6$ that is a fluoride of W has an extremely high vapor pressure while the others, namely, $WCl_5$, $TaF_5$, and $TaCl_5$ have a vapor pressure of about the same degree. Accordingly, the W film and the Ta film are both etched with the mixture gas of $CF_4$ and $Cl_2$. However, when an appropriate amount of $O_2$ is added to this mixture gas, $CF_4$ and $O_2$ react to each other to be changed into CO and F, generating a large amount of F radicals or F ions. As a result, the W film whose fluoride has a high vapor pressure is etched at an increased etching rate. On the other hand, the etching rate of the Ta film is not increased much when F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further. Thus a difference in etching rate is introduced between the W film and the Ta film, so that the etching rate of the W film is set faster than the etching rate of the Ta film.

Then, an impurity element for giving an n-type conductivity is added by performing first doping processing. A doping method may be either an ion doping method or an ion implantation method. The ion doping method is carried out under the condition that a dose is set to from $1 \times 10^{13}$ to $5 \times 10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 3018 to 3021 serve as masks with respect to the impurity element for giving the n-type conductivity, and first impurity regions 3023 to 3025 are formed in a self-aligning manner. The impurity element for giving the n-type conductivity is added to the first impurity regions 3023 to 3025 in a concentration range from $1 \times 10^{20}$ to $1 \times 10^{21}$ atoms/cm$^3$ (FIG. 7C).

Figure 7D:
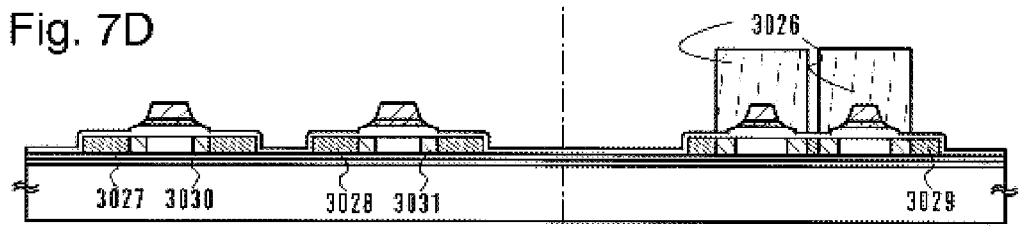

As shown in FIG. 7D, second doping processing is then performed after a portion to be a pixel TFT is covered by the resist mask 3026. The resist mask does not cover entire surface of the pixel TFT. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, new impurity regions 3027 to 3029 are formed inside the first impurity regions 3023 to 3025 formed in the island-like semiconductor layer in FIG. 7D. In the doping, the conductive layers 3018, 3019 of the second shape are used as masks with respect to the impurity element, and the doping is performed such that the impurity element is also added to regions underside the first conductive layers 3018a, 3019a. Thus, third impurity regions 3030, 3031 are formed. The third impurity regions 3030, 3031 contain phosphorus (P) with a gentle concentration gradient that conforms with the thickness gradient in the tapered portions of the first conductive layers 3018a, 3019a. In the semiconductor layers that overlap the tapered portions of the first conductive layers 3018a, 3019a, the impurity concentration is slightly lower around the center than at the edges of the tapered portions of the first conductive layers 3018a, 3019a. However, the difference is very slight and almost the same impurity concentration is kept throughout the semiconductor layers.

Through the steps above, the impurity regions are formed in the respective island-like semiconductor layers. The third shape conductive layers 3018 to 3021 overlapping the island-like semiconductor layers function as gate electrodes.

Figure 8A:
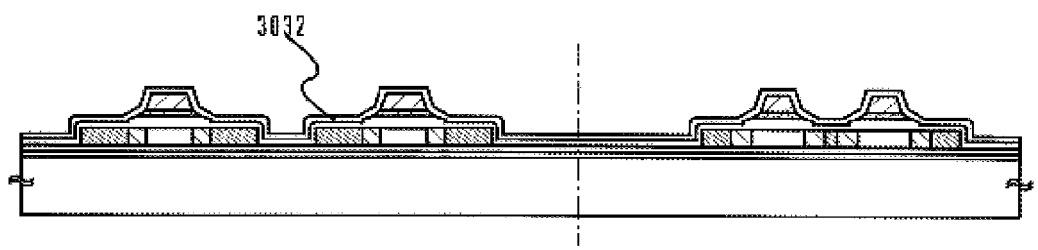
FIGS. 8A to 8C are diagrams showing an example of a display device manufacturing process.

After the resist mask 3026 is removed, the impurity elements used to dope the island-like semiconductor layers in order to control the conductivity types are activated. The activation step is carried out by thermal annealing using an annealing furnace. Other activation adoptable methods include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 500° C. for four hours. However, if the wiring line material used for the third shape conductive layers 3018 to 3021 are weak against heat, the activation is desirably made after an interlayer insulating film 3032 (mainly containing silicon) is formed in order to protect the wiring lines and others (FIG. 8A).

Another heat treatment is conducted in an atmosphere containing 3 to 100% hydrogen at 300 to 450° C. for one to twelve hours, thereby hydrogenating the island-like semiconductor layers. The hydrogenation steps are to terminate dangling bonds in the semiconductor layers using thermally excited hydrogen. Alternatively, plasma hydrogenation (using hydrogen that is excited by plasma) may be employed (FIG. 8A).

Figure 8B:
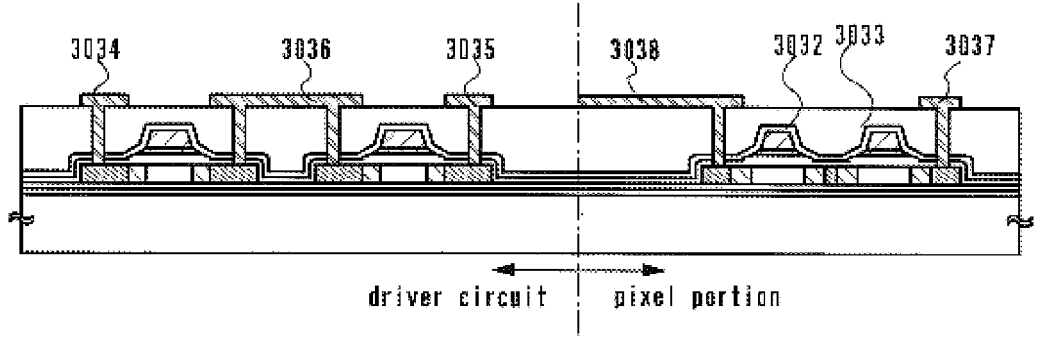

As shown in FIG. 8B, a first interlayer insulating film 3032 is formed next from a silicon oxynitride film with a thickness of 100 to 200 nm. A second interlayer insulating film 3033 is formed thereon from an organic insulating material made from acrylic or the like. In this embodiment, the second interlayer insulating film 3033 is thick enough to eliminate the level differences caused by the TFTs. An appropriate thickness of the film is 1 to 5 μm (preferably 2 to 4 μm).

Instead of the organic insulating material, inorganic materials can be used for the second interlayer insulating film 3033. As the inorganic materials, $SiO_2$ (PCVD-$SiO_2$), SOG (Spin on Glass; silicon coating oxide film), and the like formed by inorganic $SiO_2$ and plasma CVD method may be used.

An etching treatment is performed in order to form contact holes after two interlayer insulating films. The contact holes are formed by dry etching or wet etching, and include contact holes reaching the impurity regions 3027 to 3029 having the n-type conductivity, the source signal lines (not shown), the gate signal lines (not shown), a power supply line (not shown), and gate electrodes 3018 to 3021 (not shown) respectively.

Further, a lamination film of a three layer structure, in which a 100 nm thick Ti film, a 300 nm thick Al film containing Ti, and a 150 nm thick Ti film are formed in succession by sputtering the wirings 3034 to 3037. Of course, other conductive films may be used. As to the pixel electrode 3038, in a case of that the display device is a reflect type, is formed by a material in high reflectivity. On the other hand, in a case of that the display device is a transmission type, the pixel electrode 3038 is formed by using a material like Indium Tin Oxide (ITO) or the like that has transparent conductivity. The state completed as shown FIG. 8B is referred to as the active matrix substrate.

An opposing substrate 3039 is prepared next. A light shielding film is formed on the opposing substrate 3039. The light shielding film 3041 is formed of a material such as chrome (Cr) into a thickness of 100 to 200 nm.

Figure 8C:
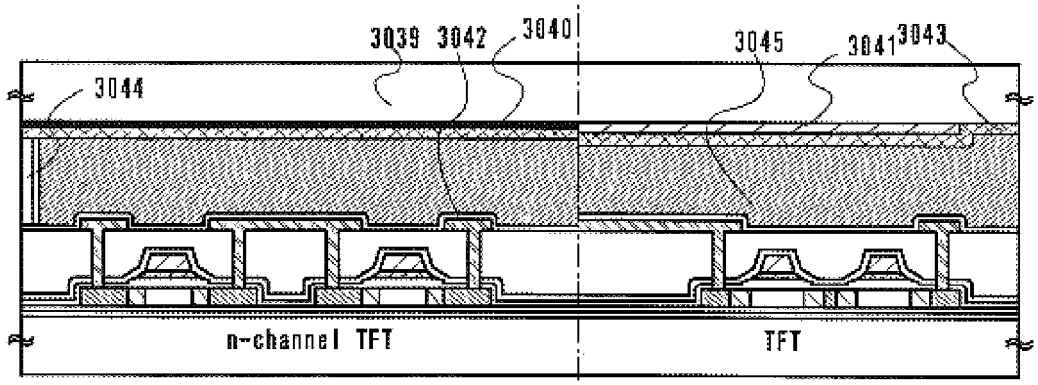

On the other side, an opposing electrode 3041 is formed in the pixel portion as shown in FIG. 8C. The opposing electrode is formed by using a transparent conductive material such as ITO. Further, it is preferable that the film thickness of the opposing electrode be from 100 to 120 nm in order to maintain a high transmissivity of visible light.

Orientation films 3042 and 3043 are formed in the active matrix substrate and the opposing substrate. It is preferable that the film thickness of the orientation films 3042 and 3043 are from 30 to 80 nm. Furthermore, materials such as SE7792, for example, manufactured by Nissan Chemical Industries, Ltd., can be used for the orientation films. If an orientation film having a high pre-tilt angle is used, then the generation of disclination can be controlled at the same time as driving the liquid crystal display device by an active matrix method.

The orientation films 3042 and 3043 undergo a rubbing process next. It is preferable that the rubbing direction show a counterclockwise TN (twisted nematic) orientation when the liquid crystal display device is complete.

Although not shown in particular in the figures for this embodiment, it is also possible to increase the uniformity of a cell gap by distributing spacers within the pixels or by patterning. A photosensitive resin film is formed and patterned in embodiment 2, thus forming spacers having a height of 4.0 µm.

The active matrix substrate and the opposing substrate are then bonded by using a sealant 3044. The thermosetting sealant XN-21S manufactured by Mitsui Chemicals is used as the sealant. A filler is mixed into the sealant. Note that the height of the filler is set to 4.0 µm. After the sealant is hardened, the active matrix substrate and the opposing substrate are sectioned simultaneously into predetermined sizes.

Liquid crystals 3045 are injected next. Considering high speed response characteristics and the like, it is preferable to use a low viscosity liquid crystal material for the liquid crystals. A nematic liquid crystal material having an easily controlled orientation is used in this embodiment. High response speed ferroelectric liquid crystals and anti-ferroelectric liquid crystals may of course also be used.

In injection port is sealed by using a UV hardening resin or the like after liquid crystal injection is complete. A polarizing sheet is then attached by a known method. Lastly, a connector (flexible printed circuit: FCP) for connecting the elements formed on the substrate, or terminals pulled out from the circuits with external signal terminals is attached, completing a manufactured product (see FIG. 8C). This state, one capable of being shipped as a finished product, is referred to as a liquid crystal display device within this specification.

Further, the number of photomasks necessary for manufacturing the active matrix substrate can be kept to five (island shape semiconductor layer pattern, first wiring pattern (source wirings, capacitor wirings), mask pattern, contact hole pattern, and second wiring pattern (including pixel electrodes and connection electrodes)) in accordance with the processes disclosed in this specification. As a result, processing can be shortened, and this contributes to a reduction in manufacturing costs and to an increase in yield.

In this embodiment, NMOS configuration TFT is shown, the latch circuit shown in FIG. 1 may be formed by using such TFT.

In this embodiment, the writing TFT is described as a double gate structure though, a single gate structure or multi gate structure may also be adopted.

Figure 26A:
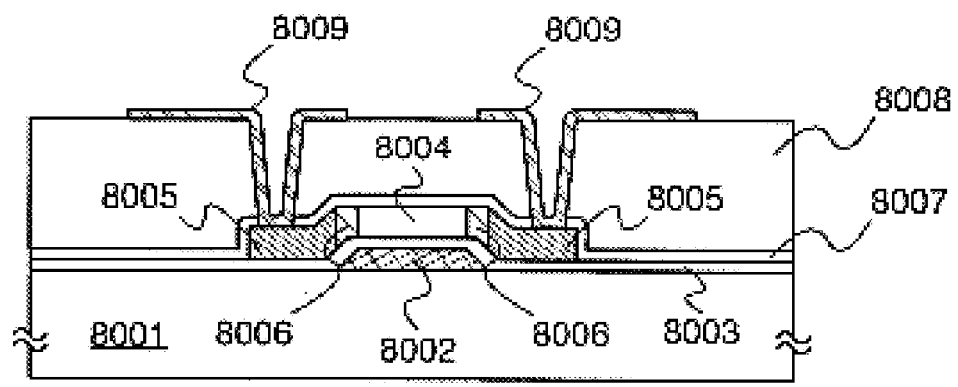
FIGS. 26A and 26B are diagrams showing structures of a bottom gate TFT and a dual gate TFT.
Figure 26B:
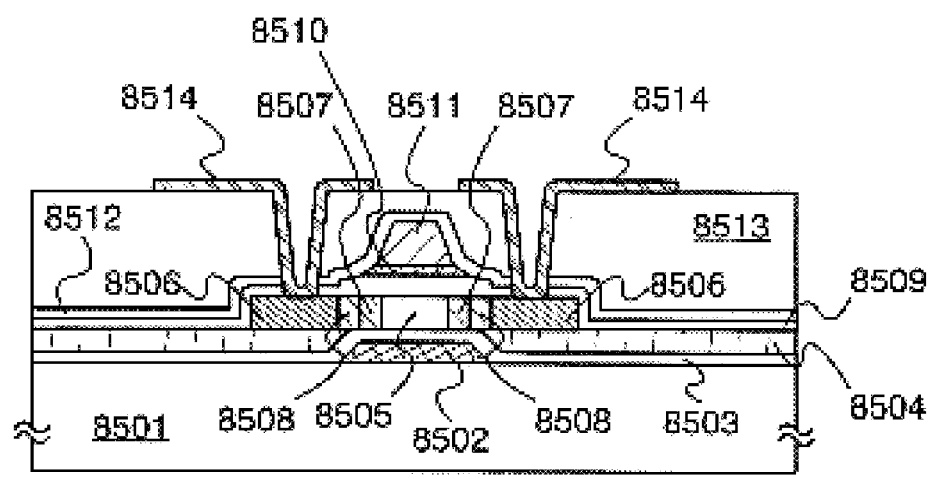

In addition, the top gate type TFT is described as an example of a TFT model. Besides, a bottom gate TFT forming a gate electrode at the bottom of the active layer as shown in FIG. 26A, or a dual gate TFT having gate electrodes at top and bottom in order to put the active layer between the gate electrodes as shown in FIG. 26B can be used to implement this embodiment.

This embodiment may be implemented by combining freely with Embodiment Mode, and Embodiments 1 through 7.

Embodiment 9

In this embodiment, an example in which a display device (a semiconductor device) is actually manufactured using the circuits described in Embodiment Mode and Embodiments 1 to 7, and TFT manufacturing steps shown in Embodiment 8 will be described.

Figure 2A:
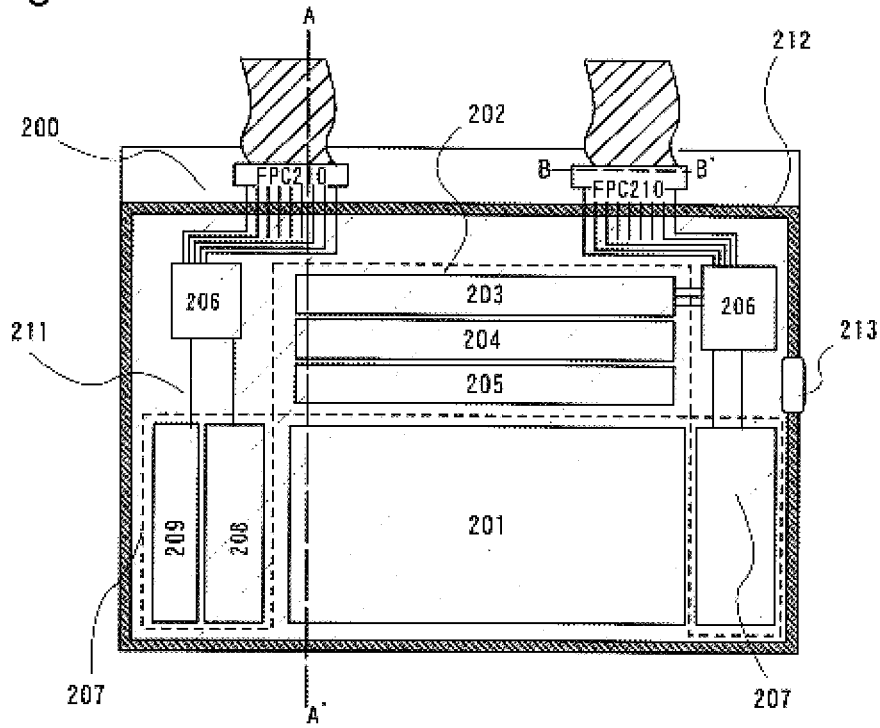
FIGS. 2A to 2C are a schematic diagram of a display device and sectional views thereof.

FIG. 2A is schematic views of a display device. A pixel portion 201 is located on a central portion of the substrate 200. A source signal line driver circuit 202 for controlling source signal lines and gate signal line driver circuits 207 for controlling gate signal lines are located in the vicinity of the pixel portion 201. In FIG. 2A, the gate signal line driver circuits 207 are symmetrically located in both sides of the pixel portion 201. It may be located in only one side of the pixel portion 201.

Signals for operating the source signal line driver circuit 202 and the gate signal line driver circuits 207 which are inputted from an external circuit are inputted through FPCs 210. In this embodiment, the respective signals inputted through the FPCs 210 have small voltage amplitude. Thus, voltage amplitude conversion is conducted for the signals by a level shifter 206 and then they are inputted to the source signal line driver circuit 202 and the gate signal line driver circuits 207.

Figure 2B:
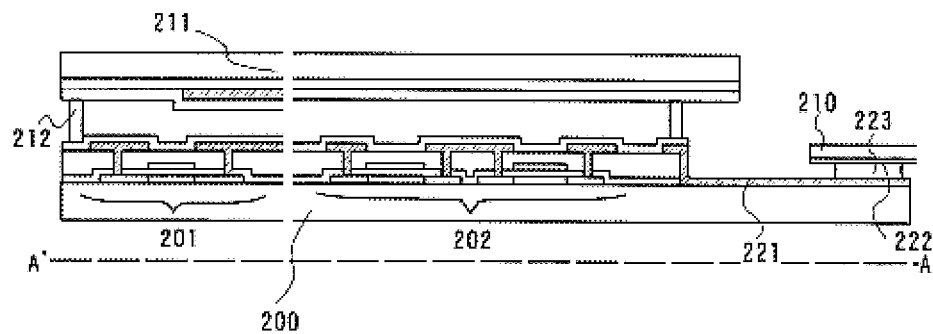

FIG. 2B is a cross sectional view taken along the broken line A—A' of FIG. 2A. The pixel portion 201, the source signal line driver circuit 202, and the gate signal line driver circuits (not shown) are formed on the substrate 200. The substrate 200 and a counter substrate 211 are bonded to each other through a seal agent 212 and a liquid crystal is injected into a gap between the substrates. After the injection of the liquid crystal, an inlet is sealed by a sealing agent 213 as shown in FIG. 2A.

Figure 2C:
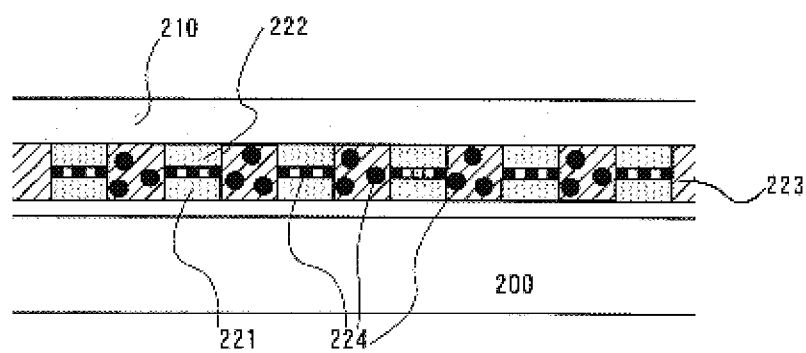

A lead wiring 221 is electrically connected with an FPC side wiring 222 of the FPC 210 through an anisotropic conductive film 223. As shown in FIG. 2C, the anisotropic conductive film 223 includes conductive fillers 224. Thus, when the substrate 200 and the FPC 210 are bonded to each other by thermocompression bonding, the lead wiring 221 on the substrate 200 is electrically connected with the FPC side wiring 222 of the FPC 210 through the conductive fillers 224.

Figure 3:
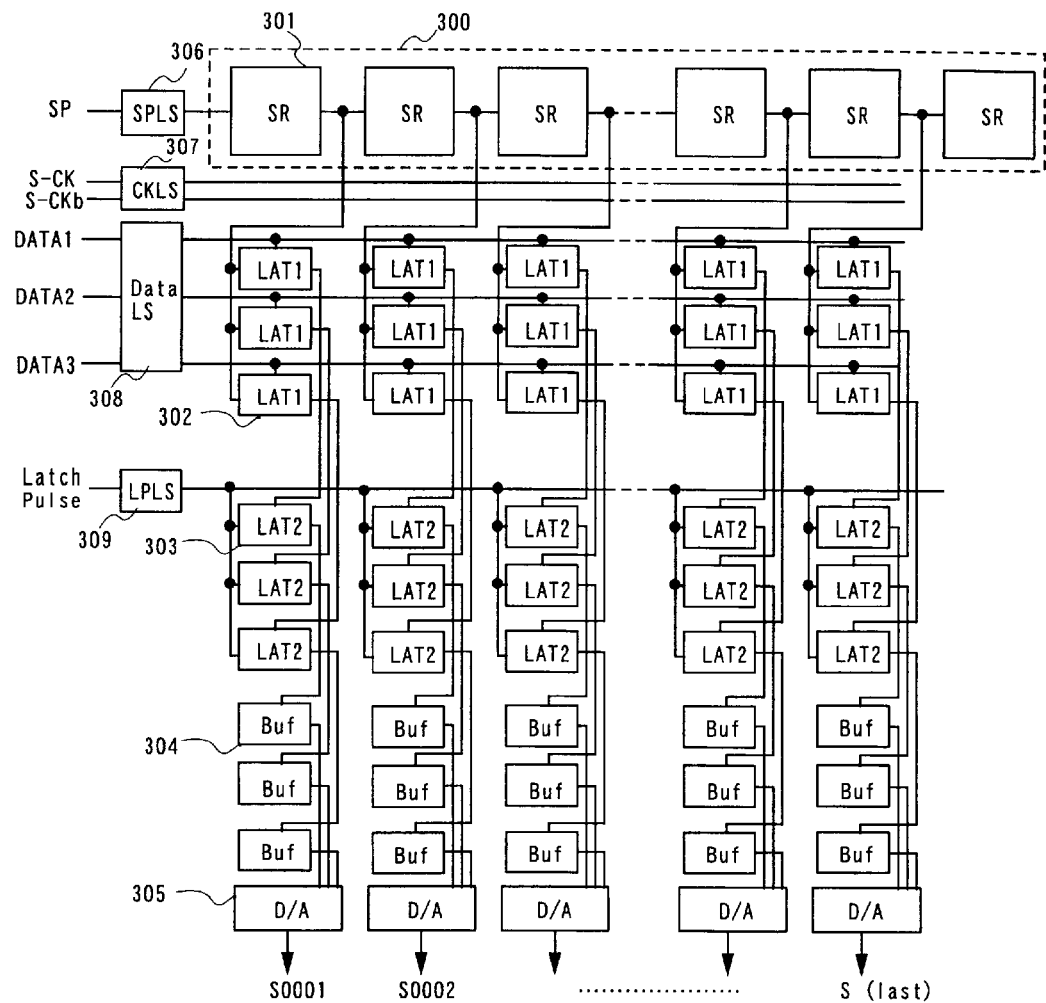
FIG. 3 is a structural diagram of a source signal line driving circuit composed of a latch circuit of the present invention.

FIG. 3 shows a configuration of the source signal line driver circuit 202. A shift register indicated by a dotted frame 300 is composed of plural stages of pulse output circuits 301 for outputting sampling pulses in accordance with a clock signal and a start pulse. The circuits shown in FIG. 11 in Embodiment 1 are used for first latch circuits 302, second latch circuits 303, and buffer circuits 304. 3 bits of digital video signals (Data1 to Data3) are inputted to the source signal line driver circuit shown in FIG. 3. Thus, the first latch circuits 302, the second latch circuits 303, and the buffer circuits 304 each are located in groups of three in parallel, and simultaneously holding of the 3 bits of digital video signals is performed in accordance with a sampling pulse outputted from one pulse output circuit.

A D/A converting circuits 305 are not particularly shown in this specification. Any conventionally used type such as a resistance division type or a capacitor type may be used.

The 3 bits of digital video signals are converted into $2^3$ gray scales of analog video signals by the D/A converting circuits 305 and supplied to the respective source signal lines (S0001 to S(final)).

Note that signals inputted from an external circuit are outputted from an integrated circuit (IC). Thus, with reducing a voltage in recent years, each of the signals is a signal having low voltage amplitude of about 3 V to 5 V in many cases. Therefore, the signals are converted into signals each having high voltage amplitude by level shifters 306 to 309 and then inputted to the driver circuit.

Figure 4:
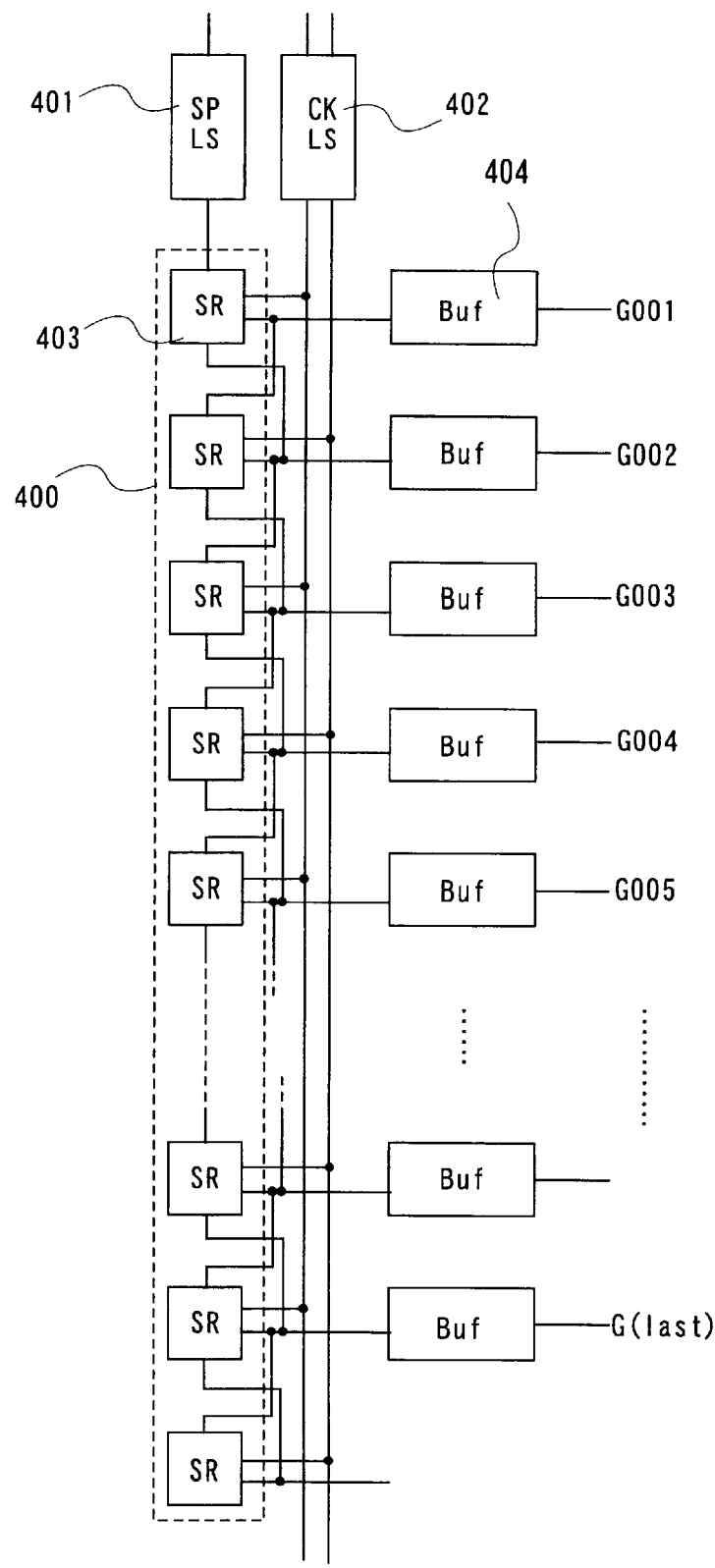
FIG. 4 is a structural diagram of a gate signal line driving circuit.
Figure 5A:
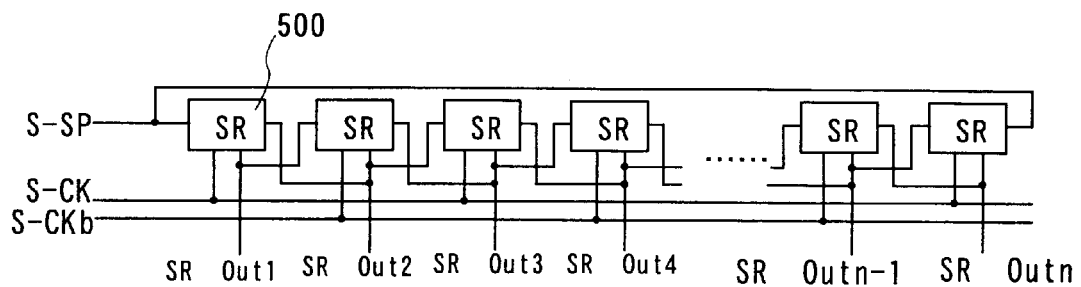
FIGS. 5A and 5B are diagrams showing a shift register composed of TFTs that have the same polarity.
Figure 5B:
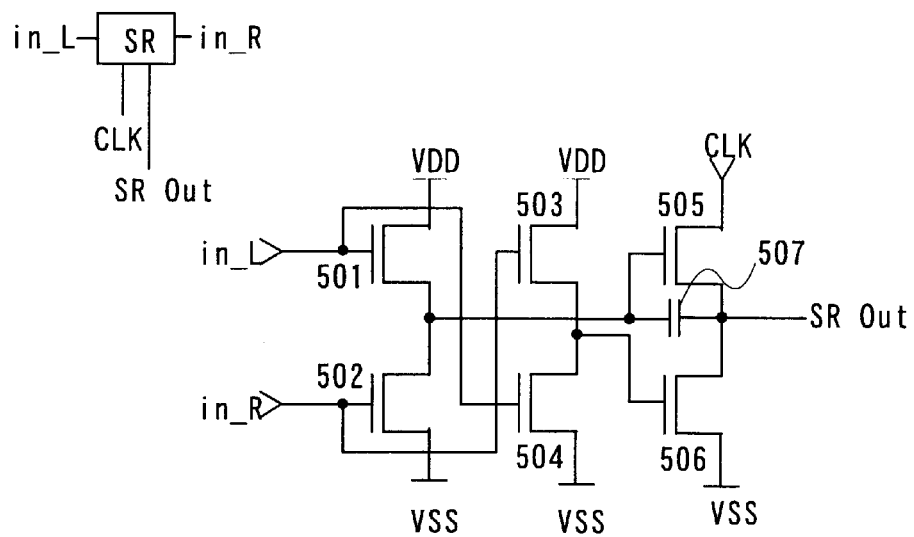
Figure 6A:
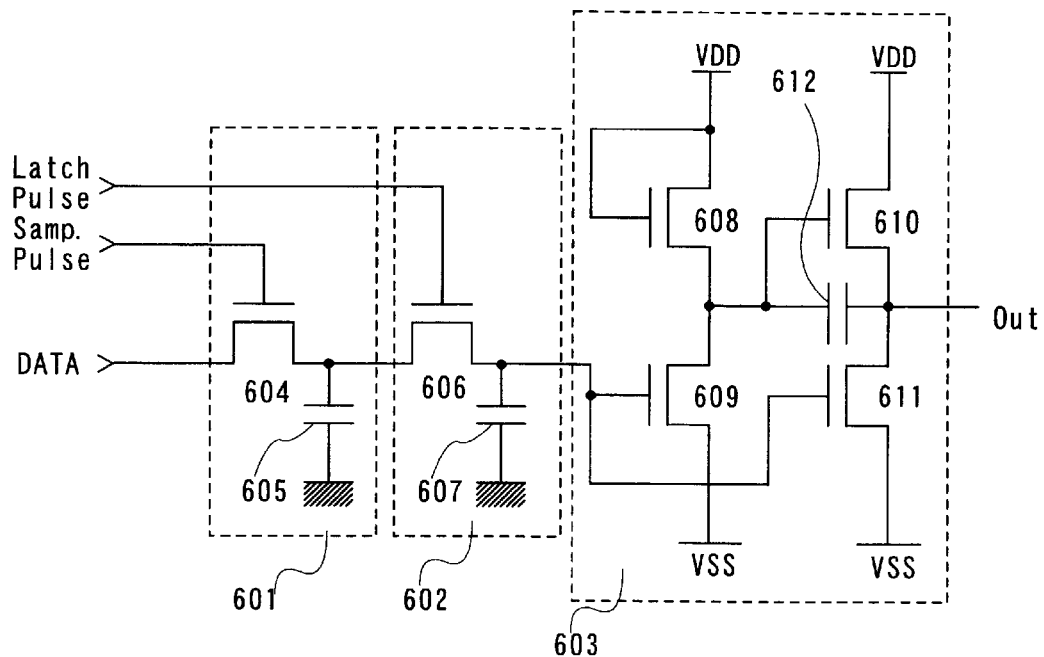
FIGS. 6A and 6B are diagrams showing a latch circuit and buffer which are composed of TFTs having the same polarity.
Figure 6B:
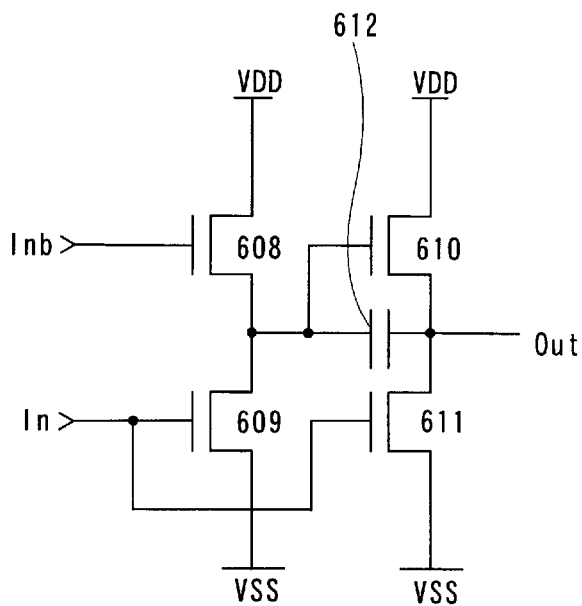

FIG. 4 shows a configuration of the gate signal line driver circuit 207. A shift register indicated by a dotted frame 400 is composed of plural stages of pulse output circuits 403 for outputting a gate signal line selection pulse in accordance with a clock signal and a start pulse. When a load of the gate signal line is large, that is, when the gate signal line selection pulse outputted from the shift register does not has drive power capable of directly switching a potential of the gate signal line to an H level or an L level, it is necessary to use buffers 404.

Note that signals inputted from an external circuit are outputted from an integrated circuit (IC). Thus, with reducing a voltage in recent years, each of the signals is a signal having low voltage amplitude of about 3 V to 5 V in many cases. Therefore, the signals are converted into signals each having high voltage amplitude by level shifters 401 and 402 and then inputted to the driver circuit.

This embodiment may be implemented by combining freely with Embodiment Mode, and Embodiments 1 through 7.

Embodiment 10

The steps in Embodiment 8 are described as the example of the case where the pixels and the peripheral driver circuits are composed of the n-channel TFTs. However, according to the present invention, an embodiment using a p-channel TFT is also possible.

In the case of the n-channel TFT, in order to suppress hot carrier deterioration and the like, an impurity region which is called an overlap region is provided in a region overlapped with the gate electrode. In contact to this, in the case of the p-channel TFT, the influence of hot carrier deterioration is small. Thus, it is unnecessary to provide the overlap region particularly. In this case, the TFT can be manufactured by more simple steps.

Figure 9A:
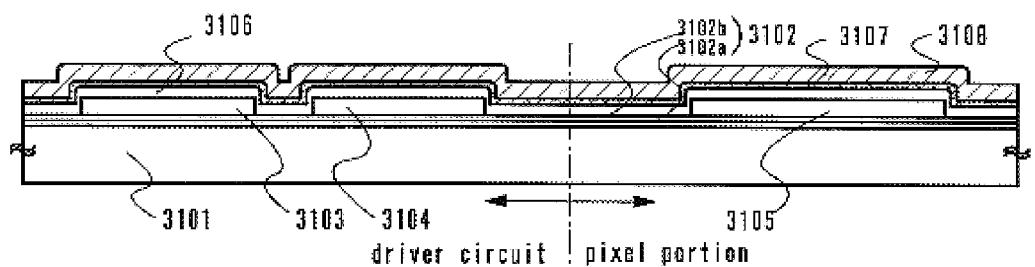
FIGS. 9A to 9D are diagrams showing an example of a display device manufacturing process.

As shown in FIG. 9A, based on Embodiment 8, a base film 3102 is formed on an insulating substrate 3101 made of glass or the like. Next, island-like semiconductor layers 3103 to 3105, a gate insulating film 3106, and conductive layers 3107 and 3108 are formed. Here, the conductive layers 3107 and 3108 are formed to be a laminate structure. They may be formed to be a single layer particularly.

Figure 9B:
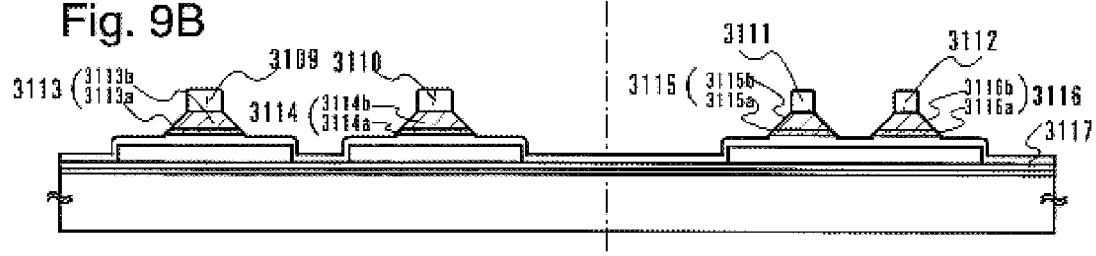

Then, as shown in FIG. 9B, a masks 3109 to 3112 made of resist is formed and first etching processing is performed. In Embodiment 8, anisotropic etching is conducted utilizing a selection ratio between materials for the conductive layers formed to be a laminate structure. Here, it is unnecessary to provide the overlap region particularly. Thus, general etching is preferably conducted. In this time, regions 3117 which are thinned by about 20 nm to 50 nm are formed to the gate insulating film 3106 by etching.

Figure 9C:
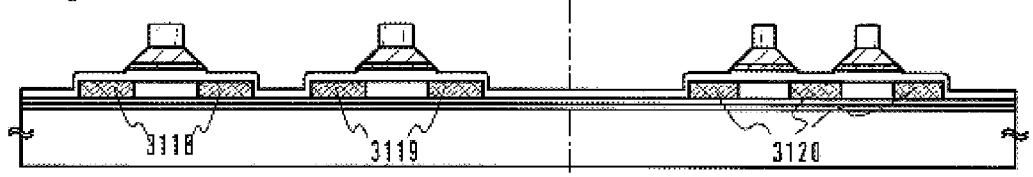

Subsequently as shown in FIG. 9C, the first doping processing for adding an impurity element imparting p-type to the island-like semiconductor layers is performed. Thus, impurity regions are formed in a self-alignment manner using conductive layers 3113 to 3116 as masks to the impurity element. The impurity element for providing the p-type is typically boron (B) or the like. Here, the impurity regions are formed by an ion doping method using diborane ($B_2H_6$) such that a concentration of the impurity in the semiconductor layers is $2\times10^{20}$ atoms/cm$^3$ to $2\times10^{21}$ atoms/cm$^3$.

Figure 9D:
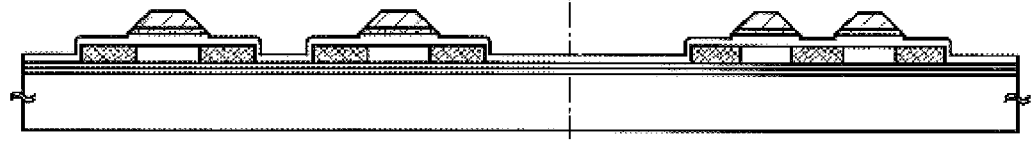
Figure 10:
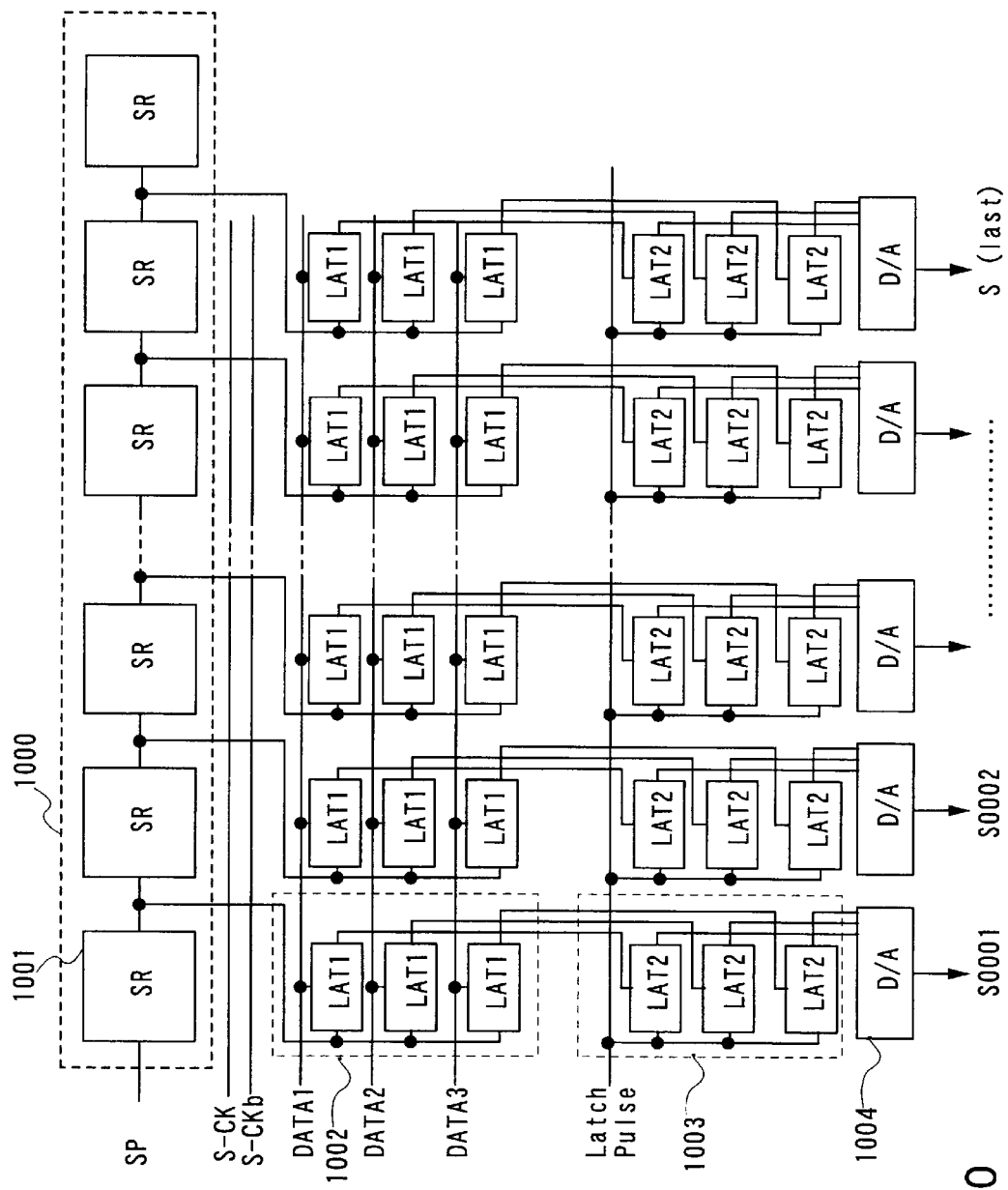
FIG. 10 is a diagram showing the structure of a source signal line driving circuit.

The mask made of the resist is removed to obtain a state shown in FIG. 9D. Hereinafter, the TFTs are manufactured based on the steps conducted after the step shown in FIG. 8B in Embodiment 8.

This embodiment can be implemented by freely combining with Embodiment Mode, Embodiments 1 through 7, and Embodiment 9.

Embodiment 11

This embodiment shows an example of a method for crystallizing a semiconductor film for forming a semiconductor active layer of a TFT included in a semiconductor apparatus of the present invention.

As a base film, a silicon oxynitride film (composition ratio: Si=32%, O=59%, N=7%, and H=2%) in 400 nm thick is formed on a glass substrate by plasma CVD method. Then, as a semiconductor film, 150 nm of amorphous silicon film is formed on the base film by plasma CVD method. Then, thermal processing at 500° C. is performed thereon for three hours so that hydrogen contained in the semiconductor film is discharged. After that, the semiconductor film is crystallized by laser annealing method.

As the laser used for laser annealing method, continuous oscillating YVO$_4$ laser is used. For the laser annealing method, the second harmonic (wavelength 532 nm) of the YVO$_4$ laser is used as laser light. As the beam in a predetermined form, laser light is irradiated to the semiconductor film formed on the substrate surface by using an optical system.

The form of the beam irradiated to the substrate can be varied depending on the type of laser or optical system. In this way, the aspect ratio and/or distribution of energy density of the beam irradiated onto the substrate can be changed. For example, various forms of the beam irradiated onto the substrate are possible such as linear, rectangular and elliptical forms. In this embodiment, the second harmonic of the YVO$_4$ laser in an elliptical form of 200 μm×50 μm is irradiated to the semiconductor film by using an optical system.

Figure 15:
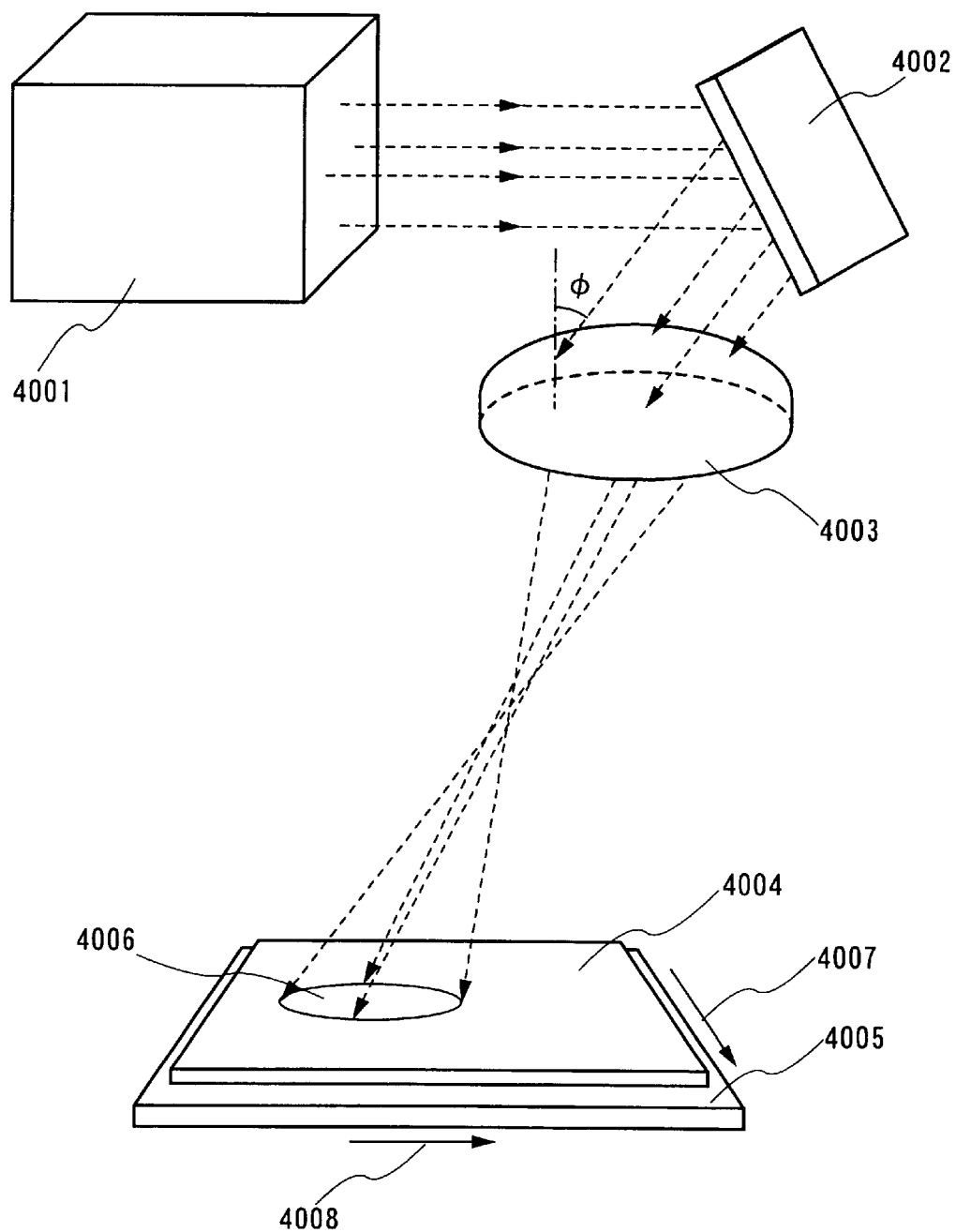
FIG. 15 is a schematic diagram of an optical system used in Embodiments 8 through 13.

FIG. 15 shows a model diagram of an optical system, which is used when laser light is irradiated to a semiconductor film on a substrate surface.

Laser light (the second harmonic of YVO$_4$ laser) emitted from a laser 4001 enters a convex lens 4003 through a mirror 4002. The laser light enters to the convex lens 4003 diagonally. As a result, a focus position is shifted due to the aberration such as astigmatism. Thus, elliptical beam 4006 can be formed in an irradiated surface or near there.

Then, the elliptical beam 4006 formed in this way is irradiated, and a glass substrate 4005 is moved in a direction indicated by a reference numeral 4007 or 4008. Then, in the semiconductor film 4004 formed on the glass substrate 4005, the elliptical beam 4006 is irradiated by relatively being moved.

The relative scanning direction of the elliptical beam 4006 is perpendicular to the major axis of the elliptical beam 4006.

In this embodiment, the elliptical beam of 200 μm×50 μm is formed having incident angle φ of about 20° of laser light with respect to the convex lens 4003. The elliptical beam is irradiated on the glass substrate 4005 by being moved at the speed of 50 cm/s. Thus, the semiconductor film is crystallized.

The seco etching is performed on the crystalline semiconductor film obtained in this way. FIG. 16 shows the result of the observation of the surface by using an SEM with 10,000 magnifications. The seco solution used for the seco etching is manufactured by adding K$_2$Cr$_2$O$_7$ as additive to HF:H$_2$O=2:1. One shown in FIG. 16 is obtained by relatively scanning laser light in a direction indicated by an arrow shown in FIG. 16. Large crystal grains are formed in parallel with the scanning direction of the laser light. In other words, the crystal is raised so as to extend in the scanning direction of the laser light.

In this way, large crystal grains are formed on the crystallized semiconductor film by using the method according to this embodiment. Therefore, when the semiconductor film is used as a semiconductor active layer to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, when the TFT is positioned such that the direction that the carrier moves can be the same as the direction that the formed crystal grains extend, the number of times that the carriers cross the crystal grain boundary can be extremely reduced. Therefore, a variation in ON current value (value of drain current flowing when the TFT is ON), an OFF current value (value of drain current flowing when the TFT is OFF), a threshold voltage, an S-value and field effect mobility can be reduced. As a result, the electric characteristic can be improved significantly.

In order to irradiate the elliptical beam 4006 in a wide range of the semiconductor film, the elliptical beam 4006 is scanned in a direction perpendicular to the major axis to irradiate to the semiconductor film multiple times. Here, the position of the elliptical beam 4006 is shifted in the direction parallel to the major axis for every single scan. The scanning direction becomes opposite between serial scans. In the serial two scans, one will be called outward scan and the other will be called inward scan hereinafter.

The amount of shifting the position of the elliptical beam 4006 to the direction parallel to the major axis for every single scan is expressed by pitch d. A reference numeral D1 indicates, in the outward scan, the length of the elliptical beam 4006 in the direction perpendicular to the scanning direction of the elliptical beam 4006 in an area having large crystal grains as shown in FIG. 16. A reference numeral D2 indicates, in the inward scan, the length of the elliptical beam 4006 in the direction perpendicular to the scanning direction of the elliptical beam 4006 in an area having large crystal grains as shown in FIG. 16. In this case, an average value of D1 and D2 is D.

Here, an overlap ratio R$_{O.L}$ [%] is defined by Equation 1.

$$R_{O.L}=(1-d/D)\times 100 \quad [EQ1]$$

In this embodiment, the overlap ratio R$_{O.L}$ is 0%.

The semiconductor film formed in this embodiment may be applied to the manufacturing step of TFT described in Embodiments 8 and 10, and the manufacturing step of TFT to be described in Embodiments 17 and 18.

Embodiment 12

This embodiment is different from the Embodiment 11 in the method for crystallizing a semiconductor film when a semiconductor active layer of a TFT included in the semiconductor device of the present invention is manufactured.

The steps up to forming an amorphous silicon film as a semiconductor film are the same as those of the Embodiment 11. After that, the method disclosed in Japanese Patent Application Laid-open No. Hei 7-183540 is used. Nickel acetate solution (5 ppm in weight conversion concentration and 10 ml in volume) is coated on the semiconductor film by spin coating method. Then, thermal processing is performed thereon in a nitrogen atmosphere at 500° C. for one hour and in a nitrogen atmosphere at 550° C. for twelve hours. Then, the crystallinity of the semiconductor film is improved by laser annealing method.

As the laser used for laser annealing method, continuous oscillating YVO$_4$ laser is used. For the laser annealing method, the second harmonic (wavelength 532 nm) of the YVO$_4$ laser is used as laser light. The elliptical beam of 200 μm×50 μm is formed having incident angle φ of about 20° of laser light with respect to the convex lens 4003 in the optical system shown in FIG. 15. The elliptical beam is moved and irradiated to the glass substrate 4005 at the speed of 50 cm/s. Thus, the crystallinity of the semiconductor film is improved.

The relative scanning direction of the elliptical beam 4006 is perpendicular to the major axis of the elliptical beam 4006.

Figure 17:
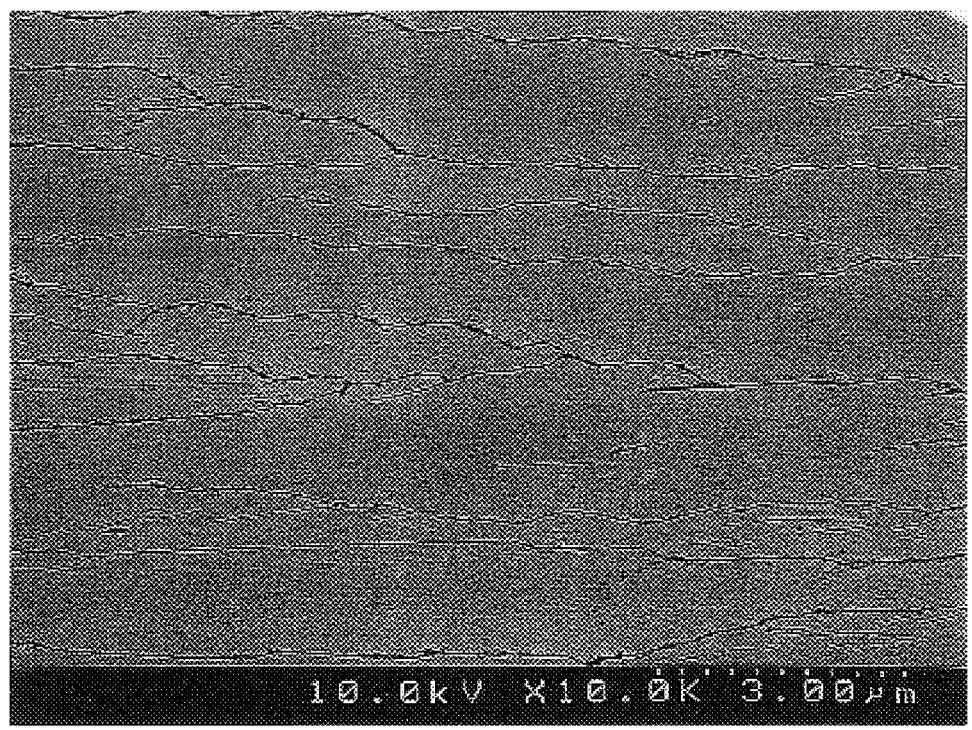
FIG. 17 is a diagram showing an SEM image obtained as a result of Embodiment 9.

The seco etching is performed on the crystalline semiconductor film obtained in this way. FIG. 17 shows the result of the observation of the surface by using an SEM with 10,000 magnifications. One shown in FIG. 17 is obtained by relatively scanning laser light in a direction indicated by an arrow shown in FIG. 17. Large crystal grains extend in the scanning direction.

In this way, large crystal grains are formed on the crystallized semiconductor film according to this embodiment. Therefore, when the semiconductor film is used to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, the formed crystal grains are aligned in one direction. Thus, when the TFT is positioned such that the direction that the carriers move can be the same as the direction that the formed crystal grains extend, the number of times that the carriers cross the crystal grain boundary can be extremely reduced. Therefore, a variation in ON current value, an OFF current value, a threshold voltage, an S-value and field effect mobility can be reduced. As a result, the electric characteristic can be improved significantly.

In order to irradiate the elliptical beam 4006 in a wide range of the semiconductor film, the elliptical beam 4006 is scanned in a direction perpendicular to the major axis to irradiate to the semiconductor film multiple times (this operation may be called scan). Here, the position of the elliptical beam 4006 is shifted in the direction parallel to the major axis for every single scan. The scanning direction becomes opposite between continuous scans. In the continuous two scans, one will be called outward scan and the other will be called inward scan hereinafter.

The amount of shifting the position of the elliptical beam 4006 to the direction parallel to the major axis for every single scan is expressed by pitch d. A reference numeral D1 indicates, in the outward scan, the length of the elliptical beam 4006 in the direction perpendicular to the scanning direction of the elliptical beam 4006 in an area having large crystal grains as shown in FIG. 17. A reference numeral D2 indicates, in the inward scan, the length of the elliptical beam 4006 in the direction perpendicular to the scanning direction of the elliptical beam 4006 in an area having large crystal grains as shown in FIG. 17. In this case, an average value of D1 and D2 is D.

Here, an overlap ratio $R_{O.L}$ [%] is defined like Equation 1. In this embodiment, the overlap ratio $R_{O.L}$ is 0%.

Figure 18:
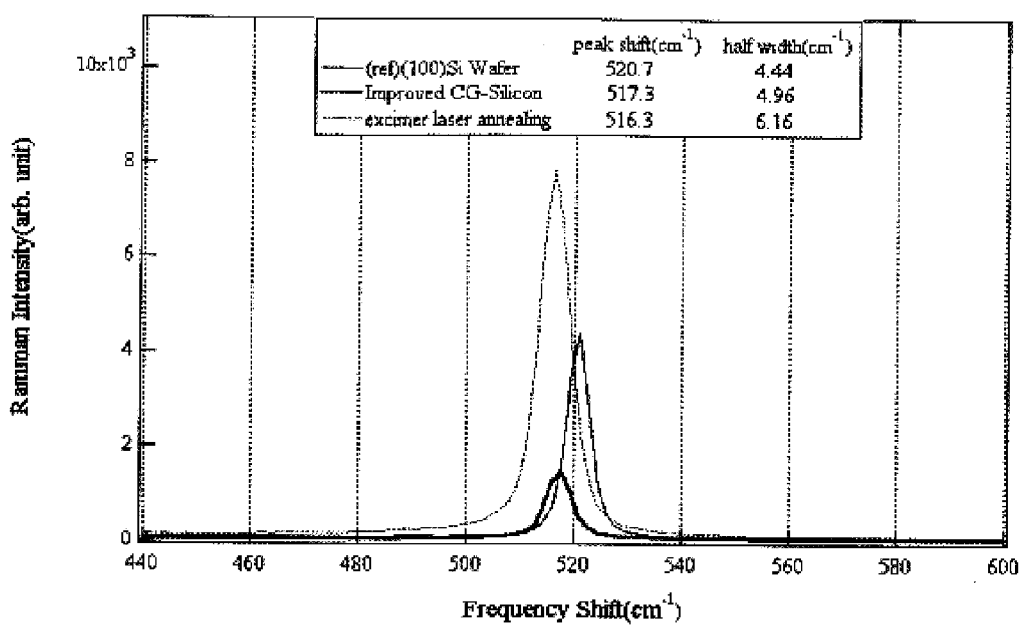
FIG. 18 is a diagram showing results of Raman scattering spectroscopy performed on a semiconductor film that is obtained through Embodiment 9.

In FIG. 18, a thick line indicates a result of Raman spectroscopy performed on the crystalline semiconductor film (represented by Improved CG-Silicon in FIG. 18) obtained by using the above-described crystallization method. Here, for comparison, a thin line indicates a result of Raman spectroscopy performed on the single crystal silicon (represented by ref. (100) Si Wafer in FIG. 18). In FIG. 18, a dotted line indicates a result of Raman spectroscopy performed on a semiconductor film (represented by excimer laser annealing in FIG. 18). In order to obtain the semiconductor film, an amorphous silicon film is formed and hydrogen contained in the semiconductor film is discharged through thermal processing. Then, the semiconductor film is crystallized by using excimer laser with pulse oscillation.

The Raman shift of the semiconductor film obtained by using the method of this embodiment has the peak at 517.3 cm$^{-1}$. The half value breadth is 4.96 cm$^{-1}$. On the other hand, the Raman shift of the single crystal silicon has the peak at 520.7 cm$^{-1}$. The half value breadth is 4.44 cm$^{-1}$. The Raman shift of the semiconductor film crystallized by using the excimer laser with the pulse oscillation has the peak at 516.3 cm$^{-1}$. The half value breadth is 6.16 cm$^{-1}$.

From the results in FIG. 18, the crystallinity of the semiconductor film obtained by using the crystallization method described in this embodiment is closer to that of the single crystal silicon than the crystallinity of the semiconductor film crystallized by using the excimer laser with pulse oscillation.

The semiconductor film formed in this embodiment may be applied to the manufacturing steps of TFT described in Embodiments 8 and 10.

Embodiment 13

In this embodiment, a case where a semiconductor film crystallized by using the method described in the Embodiment 11 is used to manufacture a TFT will be described with reference to FIGS. 15, 19A to 19G and 21A and 21B.

A glass substrate is used as a substrate 4120 in this embodiment. As a base film 4121, 50 nm of silicon oxynitride film (composition ratio Si=32%, O=27%, N=24%, and H=17%) and 100 nm of silicon oxynitride film (composition ratio Si=32%, O=59%, N=7%, and H=2%) are stacked on the glass substrate by plasma CVD method. Next, as a semiconductor film 4122, 150 nm of amorphous silicon film is formed on the base film 4121 by plasma CVD method. Then, thermal processing is performed thereon at 500° C. for three hours to discharge hydrogen contained in the semiconductor film (FIG. 19A).

After that, the second harmonic (wavelength 532 nm, 5.5 W) of the continuous oscillating YVO$_4$ laser is used as the laser light to form an elliptical beam of 200 μm×50 μm having incident angle φ of about 20° of laser light with respect to the convex lens 4003 in the optical system shown in FIG. 15. The elliptical beam is irradiated on the semiconductor film 4122 by relatively being scanned at the speed of 50 cm/s (FIG. 19B).

Then, first doping processing is performed thereon. This is channel doping for controlling the threshold value. B$_2$H$_6$ is used as material gas having a gas flow amount of 30 sccm, a current density of 0.05 μA, an accelerating voltage of 60 keV, and a dosage of 1×10$^{14}$ atoms/cm$^2$ (FIG. 19C).

Next, after etching the semiconductor film 4124 into a desired form by patterning, a silicon oxynitride film in 115 nm thick is formed by plasma CVD method as a gate insulating film 4127 covering the etched semiconductor film. Then, a TaN film 4128 in 30 nm thick and a W film 4129 in 370 nm thick are stacked on the gate insulating film 4127 as a conductive film (FIG. 19D).

A mask (not shown) made of resist is formed thereon by using photolithography method, and the W film, the TaN film and the gate insulating film are etched.

Then, the mask made of resist is removed. The second doping processing is performed thereon and an impurity element imparting the n-type to the semiconductor film is introduced. In this case, the conductive layers 4130 and 4131 are masks for the impurity element imparting the n-type, and an impurity region 4134 is formed in a self-aligned manner. In this embodiment, the second doping processing is performed under two conditions because the semiconductor film is thick as much as 150 nm. In this embodiment, phosphine (PH$_3$) is used as material gas. The dosage of 2×10$^{13}$ atoms/cm$^2$ and the accelerating voltage of 90 keV are used, and then the dosage of 5×10$^{14}$ atoms/cm$^2$ and the accelerating voltage of 10 keV are used for the processing (FIG. 19E).

An impurity region 4134 is formed to the semiconductor layer.

Next, silicon oxynitride film (composition ratio Si=32.8%, O=63.7%, and N=3.5%) in 50 nm thick is formed as a first interlayer insulating film 4137 by plasma CVD method.

Next, thermal processing is performed thereon to recover crystallinity of the semiconductor layers and to activate the impurity elements added to the semiconductor layers, respectively. Then, thermal processing by thermal annealing method using an anneal furnace is performed at 550° C. for four hours in a nitrogen atmosphere (FIG. 19F).

Next, a second interlayer insulating film 4138 of an inorganic or organic insulating material is formed on the first interlayer insulating film 4137. In this embodiment, after forming a silicon nitride film in 50 nm thick by CVD method, a silicon oxide film in 400 nm thick is formed.

After the thermal processing, hydrogenation processing can be performed. In this embodiment, the thermal processing is performed at 410° C. for one hour in a nitrogen atmosphere by using an anneal furnace.

Etching treatment is performed in order to form contact holes after two interlayer insulating films are formed. Contact holes are formed to reach the n-type impurity region 4137, the source single wiring (not shown), the gate single wiring (not shown), the current supply line (not shown), and the gate electrode 4130 (not shown) using dry etching and wet etching.

Next, a wiring 4139 is formed for connecting to the impurity regions electrically. In this embodiment, the wiring 4139 is formed by patterning a laminate film of a Ti film in 50 nm thick, an Al—Si film in 500 nm thick and a Ti film in 50 nm thick. Naturally, the construction is not limited to the two-layer construction, but may be a single layer construction or a laminate construction having three or more layers. The material of the wiring is not limited to Al and Ti. For example, Al and/or Cu may be formed on a TaN film. Then, a laminate film having a Ti film may be patterned to form a wiring (FIG. 19G).

In this way, the n-channel TFT 4151 is formed having the channel length of 6 $\mu$m and the channel width of 4 $\mu$m.

Figure 21A:
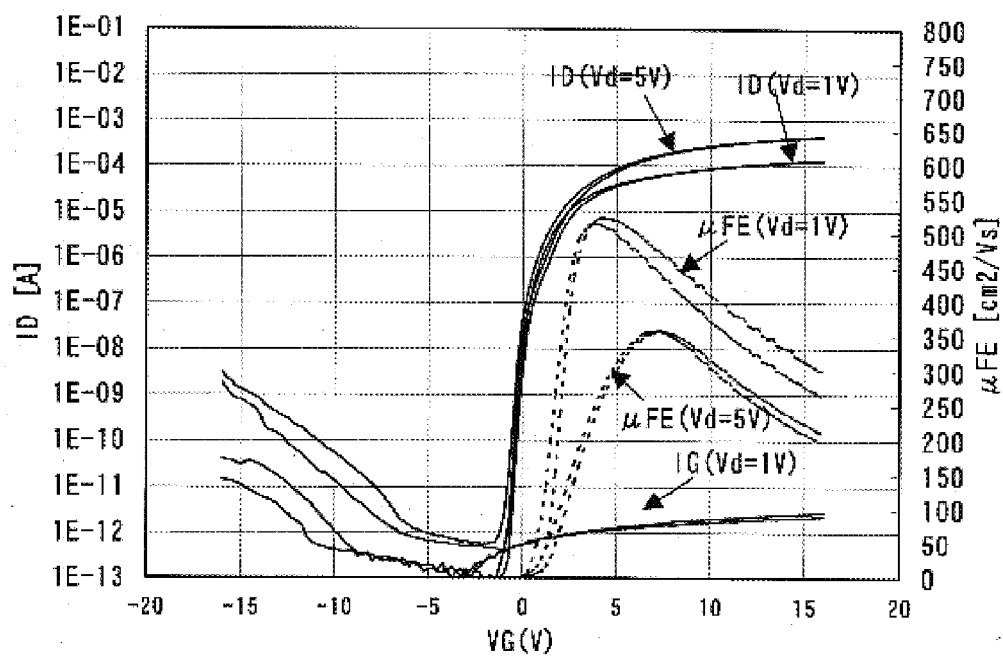
FIGS. 21A and 21B are diagrams showing electric characteristics of TFTs manufactured in Embodiments 10 and 11.
Figure 21B:
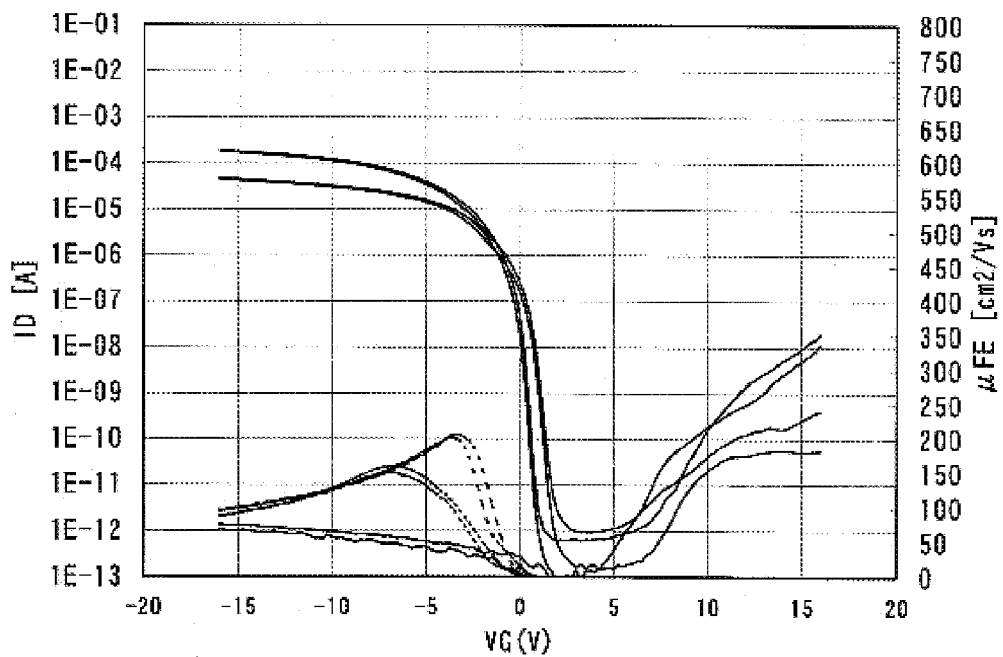

FIG. 21A shows results of measuring an electric characteristic of the n-channel TFT 4151. The electric characteristics are measured at two measurement points in a range of gate voltage Vg=−16 to 16 V and in the range of drain voltage Vd=1 V and 5 V. In FIGS. 21A and 21B, the drain current (ID) and the gate current (IG) are indicated by solid lines. The mobility ($\mu$FE) is indicated by a dotted line.

Because large crystal grains are formed on the semiconductor film crystallized according to the present invention, the number of crystal grain boundaries containing the channel forming region can be reduced when a TFT is manufactured by using the semiconductor film. Furthermore, because the formed crystal grains direct to the same direction, the number of times of crossing the crystal grain boundaries by carriers can be extremely reduced. Therefore, a TFT having the good electric characteristic can be obtained as shown in FIGS. 21A and 21B. Especially, the mobility is 524 cm$^2$/Vs in the n-channel TFT. When a display device is manufactured by using this type of TFT, the operational characteristic and the reliability can be improved also.

The semiconductor film formed in this embodiment may be applied to the manufacturing steps of TFT described in Embodiment Mode and Embodiments 1 through 7.

Embodiment 14

In this embodiment, a case where a semiconductor film crystallized by using the method described in Embodiment 11 is used to manufacture a TFT will be described with reference to FIGS. 15, 19A to 19F and 21A and 21B.

A glass substrate is used as a substrate 4220 in this embodiment. As a base film 4221, 50 nm of silicon oxynitride film (composition ratio Si=32%, O=27%, N=24%, and H=17%) and 100 nm of silicon oxynitride film (composition ratio Si=32%, O=59%, N=7%, and H=2%) are stacked on the glass substrate. Next, as a semiconductor film 4222, 150 nm of amorphous silicon film is formed on the base film 4221 by plasma CVD method. Then, thermal processing is performed thereon at 500° C. for three hours to discharge hydrogen contained in the semiconductor film (FIG. 20A).

After that, the second harmonic (wavelength 532 nm, 5.5 W) of the continuous oscillating YVO$_4$ laser is used as the laser light to form an elliptical beam 4006 of 200 $\mu$m×50 $\mu$m having incident angle $\phi$ of about 20° of laser light with respect to the convex lens 4003 in the optical system shown in FIG. 15. The elliptical beam 4006 is irradiated on the semiconductor film 4222 by relatively being scanned at the speed of 50 cm/s. (FIG. 20B) Then, first doping processing is performed thereon. This is channel doping for controlling the threshold value. B$_2$H$_6$ is used as material gas having a gas flow amount of 30 sccm, a current density of 0.05 $\mu$A, an accelerating voltage of 60 keV, and a dosage of 1×10$^{14}$ atoms/cm$^2$. (FIG. 20C)

Next, after etching the semiconductor film 4224 into a desired form by patterning, a silicon oxynitride film in 115 nm thick is formed by plasma CVD method as a gate insulating film 4227 covering the etched semiconductor film. Then, a TaN film 4228 in 30 nm thick and a W film 4229 in 370 nm thick are stacked on the gate insulating film 4227 as a conductive film (FIG. 20D).

A mask (not shown) made of resist is formed thereon by using photolithography method, and the W film, the TaN film and the gate insulating film are etched.

Then, the mask made of resist is removed. The second doping processing is performed thereon and an impurity region 4236 is formed in which an impurity element introduced to the semiconductor film to be an active layer of P-channel type TFT. In this case, the conductive layers 4230, 4231 are masks for the impurity element imparting the p-type, and an impurity region 4236 is formed in a self-aligned manner. In this example, the second doping processing is performed under two conditions because the semiconductor film is thick as much as 150 nm. In this embodiment, diborane (B$_2$H$_6$) is used as material gas. The dosage of 2×10$^{13}$ atoms/cm$^2$ and the accelerating voltage of 90 keV are used, and then the dosage of 2×10$^{14}$ atoms/cm$^2$ and the accelerating voltage of 10 keV are used for the processing (FIG. 20E).

Through these steps, the impurity region 4236 is formed on the semiconductor layer.

Next, silicon oxynitride film (composition ratio Si=32.8%, O=63.7%, and N=3.5%) in 50 nm thick is formed as a first interlayer insulating film 4237 by plasma CVD method.

Next, thermal processing is performed thereon to recover crystallinity of the semiconductor layers and to activate the impurity elements added to the semiconductor layers, respectively. Then, thermal processing by thermal annealing method using an anneal furnace is performed at 550° C. for four hours in a nitrogen atmosphere (FIG. 20F).

Next, a second interlayer insulating film 4238 of an inorganic or organic insulating material is formed on the first interlayer insulating film 4237. In this embodiment, after forming a silicon nitride film in 50 nm thick by CVD method, a silicon oxide film in 400 nm thick is formed.

After the thermal processing, hydrogenation processing can be performed. In this Embodiment, the thermal processing is performed at 410° C. for one hour in a nitrogen atmosphere by using an anneal furnace.

An etching treatment is performed in order to form contact holes after two interlayer insulating films. The contact holes are formed by dry etching or wet etching, and include contact holes reaching the impurity region 4237 having the n-type conductivity, the source signal lines (not shown), the gate signal lines (not shown), a power supply line (not shown), and gate electrode 4230 (not shown) respectively.

Next, a wiring 4239 is formed for connecting to the impurity regions electrically. In this example, the wiring 4239 is formed by patterning a laminate film of a Ti film in 50 nm thick, an Al—Si film in 500 nm thick and a Ti film in 50 nm thick. Naturally, the construction is not limited to the two-layer construction, but may be a single layer construction or a laminate construction having three or more layers. The material of the wiring is not limited to Al and Ti. For example, Al and/or Cu may be formed on a TaN film.

Then, a laminate film having a Ti film may be patterned to form a wiring (FIG. 20G).

In this way, the p-channel type TFT 4252 is formed having the channel length of 6 µm and the channel width of 4 µm.

FIG. 21B shows results of measuring an electric characteristic of the p-channel type TFT 4252. The electric characteristics are measured at two measurement points in a range of gate voltage Vg=−16 to 16 V and in the range of drain voltage Vd=1 V and 5 V. In FIGS. 21A and 21B, the drain current (ID) and the gate current (IG) are indicated by solid lines. The mobility (µFE) is indicated by a dotted line.

Because large crystal grains are formed on the semiconductor film crystallized according to the Embodiment 1, the number of crystal grain boundaries containing the channel forming region can be reduced when a TFT is manufactured by using the semiconductor film. Furthermore, because the formed crystal grains direct to the same direction, the number of times of crossing the crystal grain boundaries by carriers can be extremely reduced. Therefore, a TFT having the good electric characteristic can be obtained as shown in FIGS. 21A and 21B. Especially, the mobility is 524 cm²/Vs in the n-channel type TFT and 205 cm²/Vs in the p-channel type TFT. When a semiconductor apparatus is manufactured by using this type of TFT, the operational characteristic and the reliability can be improved also.

The semiconductor film formed in this embodiment may be applied to the manufacturing steps of TFT described in Embodiment Mode and Embodiments 1 through 7.

Embodiment 15

This embodiment describes a manufacturing example of n-channel TFT using the semiconductor film that is crystallized by a different method from that shown in Embodiment 13 with references FIGS. 15 and 22 to 25.

Figure 22A:
FIGS. 22A to 22C are diagrams showing an example of a laser treatment process for a semiconductor film.

The steps up to forming the amorphous silicon film as the semiconductor film are the same as Embodiment 13. The amorphous silicon film is formed in 150 nm thick (FIG. 22A).

Figure 22B:

After that, the method disclosed in the Japanese Patent Application Laid-Open No. Hei 7-183540 is used. Nickel acetate solution (5 ppm in weight conversion concentration and 10 ml in volume) is coated on the semiconductor film by spin coating method to form a metal containing layer 4341. Then, thermal processing is performed thereon in a nitrogen atmosphere at 500° C. for one hour and in a nitrogen atmosphere at 550° C. for twelve hours. Then, a semiconductor film 4342 is obtained (FIG. 22B).

Then, the crystallinity of the semiconductor film 4342 is improved by laser annealing method.

For the condition for the laser annealing method, the second harmonic (wavelength 532 nm, 5.5 W) of a continuous oscillating YVO₄ laser is used as laser light. The elliptical beam 4006 of 200 µm×50 µm is formed having incident angle φ of about 20° of laser light with respect to the convex lens 4003 in the optical system shown in FIG. 15. The elliptical beam 4006 is moved and irradiated to the substrate at the speed of 20 cm/s or 50 cm/s. Thus, the crystallinity of the semiconductor film 4342 is improved. As a result, a semiconductor film 4343 is obtained (FIG. 22C).

Figure 22C:
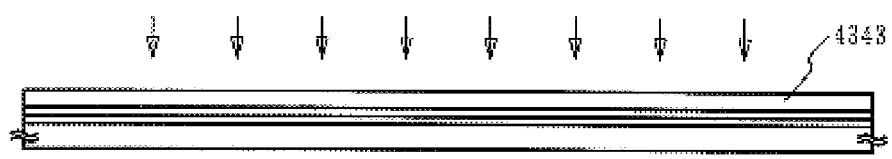

The steps after the crystallizing the semiconductor film in FIG. 22C are the same as the steps shown in FIGS. 19C to 19G shown in the Embodiment 13. In this way, the n-channel type TFT 4151 is formed having the channel length of 6 µm and the channel width of 4 µm. These electrical characteristics are measured.

FIGS. 23A to 25B show electric characteristics of the TFT manufactured through these steps.

Figure 23A:
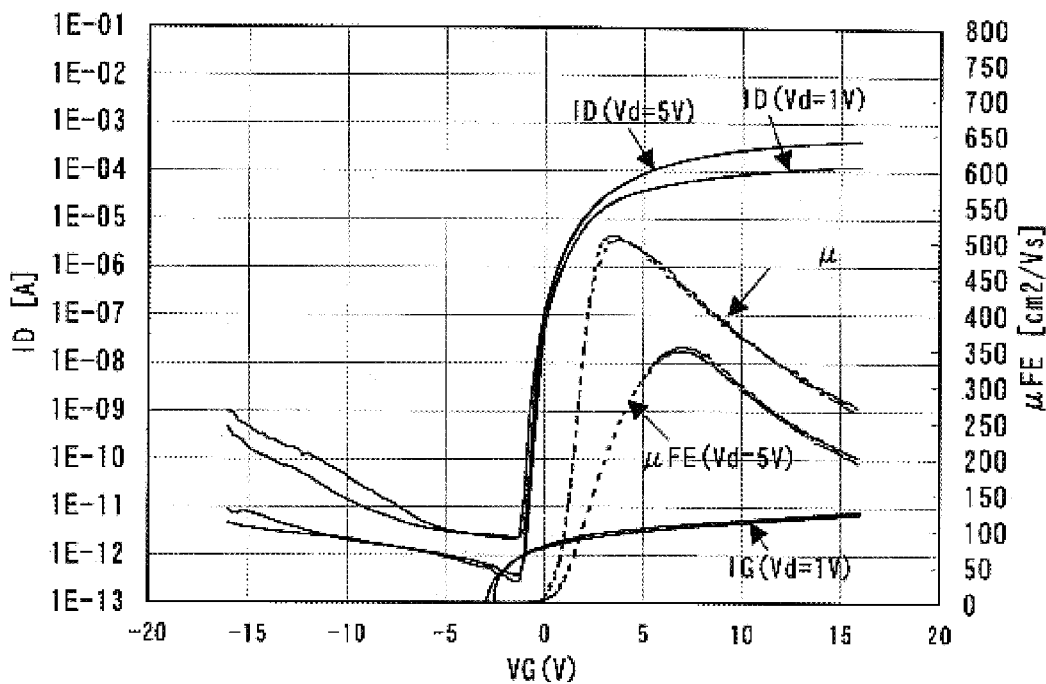
FIGS. 23A and 23B are diagrams showing electric characteristics of TFTs manufactured in Embodiments 12 and 13.
Figure 24A:
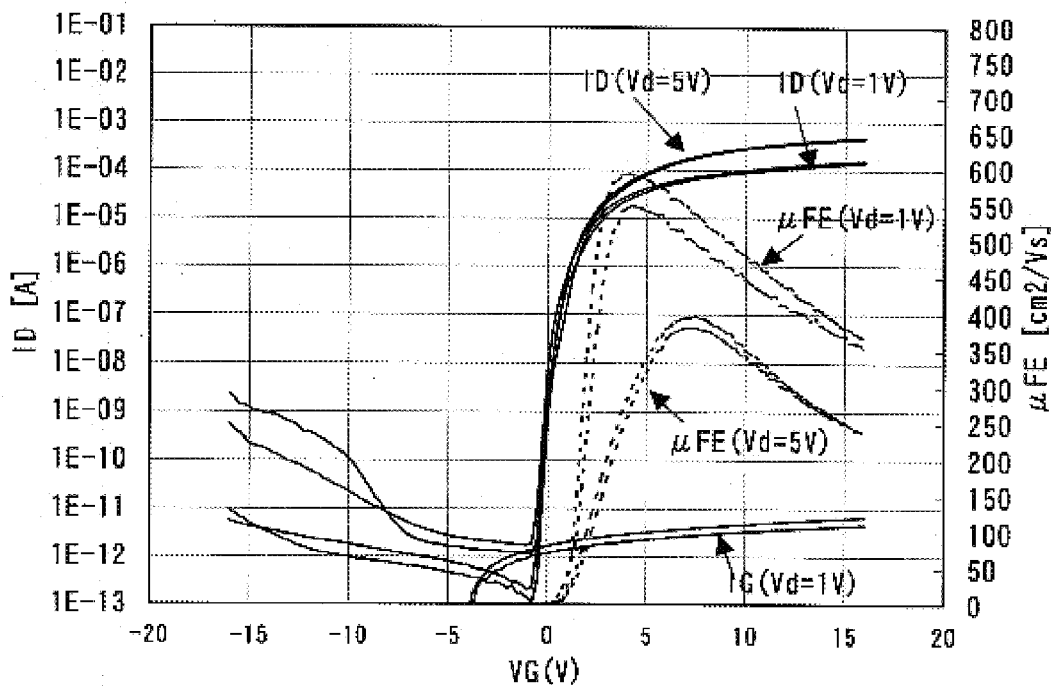
FIGS. 24A and 24B are diagrams showing electric characteristics of TFTs manufactured in Embodiments 12 and 13.

FIG. 23A show these electrical characteristics of n-channel TFT manufactured by moving the substrate at the speed of 20 cm/s in the laser annealing step in FIG. 22C. FIG. 24A show these electrical characteristics of a TFT manufactured by moving the substrate at the speed of 50 cm/s in the laser annealing step in FIG. 22C.

The electric characteristics are measured in a range of gate voltage Vg=−16 to 16 V and in the range of drain voltage Vd=1 V and 5 V. In FIGS. 23A to 24B, the drain current (ID) and the gate current (IG) are indicated by solid lines. The mobility (µFE) is indicated by a dotted line.

Because large crystal grains are formed on the semiconductor film crystallized according to this Embodiment, the number of crystal grain boundaries containing the channel forming region can be reduced when a TFT is manufactured by using the semiconductor film. Furthermore, the formed crystal grains direct to the same direction. In addition, the small number of grain boundaries is laid in a direction crossing the relative scanning direction of laser light. Therefore, the number of times of crossing the crystal grain boundaries by carriers can be extremely reduced.

Accordingly, a TFT having the good electric characteristic can be obtained as shown in FIGS. 23A to 24B. Especially, the mobility is 510 cm²/Vs in the n-channel type TFT and 200 cm²/Vs in the p-channel type TFT in FIGS. 23A and 23B. The mobility is 595 cm²/Vs in the n-channel type TFT in FIGS. 24A and 24B. When a semiconductor apparatus is manufactured by using this type of TFT, the operational characteristic and the reliability can be improved also.

Figure 25A:
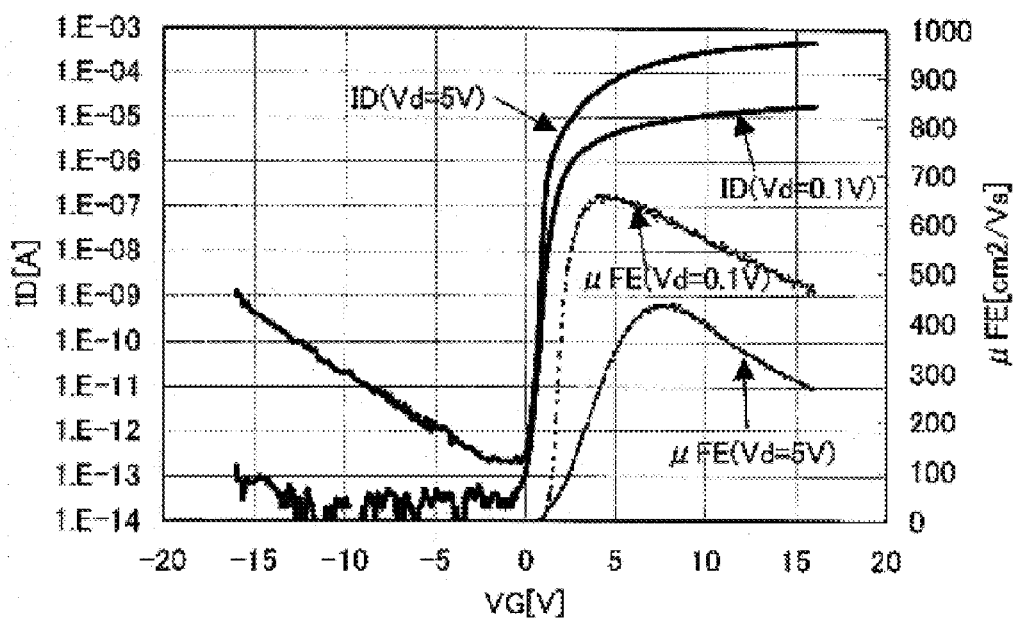
FIGS. 25A and 25B are diagrams showing electric characteristics of TFTs manufactured in Embodiments 12 and 13.

FIG. 25A shows these electrical characteristics of the n-channel TFT manufactured by moving the substrate at the speed of 50 cm/s in the laser annealing step in FIG. 22C.

The electric characteristics are measured in a range of gate voltage Vg=−16 to 16 V and in the range of drain voltage Vd=0.1 V and 5 V.

As shown in FIG. 25A, a TFT having the good electric characteristic can be obtained. Especially, the mobility is 657 cm²/Vs in the n-channel type TFT is excellent. When a semiconductor apparatus is manufactured by using this type of TFT, the operational characteristic and the reliability can be improved also.

The semiconductor film formed in this embodiment may be applied to the manufacturing steps of TFT described in Embodiment Mode and Embodiments 1 through 7.

Embodiment 16

This embodiment describes an example of crystallizing a semiconductor film by a method different from the one in Embodiment 14 and manufacturing a p-channel TFT from the semiconductor film. The description is given with reference to FIG. 15 and FIGS. 22A to 25B.

The steps up through formation of an amorphous silicon film as a semiconductor film are the same as those in Embodiment 14. The amorphous silicon film formed has a thickness of 150 nm (FIG. 22A).

Thereafter a method described in JP 07-183540 A is used to apply a nickel acetate aqueous solution (concentration by weight: 5 ppm, volume: 10 ml) to the surface of the semiconductor film by spin coating and obtain a metal-containing layer 4341. The semiconductor film is then subjected to heat treatment at 500° C. for an hour in a nitrogen atmosphere, and at 550° C. for twelve hours in a nitrogen atmosphere. Thus obtained is a semiconductor film 4342. (FIG. 22B)

Subsequently, the crystallinity of the semiconductor film 4342 is improved by laser annealing.

Conditions of the laser annealing include using the second harmonic (wavelength: 532 nm, 5.5 W) of a continuous wave YVO$_4$ laser as laser light. An incident angle φ at which the laser light enters a convex lens 4003 of an optical system shown in FIG. 15 is set to 20° to form an elliptical beam 4006 that measures 200 μm×50 μm. The substrate is irradiated with the laser light while moving the substrate at a rate of 20 cm/s or 50 cm/s to improve the crystallinity of the semiconductor film 4342. Thus obtained is a semiconductor film 4343. (FIG. 22C) The steps that follow crystallization of the semiconductor film in FIG. 22C are identical with the steps of FIG. 20C to FIG. 20G described in Embodiment 14. In this way, a p-channel TFT 4252 that measures 6 μm in channel length and 4 μm in channel width is formed. Electric characteristics of p-channel TFTs obtained in this manner are measured.

Electric characteristics of TFTs manufactured by the above process are shown in FIGS. 23A and 23B, FIGS. 24A and 24B, and FIGS. 25A and 25B.

Figure 23B:
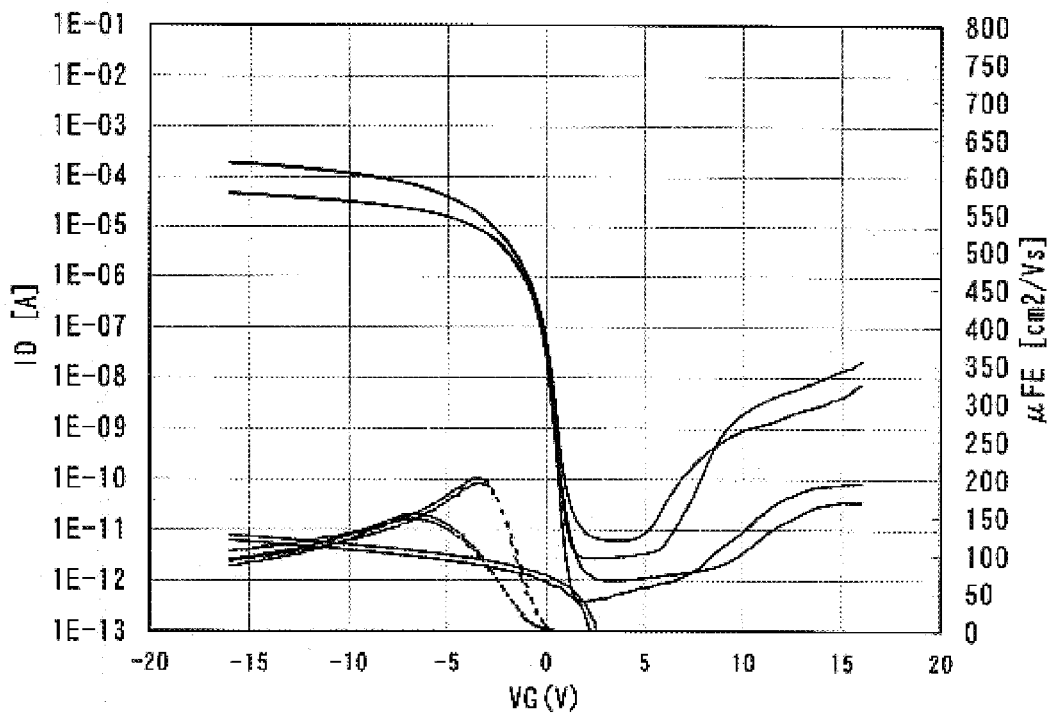
Figure 24B:
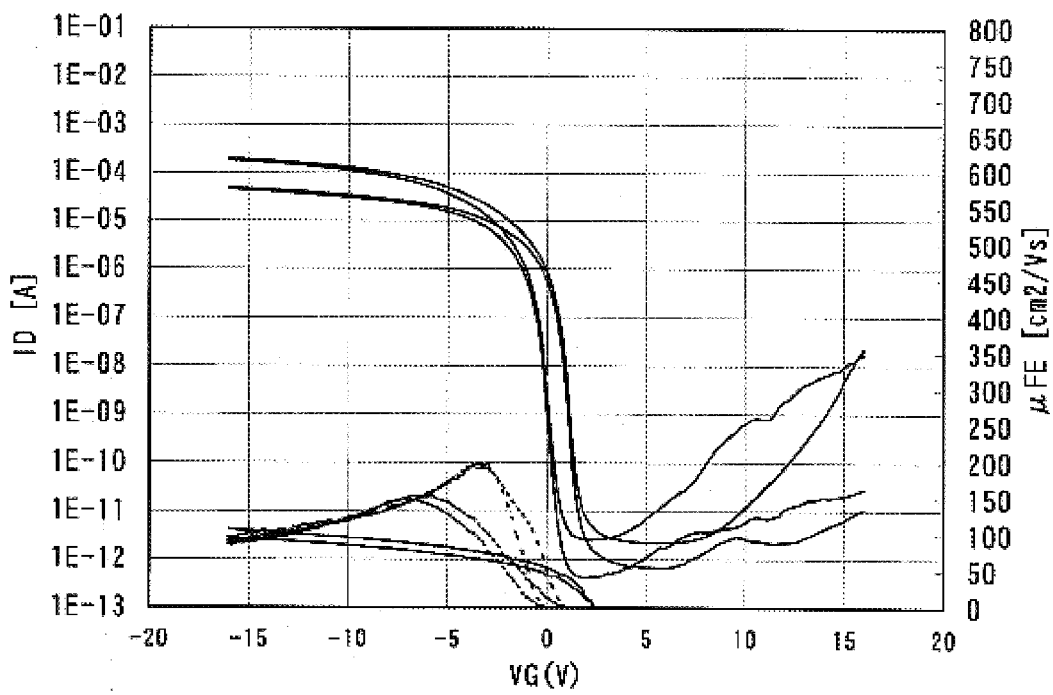

FIG. 23B shows the electric characteristic of a p-channel TFT manufactured by moving the substrate at a rate of 20 cm/s in the laser annealing step of FIG. 22C. FIG. 24B shows the electric characteristic of a p-channel TFT manufactured by moving the substrate at a rate of 50 cm/s in the laser annealing step of FIG. 22C.

In measuring their electric characteristics, a gate voltage Vg is −16 V to 16 V and a drain voltage Vd is 1 V and 5 V. In FIGS. 23A to 24B, the drain current (ID) and the gate current (IG) are indicated by solid lines and the mobility (μFE) is indicated by a dotted line.

Crystal grains of large grain sizes are formed in a semiconductor film crystallized as in this embodiment. Therefore, when this semiconductor film is used to manufacture a TFT, the number of grain boundaries included in the channel formation region of the TFT is reduced. Furthermore, the crystal grains formed are aligned in one direction and there are only a small number of grain boundaries formed in the direction that crosses the relative laser light scanning direction. This makes it possible for carriers to cross grain boundaries much less frequently.

Accordingly, TFTs having excellent electric characteristics as shown in FIGS. 23A to 24B can be obtained. In particular, the mobility is very excellent and it is 200 cm$^2$/Vs in the p-channel TFT of FIGS. 23A and 23B and 199 cm$^2$ Vs in the p-channel TFT of FIGS. 24A and 24B. When these TFTs are used to manufacture a semiconductor device, the operation characteristic and reliability of the semiconductor device can also be improved.

Figure 25B:
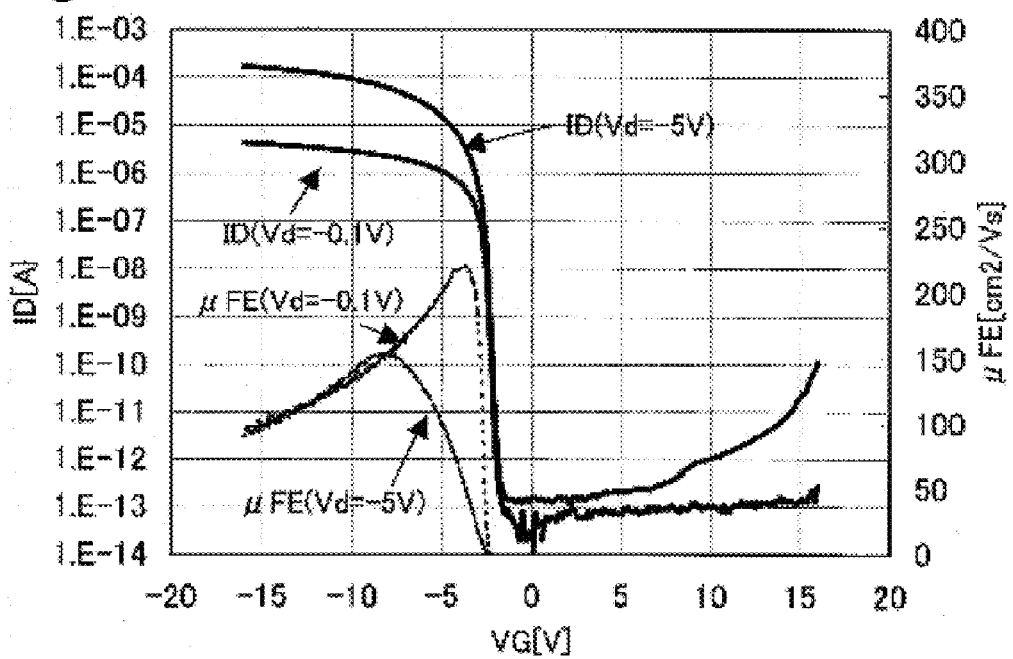

FIG. 25B shows the electric characteristic of a p-channel TFT manufactured by moving the substrate at a rate of 50 cm/s in the laser annealing step of FIG. 22C.

In measuring its electric characteristic, a gate voltage Vg is −16 V to 16 V and a drain voltage Vd is 0.1 V and 5 V.

The TFT obtained has an excellent electric characteristic as shown in FIG. 25B. In particular, the mobility is very excellent and it is 219 cm$^2$/Vs in the p-channel TFT. When this TFT is used to manufacture a semiconductor device, the operation characteristic and reliability of the semiconductor device can also be improved.

The semiconductor film formed in this embodiment is applicable to processes of manufacturing the TFTs of Embodiment Mode and Embodiments 1 through 7.

Embodiment 17

This embodiment describes a process of manufacturing a display device that uses an EL element as a light emitting element.

In this specification, a light emitting element refers to both one that utilizes light emission by a singlet exciton's transition to the base state (fluorescence) and one that utilizes light emission by a triplet exciton's transition to the base state (phosphorescence).

Following Embodiment 8, steps up through formation of the first and second interlayer insulating films are finished as shown in FIGS. 8A and 8B. In FIGS. 8A to 8C, a double gate TFT is used as a pixel portion TFT but a single gate TFT may be used instead. In the description of the subsequent manufacture steps, the pixel portion TFT is treated as a single gate TFT.

Figure 27A:
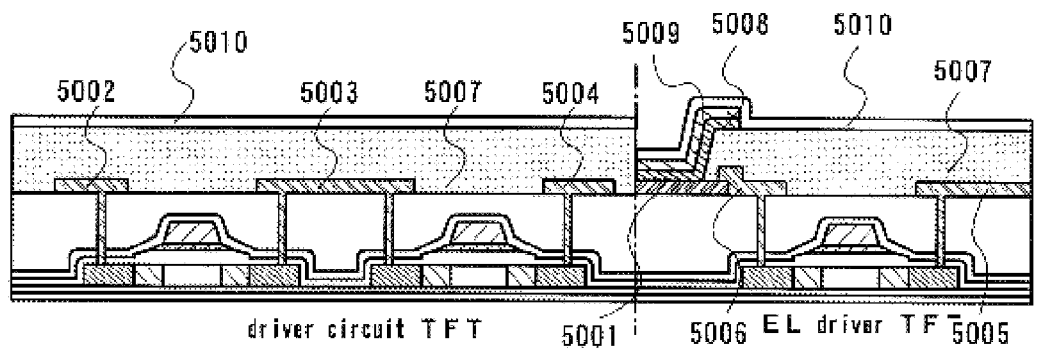
FIGS. 27A and 27B are diagrams showing an example of a light emitting device manufacturing process.

Then contact holes are opened as shown in FIG. 27A. The contact holes are shaped by dry etching or wet etching so as to reach the impurity regions, the source signal line, the gate signal line, the current supply line, and the gate electrodes.

Next, a transparent conductive film, typically, an ITO film, is formed and patterned into a desired shape to form an anode 5001 of the EL element. A laminate consisting of a Ti film, an Al film containing Ti, and another Ti film is formed and patterned into a desired shape to form wiring electrodes 5002 to 5005 and a pixel electrode 5006. The layers have the same thicknesses as the layers in Embodiment 8. The pixel electrode 5006 is formed so as to overlap the previously formed anode 5001 to ensure contact.

Subsequently, an insulating film is formed from an acrylic or other organic resin material, or an inorganic material. Examples of the inorganic material include inorganic SiO$_2$, SiO$_2$ formed by plasma CVD (PCVD-SiO$_2$), and SOG (Spin on Glass, an applied silicon oxide film). An opening is formed in the insulating film at a position that coincides with the position of the anode 5001 of the EL element. Thus formed is a third interlayer insulating film 5007. The opening desirably has a gently-tapered side wall.

If the side wall of the opening is not gently-tapered sufficiently, degradation of the EL layer, discontinuity, and other problems caused by level difference become serious and therefore attention has to be paid. Examples of a preferred combination of the second interlayer insulating film and the third interlayer insulating film 5007 include (1) PCVD-SiO$_2$ and PCVD SiO$_2$, (2) SOG and SOG, (3) SOG on PCVD-SiO$_2$ and PCVD-SiO$_2$, (4) acrylic and acrylic, (5) acrylic on SiO$_2$ and PCVD-SiO$_2$, and (6) PCVD-SiO$_2$ on SiO$_2$ and acrylic.

An EL layer 5008 is formed next. A cathode 5009 of the EL element is then formed from a cesium (Cs) film with a thickness of 2 nm or less and a silver (Ag) film with a thickness of 10 nm or less. By forming the cathode 5009 of the EL element very thin, light generated in the EL layer is transmitted through the cathode 5009 to exit the device.

Next, a protective film 5010 is formed to protect the EL element. Then, after bonding of an FPC and other works, the light emitting device is completed.

Figure 27B:
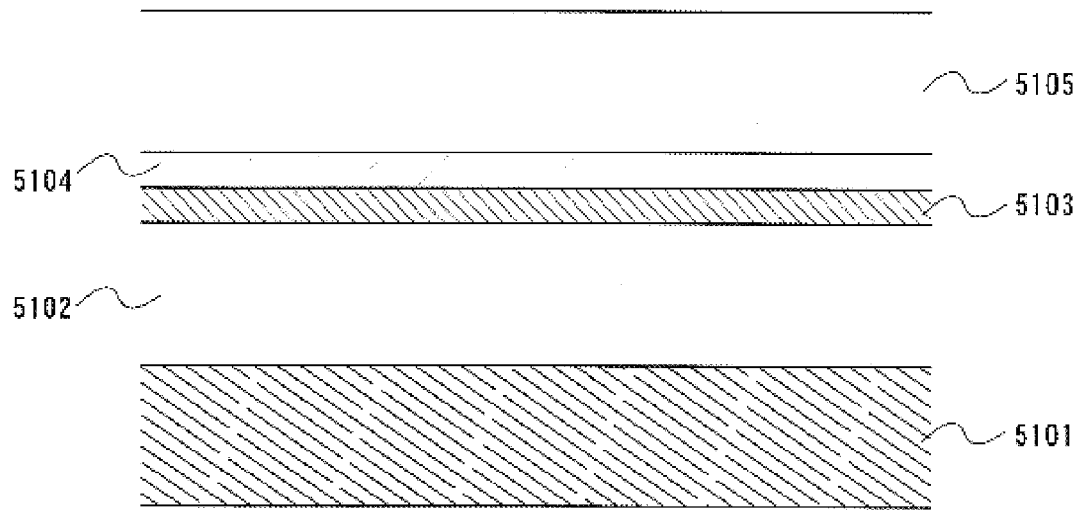

FIG. 27B shows a detailed structure of an EL element in the light emitting device shown in FIG. 27A in accordance with this embodiment. An anode 5101 of the EL element is formed of a transparent conductive film, typically, an ITO film. Denoted by 5102 is an EL layer including a light emitting layer. A cathode of the EL element is composed of a thin Cs film 5103 and a thin Ag film 5104. Denoted by 5105 is a protective film.

By forming the cathode side of the EL element very thin, light generated in the EL layer 5102 is transmitted through the cathode (5103 and 5104) and emitted upward. This means that the light emission area does not have to give a space to a region for forming a TFT. Therefore the aperture ratio is nearly 100%.

In the above process, the description is made of the structure in which the upper side of the EL element is a cathode and the lower side thereof is an anode. However, if a pixel electrode below the EL layer is formed of TiN or the like and an electrode above the EL layer is formed of ITO or the like, an anode can be located above the EL layer whereas a cathode is located below the EL layer.

Although the aperture ratio is slightly lowered, it is also possible to make light that is generated in the EL layer travel toward the substrate on which TFTs are formed, so that light is emitted downward. In this case, the electrode below the EL layer is formed of ITO or the like to serve as an anode and the electrode above the EL layer is formed of MgAg or the like to serve as a cathode (the cathode material is different from the one in this embodiment).

This embodiment can be implemented by being freely combined with Embodiment Mode and Embodiments 1 through 7.

Embodiment 18

This embodiment describes a process of manufacturing a display device that uses a light emitting element by a method different from the one in Embodiment 17.

Following Embodiment 8, steps up through formation of the first and second interlayer insulating films are finished as shown in FIGS. 8A and 8B. In FIGS. 8A to 8C, a double gate TFT is used as a pixel portion TFT but a single gate TFT may be used instead. In the description of the subsequent manufacture steps, the pixel portion TFT is treated as a single gate TFT.

Figure 28A:
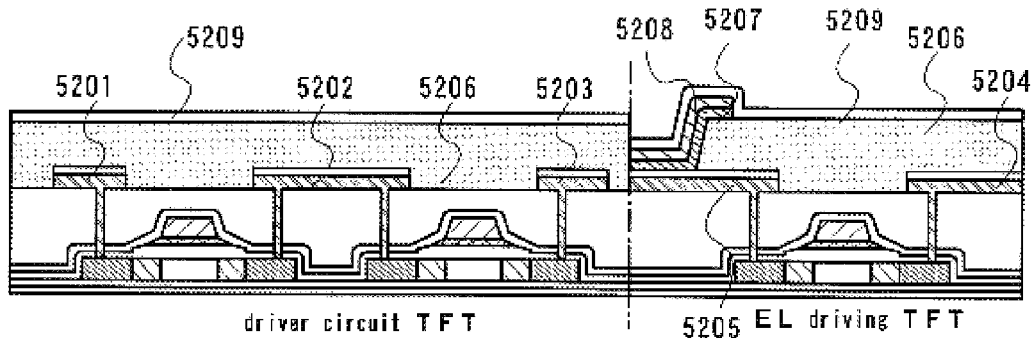
FIGS. 28A and 28B are diagrams showing an example of a light emitting device manufacturing process.

Then contact holes are opened as shown in FIG. 28A. The contact holes are shaped by dry etching or wet etching so as to reach the impurity regions of N type, the source signal line, the gate signal line, the current supply line, and the gate electrodes.

Next, wirings 5201 to 5204 and a pixel electrode 5205 that serves as an anode of an EL element are formed from a laminate consisting of a Ti film, an Al film containing Ti, another Ti film, and a transparent conductive film.

Subsequently, an insulating film is formed from an acrylic or other organic resin material, or an inorganic material. Examples of the inorganic material include inorganic $SiO_2$, $SiO_2$ formed by plasma CVD (PCVD-$SiO_2$), and SOG (Spin on Glass, an applied silicon oxide film). An opening is formed in the insulating film at a position that coincides with the position of the anode 5205 of the EL element. Thus formed is a third interlayer insulating film 5206. The opening desirably has a gently-tapered side wall.

If the side wall of the opening is not gently-tapered sufficiently, degradation of the EL layer, discontinuity, and other problems caused by level difference become serious and therefore attention has to be paid. Examples of a preferred combination of the second interlayer insulating film and the third interlayer insulating film 5206 include (1) PCVD-$SiO_2$ and PCVD $SiO_2$, (2) SOG and SOG, (3) SOG on PCVD-$SiO_2$ and PCVD-$SiO_2$, (4) acrylic and acrylic, (5) acrylic on $SiO_2$ and PCVD-$SiO_2$, and (6) PCVD-$SiO_2$ on $SiO_2$ and acrylic.

An EL layer 5207 is formed next. A cathode 5208 of the EL element is then formed from a cesium (Cs) film with a thickness of 2 nm or less and a silver (Ag) film with a thickness of 10 nm or less. By forming the cathode 5208 of the EL element very thin, light generated in the EL layer is transmitted through the cathode 5208 to exit the device.

Next, a protective film 5209 is formed to protect the EL element. Then, after bonding of an FPC and other works, the light emitting device is completed.

Figure 28B:
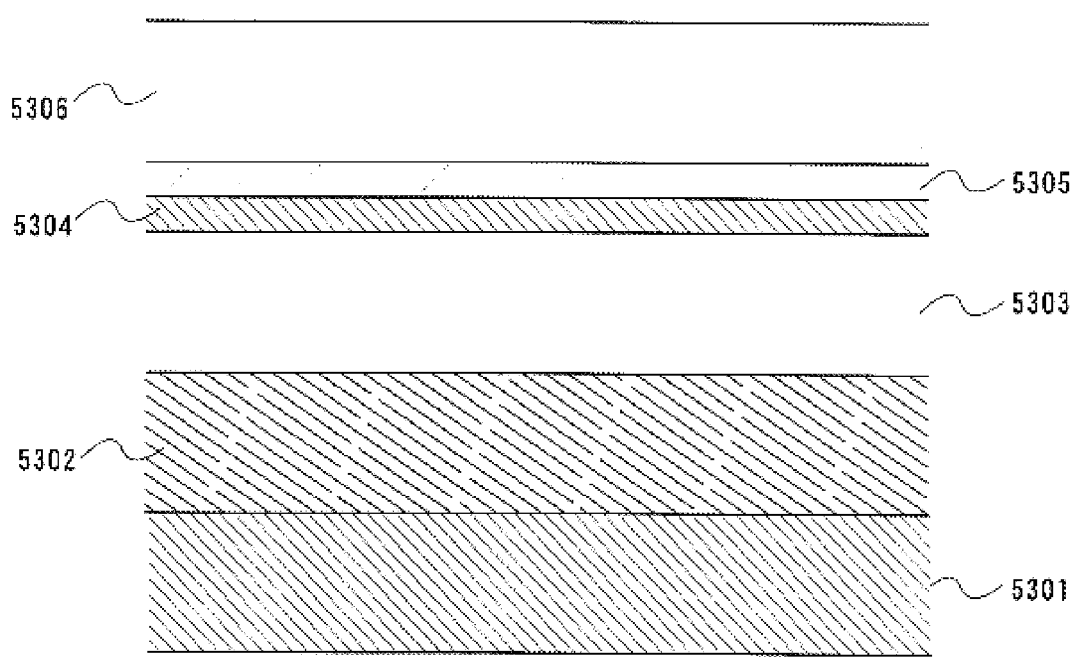

FIG. 28B shows a detailed structure of an EL element in the light emitting device shown in FIG. 28A in accordance with this embodiment. An anode of the EL element is formed of a metal film 5301, which is a laminate of a Ti film, an Al film, and another Ti film, and a transparent conductive film 5302, typically, an ITO film. Denoted by 5303 is an EL layer including a light emitting layer. A cathode of the EL element is composed of a thin CS film 7304 and a thin Ag film 7305. Denoted by 7306 is a protective film.

As in the light emitting device shown in Embodiment 8, the light emitting device manufactured in this embodiment has an advantage of a nearly 100% aperture ratio. Furthermore, the metal film, which is a laminate of a Ti film, an Al film, and another Ti film, and the transparent conductive film can be patterned by the same photo mask to form the wiring electrodes and the pixel electrode. Therefore the number of photo masks can be reduced and the process can be simplified.

In the above process, the upper side of the EL layer is a cathode and the lower side thereof is an anode. However, if a pixel electrode below the EL layer is formed of TiN or the like and an electrode above the EL layer is formed of ITO or the like, an anode can be located above the EL layer whereas a cathode is located below the EL layer.

Although the aperture ratio is slightly lowered, it is also possible to make light that is generated in the EL layer travel toward the substrate on which TFTs are formed, so that light is emitted downward. In this case, the electrode below the EL layer is formed of ITO or the like to serve as an anode and the electrode above the EL layer is formed of MgAg or the like to serve as a cathode (the cathode material is different from the one in this embodiment).

This embodiment can be implemented by being freely combined with Embodiment Mode and Embodiments 1 through 7.

Embodiment 19

Examples of electronic devices to which the present invention is applied include a video camera, a digital camera, a goggle type display (head-mounted display), a navigation system, a sound reproducing system (car audio system, audio component stereo, or the like), a notebook personal computer, a game player, a portable information terminal (mobile computer, portable telephone, portable game player, electronic book, or the like), and an image reproducing system provided with a recording medium (specifically, device which plays a recording medium such as a digital versatile disc (DVD) and is provided with a display for displaying images). Specific examples of the electronic devices are shown in FIGS. 29A to 29G.

Figure 29A:
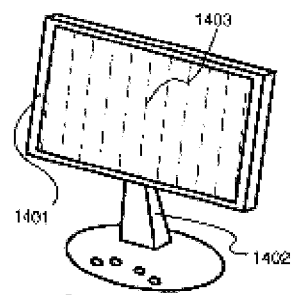
FIGS. 29A to 29G are diagrams showing examples of electronic equipment to which the present invention can be applied.

FIG. 29A shows a display device, which includes a casing 1401, a support stand 1402, and a display portion 1403. The present invention can be applied to the driver circuit of the display device having the display portion 1403.

Figure 29B:
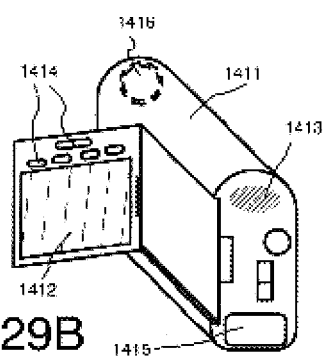

FIG. 29B shows a video camera, which is constituted by a main body 1411, a display portion 1412, a sound input portion 1413, operation switches 1414, a battery 1415, an image receiving portion 1416, and the like. The present invention can be applied to the driver circuit of the display device having the display portion 1412.

Figure 29C:
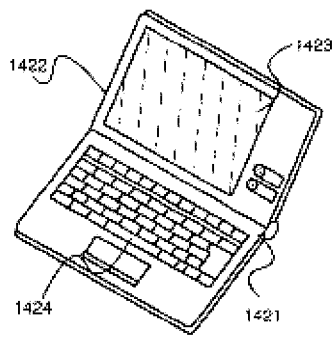

FIG. 29C shows a notebook personal computer, which is constituted by a main body 1421, a casing 1422, a display portion 1423, a keyboard 1424, and the like. The present invention can be applied to the driver circuit of the display device having the display portion 1423.

Figure 29D:
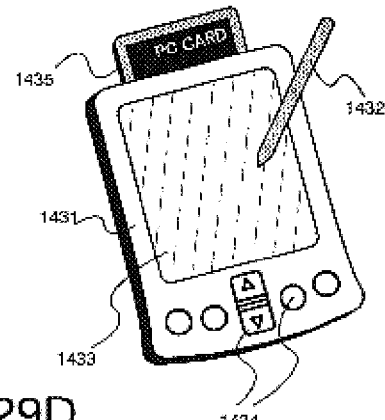

FIG. 29D shows a portable information terminal, which is constituted by a main body 1431, a stylus 1432, a display portion 1433, operation buttons 1434, an external interface 1435, and the like. The present invention can be applied to the driver circuit of the display device having the display portion 1433.

Figure 29E:
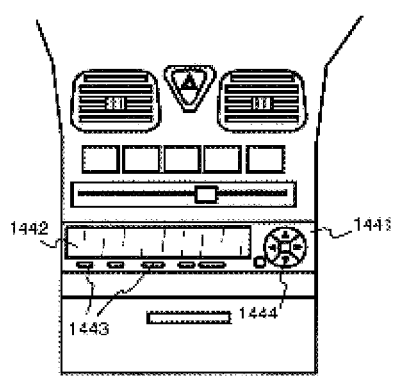

FIG. 29E shows a sound reproducing system, specifically, an audio system for an automobile, which is constituted by a main body 1441, a display portion 1442, operation switches 1443 and 1444, and the like. The present invention can be applied to the display portion 1442. Further, the audio system for an automobile is taken as an example here, but a portable or domestic audio system may be given.

Figure 29F:
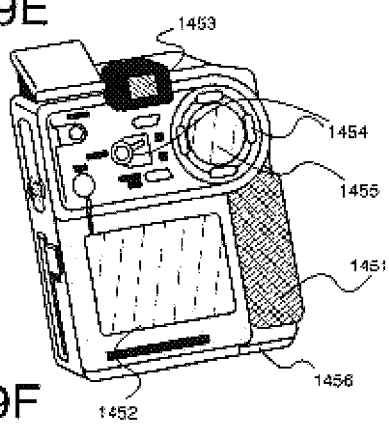

FIG. 29F shows a digital camera, which is constituted by a main body 1451, a display portion A 1452, an eyepiece portion 1453, operation switches 1454, a display portion B 1455, a battery 1456, and the like. The present invention can be applied to the driver circuit of the display device having the display portion A 1452 and the display portion B 1455.

Figure 29G:
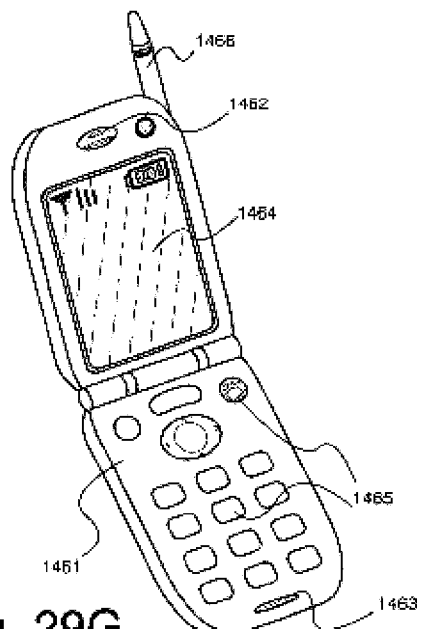

FIG. 29G shows a portable telephone, which is constituted by a main body 1461, a sound output portion 1462, a sound input portion 1463, a display portion 1464, operation switches 1465, an antenna 1466, and the like. The present invention can be applied to the driver circuit of the display device having the display portion 1464.

Not only a glass substrate but also a heat-resistance plastic substrate can be used for the display device used in each of the above electronic devices. Thus, reduction in weight of the electronic device can be attained.

It is noted that the above are described as just an example, the present invention is not limited to these applications.

Further, the electronic device in this embodiment can be realized by using the structure based on any combination of Embodiment Mode and Embodiments 1 through 7.

The present invention can provide a semiconductor device in which two outputs, a non-inverted output and an inverted output, are obtained when a digital video signal is inputted and therefore occurrence of the current path can be minimized in a downstream buffer driven by these signals. Also, a semiconductor device with reduced power consumption is provided by using the structure described above.

Furthermore, the present invention can provide a semiconductor device in which all TFTs have the same polarity. Accordingly, the semiconductor device can suppress the influence of an increase in cost and lowering of the yield by omitting some of manufacture steps such as an impurity element doping step from the manufacturing process of the TFTs.

What is claimed is:

1. A semiconductor device having first and second input terminals, first and second circuits, and first and second output terminals,
    wherein transistors that constitute the first circuit and the second circuit all have the same polarity,
    wherein the first output terminal is connected to the first circuit and the second output terminal is connected to the second circuit,
    wherein a first electric potential or a second electric potential is applied to the first input terminal and the second input terminal,
    wherein a through current flows in the first circuit only when the voltage applied to the first input terminal and the second input terminal is the first electric potential,
    wherein, when a signal applied to the second input terminal is the first electric potential, an inverted signal of the first input signal is outputted from the first output signal, and, at the same time, the first input signal is outputted from the second output signal, and
    wherein, when a signal applied to the second input terminal is the second electric potential, an output from the first output terminal and an output from the second output terminal are in a floating state.

2. A semiconductor device according to claim 1, wherein an input signal holding circuit composed of transistors that have the same conductivity type, or a buffer circuit having a function of compensating amplitude, or a circuit having both of the functions, is connected to output terminals of the first output signal and the second output signal.

3. A semiconductor device according to claim 1,
    wherein the semiconductor device further comprises first and second capacitor means,
    wherein the first capacitor means is placed in the first output terminal and has means for holding the electric potential of a signal outputted from the first output terminal, and
    wherein the second capacitor means is placed in the second output terminal and has means for holding the electric potential of a signal outputted from the second output terminal.

4. A semiconductor device according to claim 3, wherein the first and second capacitor means are composed of two materials and an insulating film between the two materials, the two materials being chosen out of a material for forming a semiconductor layer, a material for forming a gate electrode, and a wiring material.

5. A semiconductor device according to claim 1, wherein the semiconductor device is applied to an electronic device selected from the group consisting of a video camera, a digital camera, a goggle type display, a navigation system, a car audio system, an audio component stereo, a notebook personal computer, a gate player, a mobile computer, a portable telephone, a portable gate player, an electronic book and a DVD player.

6. A semiconductor device having first and second input terminals, first and second output terminals, first through fourth transistors, and a load circuit,
    wherein the load circuit has an input electrode and an output electrode,
    wherein gate electrodes of the first, third, and fourth transistors are connected to the first input terminal,
    wherein a gate electrode of the second transistor and an input electrode of the fourth transistor are both connected to the second input terminal,
    wherein an output electrode of the first transistor and the output electrode of the load circuit are both connected to an input electrode of the third transistor,
    wherein the input electrode of the load circuit is connected to a first power supply,
    wherein an input electrode of the second transistor is connected to a second power supply,
    wherein an output electrode of the second transistor is connected to the first input electrode,
    wherein an output electrode of the third transistor is connected to the first output terminal,
    wherein an output electrode of the fourth transistor is connected to the second output terminal, and
    wherein the first through fourth transistors have the same conductivity type.

7. A semiconductor device according to claim 6,
    wherein the load circuit is composed of a fifth transistor,
    wherein a gate electrode and an input electrode of the fifth transistor are connected to each other,
    wherein the input electrode of the fifth transistor is the input electrode of the load circuit, and
    wherein an output electrode of the fifth transistor is the output electrode of the load circuit.

8. A semiconductor device according to claim 6,
    wherein the load circuit is composed of fifth and sixth transistors, wherein an input electrode of the fifth transistor is connected to a gate electrode and input electrode of the sixth transistor, wherein a gate electrode of the fifth transistor and an output electrode of the sixth transistor are connected to each other, wherein the input electrode of the fifth transistor is the input electrode of the load circuit, and wherein an output electrode of the fifth transistor is the output electrode of the load circuit.

9. A semiconductor device according to claim 6, wherein the load circuit is composed of a resistor element, wherein an input electrode of the resistor element is the input electrode of the load circuit, and wherein an output electrode of the resistor element is the output electrode of the load circuit.

10. A semiconductor device according to claim 6, wherein the semiconductor device further comprises first and second capacitor means, wherein the first capacitor means is placed in the first output terminal and has means for holding the electric potential of a signal outputted from the first output terminal, and wherein the second capacitor means is placed in the second output terminal and has means for holding the electric potential of a signal outputted from the second output terminal.

11. A semiconductor device according to claim 10, wherein the first and second capacitor means are composed of two materials and an insulating film between the two materials, the two materials being chosen out of a material for forming a semiconductor layer, a material for forming a gate electrode, and a wiring material.

12. A semiconductor device according to claim 6, wherein the semiconductor device is applied to an electronic device selected from the group consisting of a video camera, a digital camera, a goggle type display, a navigation system, a car audio system, an audio component stereo, a notebook personal computer, a gate player, a mobile computer, a portable telephone, a portable gate player, an electronic book and a DVD player.

13. A semiconductor device having first through fourth input terminals, first through fourth output terminals, first through fourth transistors, a load circuit, and an amplitude compensating buffer circuit, wherein the load circuit has an input electrode and an output electrode, wherein gate electrodes of the first, third, and fourth transistors are connected to the first input terminal, wherein a gate electrode of the second transistor and an input electrode of the fourth transistor are both connected to the second input terminal, wherein an output electrode of the first transistor and the output electrode of the load circuit are both connected to an input electrode of the third transistor, wherein the input electrode of the load circuit is connected to a first power supply, wherein an input electrode of the second transistor is connected to a second power supply, wherein an output electrode of the second transistor is connected to the first input electrode, wherein an output electrode of the third transistor is connected to the first output terminal, wherein an output electrode of the fourth transistor is connected to the second output terminal, wherein the third input terminal is connected to the first output terminal, wherein the fourth input terminal is connected to the second output terminal, wherein the amplitude compensating buffer circuit has means for compensating amplitude attenuation of the first output terminal, means for outputting to the third output terminal, and means for compensating amplitude attenuation of the second output terminal to output to the fourth output terminal, and wherein the first through fourth transistors have the same conductivity type.

14. A semiconductor device according to claim 13, wherein the load circuit is composed of a fifth transistor, wherein a gate electrode and an input electrode of the fifth transistor are connected to each other, wherein the input electrode of the fifth transistor is the input electrode of the load circuit, and wherein an output electrode of the fifth transistor is the output electrode of the load circuit.

15. A semiconductor device according to claim 13, wherein the load circuit is composed of fifth and sixth transistors, wherein an input electrode of the fifth transistor is connected to a gate electrode and input electrode of the sixth transistor, wherein a gate electrode of the fifth transistor and an output electrode of the sixth transistor are connected to each other, wherein the input electrode of the fifth transistor is the input electrode of the load circuit, and wherein an output electrode of the fifth transistor is the output electrode of the load circuit.

16. A semiconductor device according to claim 13, wherein the load circuit is composed of a resistor element, wherein an input electrode of the resistor element is the input electrode of the load circuit, and wherein an output electrode of the resistor element is the output electrode of the load circuit.

17. A semiconductor device according to claim 13, wherein the amplitude compensating buffer circuit has first through fourth amplitude compensating transistors and first and second amplitude compensating capacitor means, wherein the third input terminal is connected to gate electrodes of the first and second amplitude compensating transistors, wherein the fourth input terminal is connected to gate electrodes of the third and fourth amplitude compensating transistors, wherein input electrodes of the first and fourth amplitude compensating transistors are connected to the first power supply, wherein input electrodes of the second and third amplitude compensating transistors are electrically connected to the second power supply, wherein output electrodes of the first and third amplitude compensating transistors are both connected to the third output terminal, wherein output electrodes of the second and fourth amplitude compensating transistors are both connected to the fourth output terminal, wherein the first amplitude compensating capacitor means has means that is placed between the gate electrode and output electrode of the first amplitude compensating transistor to form capacitive coupling, and wherein the second amplitude compensating capacitor means has means that is placed between the gate electrode and output electrode of the fourth amplitude compensating transistor to form capacitive coupling.

18. A semiconductor device according to claim 13, wherein the semiconductor device further comprises first and second capacitor means, wherein the first capacitor means is placed in the first output terminal and has means for holding the electric potential of a signal outputted from the first output terminal, and wherein the second capacitor means is placed in the second output terminal and has means for holding the electric potential of a signal outputted from the second output terminal.

19. A semiconductor device according to claim 18, wherein the first and second capacitor means are composed of two materials and an insulating film between the two materials, the two materials being chosen out of a material for forming a semiconductor layer, a material for forming a gate electrode, and a wiring material.

20. A semiconductor device according to claim 13, wherein the semiconductor device is applied to an electronic device selected from the group consisting of a video camera, a digital camera, a goggle type display, a navigation system, a car audio system, an audio component stereo, a notebook personal computer, a gate player, a mobile computer, a portable telephone, a portable gate player, an electronic book and a DVD player.

21. A semiconductor device having first and second input terminals, first and second output terminals, first through third transistors, and a load circuit, wherein the load circuit has an input electrode, an output electrode, and a control electrode, wherein gate electrodes of the first and third transistors are connected to the control electrode of the load circuit and to the first input terminal, wherein a gate electrode of the second transistor and an input electrode of the third transistor are both connected to the second input terminal, wherein an output electrode of the first transistor and the output electrode of the load circuit are both connected to the second output terminal, wherein an output electrode of the third transistor is connected to the first output terminal, wherein an output electrode of the second transistor is connected to an input electrode of the first transistor, wherein the input electrode of the load circuit is connected to a first power supply, wherein an input electrode of the second transistor is connected to a second power supply, and wherein the first through third transistors have the same conductivity type.

22. A semiconductor device according to claim 21, wherein the load circuit is composed of a fourth transistor, wherein a gate electrode of the fourth transistor is the control electrode of the load circuit, wherein an input electrode of the fourth transistor is the input electrode of the load circuit, and wherein an output electrode of the fourth transistor is the output electrode of the load circuit.

23. A semiconductor device according to claim 21, wherein the load circuit is composed of fourth and fifth transistors, wherein an input electrode of the fourth transistor and an input electrode of the fifth transistor are connected to each other, wherein a gate electrode of the fourth transistor and an output electrode of the fifth transistor are connected to each other, wherein the input electrode of the fourth transistor is the input electrode of the load circuit, wherein a gate electrode of the fifth transistor is the control electrode of the load circuit, and wherein an output electrode of the fourth transistor is the output electrode of the load circuit.

24. A semiconductor device according to claim 21, wherein the semiconductor device further comprises first and second capacitor means, wherein the first capacitor means is placed in the first output terminal and has means for holding the electric potential of a signal outputted from the first output terminal, and wherein the second capacitor means is placed in the second output terminal and has means for holding the electric potential of a signal outputted from the second output terminal.

25. A semiconductor device according to claim 24, wherein the first and second capacitor means are composed of two materials and an insulating film between the two materials, the two materials being chosen out of a material for forming a semiconductor layer, a material for forming a gate electrode, and a wiring material.

26. A semiconductor device according to claim 21, wherein the semiconductor device is applied to an electronic device selected from the group consisting of a video camera, a digital camera, a goggle type display, a navigation system, a car audio system, an audio component stereo, a notebook personal computer, a gate player, a mobile computer, a portable telephone, a portable gate player, an electronic book and a DVD player.

27. A semiconductor device having first through fourth input terminals, first through fourth output terminals, first through third transistors, a load circuit, and an amplitude compensating buffer circuit, wherein the load circuit has an input electrode, an output electrode, and a control electrode, wherein gate electrodes of the first and third transistors are connected to the control electrode of the load circuit and to the first input terminal, wherein a gate electrode of the second transistor and an input electrode of the third transistor are both connected to the second input terminal, wherein an output electrode of the first transistor and the output electrode of the load circuit are both connected to the second output terminal, wherein an output electrode of the third transistor is connected to the first output terminal, wherein an output electrode of the second transistor is connected to an input electrode of the first transistor, wherein the input electrode of the load circuit is connected to a first power supply, wherein an input electrode of the second transistor is connected to a second power supply, wherein the third input terminal is connected to the first output terminal, wherein the fourth input terminal is connected to the second output terminal, wherein the amplitude compensating buffer circuit has means for compensating amplitude attenuation of the first output terminal, means for outputting to the third output terminal, and means for compensating amplitude attenuation of the second output terminal to output to the fourth output terminal, and wherein the first through third transistors have the same conductivity type.

28. A semiconductor device according to claim 27, wherein the load circuit is composed of a fourth transistor, wherein a gate electrode of the fourth transistor is the control electrode of the load circuit, wherein an input electrode of the fourth transistor is the input electrode of the load circuit, and wherein an output electrode of the fourth transistor is the output electrode of the load circuit.

29. A semiconductor device according to claim 27, wherein the load circuit is composed of fourth and fifth transistors, wherein an input electrode of the fourth transistor and an input electrode of the fifth transistor are connected to each other, wherein a gate electrode of the fourth transistor and an output electrode of the fifth transistor are connected to each other, wherein the input electrode of the fourth transistor is the input electrode of the load circuit, wherein a gate electrode of the fifth transistor is the control electrode of the load circuit, and wherein an output electrode of the fourth transistor is the output electrode of the load circuit.

30. A semiconductor device according to claim 27, wherein the amplitude compensating buffer circuit has first through fourth amplitude compensating transistors and first and second amplitude compensating capacitor means, wherein the third input terminal is connected to gate electrodes of the first and second amplitude compensating transistors, wherein the fourth input terminal is connected to gate electrodes of the third and fourth amplitude compensating transistors, wherein input electrodes of the first and fourth amplitude compensating transistors are connected to the first power supply, wherein input electrodes of the second and third amplitude compensating transistors are electrically connected to the second power supply, wherein output electrodes of the first and third amplitude compensating transistors are both connected to the third output terminal, wherein output electrodes of the second and fourth amplitude compensating transistors are both connected to the fourth output terminal, wherein the first amplitude compensating capacitor means has means that is placed between the gate electrode and output electrode of the first amplitude compensating transistor to form capacitive coupling, and wherein the second amplitude compensating capacitor means has means that is placed between the gate electrode and output electrode of the fourth amplitude compensating transistor to form capacitive coupling.

31. A semiconductor device according to claim 27, wherein the semiconductor device further comprises first and second capacitor means, wherein the first capacitor means is placed in the first output terminal and has means for holding the electric potential of a signal outputted from the first output terminal, and wherein the second capacitor means is placed in the second output terminal and has means for holding the electric potential of a signal outputted from the second output terminal.

32. A semiconductor device according to claim 31, wherein the first and second capacitor means are composed of two materials and an insulating film between the two materials, the two materials being chosen out of a material for forming a semiconductor layer, a material for forming a gate electrode, and a wiring material.

33. A semiconductor device according to claim 27, wherein the semiconductor device is applied to an electronic device selected from the group consisting of a video camera, a digital camera, a goggle type display, a navigation system, a car audio system, an audio component stereo, a notebook personal computer, a gate player, a mobile computer, a portable telephone, a portable gate player, an electronic book and a DVD player.

* * * * *

UNITED STATES PATENT AND TRADEMARK OFFICE
CERTIFICATE OF CORRECTION

PATENT NO. : 6,756,816 B2
DATED : June 29, 2004
INVENTOR(S) : Hiroyuki Miyake

It is certified that error appears in the above-identified patent and that said Letters Patent is hereby corrected as shown below:

Column 35,
Lines 59 and 60, replace "signal," with -- terminal, --;

Column 36,
Line 49, replace "electrode," with -- electrode of the first transistor, --; and Column 37,
Line 62, replace "electrode," with -- electrode of the first transistor, --.

Signed and Sealed this

Eleventh Day of April, 2006

JON W. DUDAS
*Director of the United States Patent and Trademark Office*